(12) United States Patent
Matsuzaki

(10) Patent No.: US 7,349,280 B2
(45) Date of Patent: Mar. 25, 2008

(54) MEMORY CIRCUIT WITH AUTOMATIC PRECHARGE FUNCTION, AND INTEGRATED CIRCUIT DEVICE WITH AUTOMATIC INTERNAL COMMAND FUNCTION

(75) Inventor: Yasurou Matsuzaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/790,831

(22) Filed: Apr. 27, 2007

(65) Prior Publication Data

US 2007/0201292 A1 Aug. 30, 2007

Related U.S. Application Data

(62) Division of application No. 11/413,204, filed on Apr. 28, 2006, which is a division of application No. 10/830,149, filed on Apr. 23, 2004, now Pat. No. 7,064,997, which is a division of application No. 10/438,927, filed on May 16, 2003, now Pat. No. 6,747,906, which is a division of application No. 09/841,611, filed on Apr. 25, 2001, now Pat. No. 6,636,449.

(30) Foreign Application Priority Data

Apr. 28, 2000 (JP) ............................. 2000-131260
Apr. 12, 2001 (JP) ............................. 2001-113443

(51) Int. Cl.
*G11C 7/00* (2006.01)

(52) U.S. Cl. ...................................... 365/222; 365/233
(58) Field of Classification Search ................ 365/222, 365/233; 711/106
See application file for complete search history.

(56) References Cited

U.S. PATENT DOCUMENTS

| 4,829,484 | A | | 5/1989 | Arimoto et al. |
| 4,956,820 | A | | 9/1990 | Hashimoto |
| 5,323,352 | A | * | 6/1994 | Miyata et al. ............... 365/222 |
| 5,555,527 | A | * | 9/1996 | Kotani et al. ............... 365/222 |
| 5,627,791 | A | | 5/1997 | Wright et al. |
| 5,901,101 | A | | 5/1999 | Suzuki et al. |
| 6,137,743 | A | | 10/2000 | Kim |
| 6,587,918 | B1 | | 7/2003 | Christenson |

FOREIGN PATENT DOCUMENTS

| EP | 0 616 331 A2 | 9/1994 |
| JP | 58-48293 | 3/1983 |
| JP | 61-029489 A | 2/1986 |
| JP | 61-71494 | 4/1986 |
| JP | 2000-113699 A | 4/2000 |
| JP | 11-268772 | 5/2000 |
| JP | 11-298354 | 10/2000 |

* cited by examiner

*Primary Examiner*—VanThu Nguyen
(74) *Attorney, Agent, or Firm*—Arent Fox LLP

(57) ABSTRACT

A memory circuit requiring refresh operations a first circuit which receives a command in synchronization with a clock signal, and which generates a first internal command internally and a second circuit which generates a second internal command, e.g., a refresh command, internally in a prescribed refresh cycle. And an internal circuit, according to said first internal command, executes corresponding control through clock-synchronous operations, and when said refresh command is issued, sequentially executes control corresponding to the refresh command and control corresponding to said first internal command through clock-asynchronous operations. When a refresh timing signal is generated, the refresh operation can be intrupted among the external command operations.

1 Claim, 53 Drawing Sheets

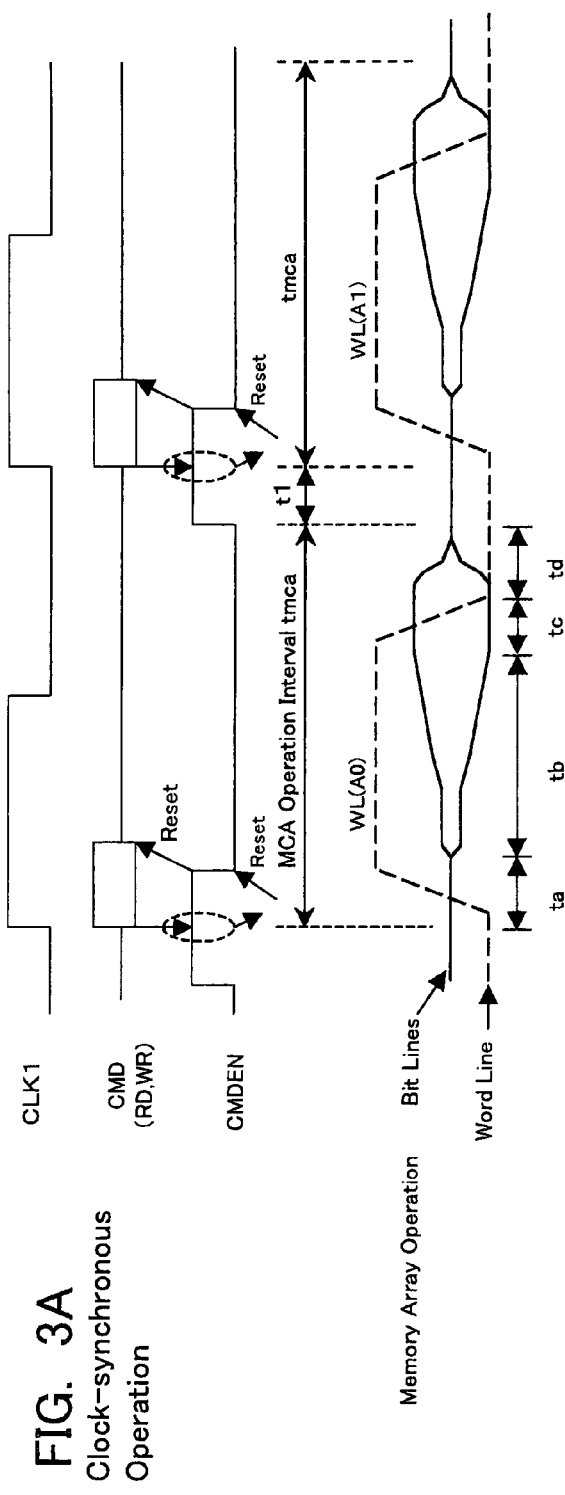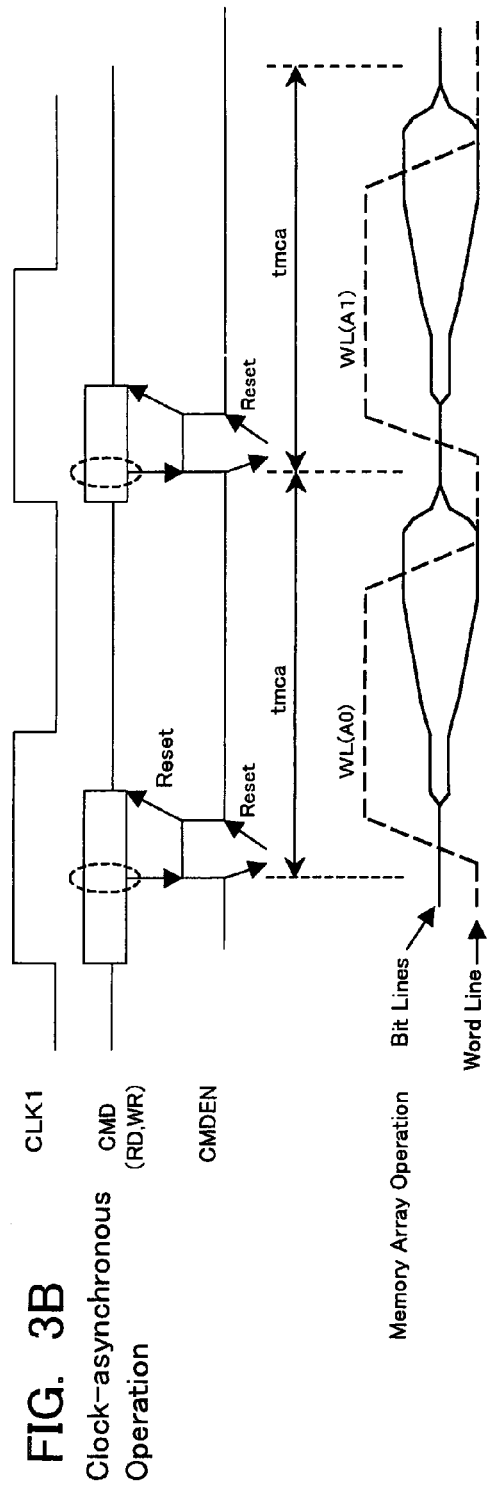
FIG. 3A Clock-synchronous Operation
FIG. 3B Clock-asynchronous Operation Second Embodiment FIG. 15
Refresh Command Generator
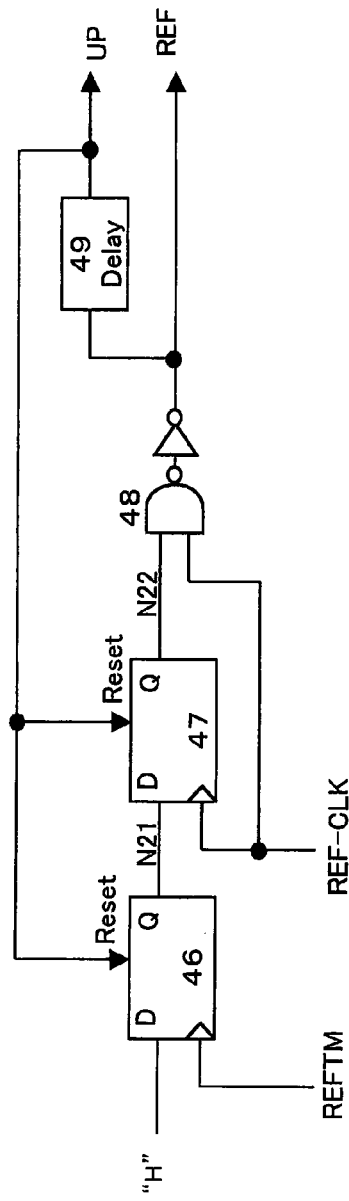
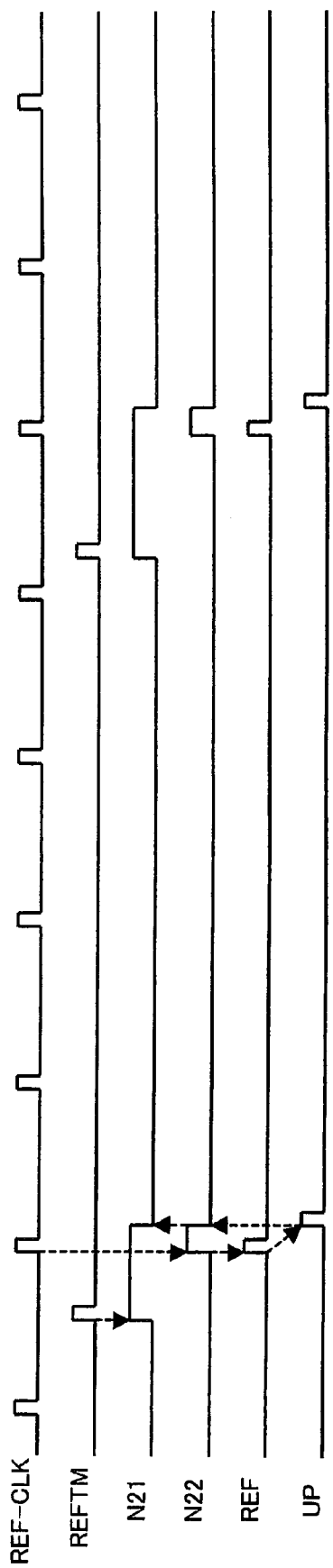

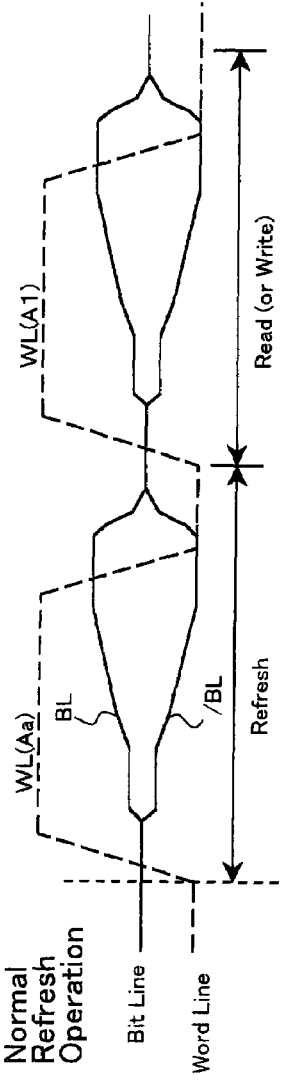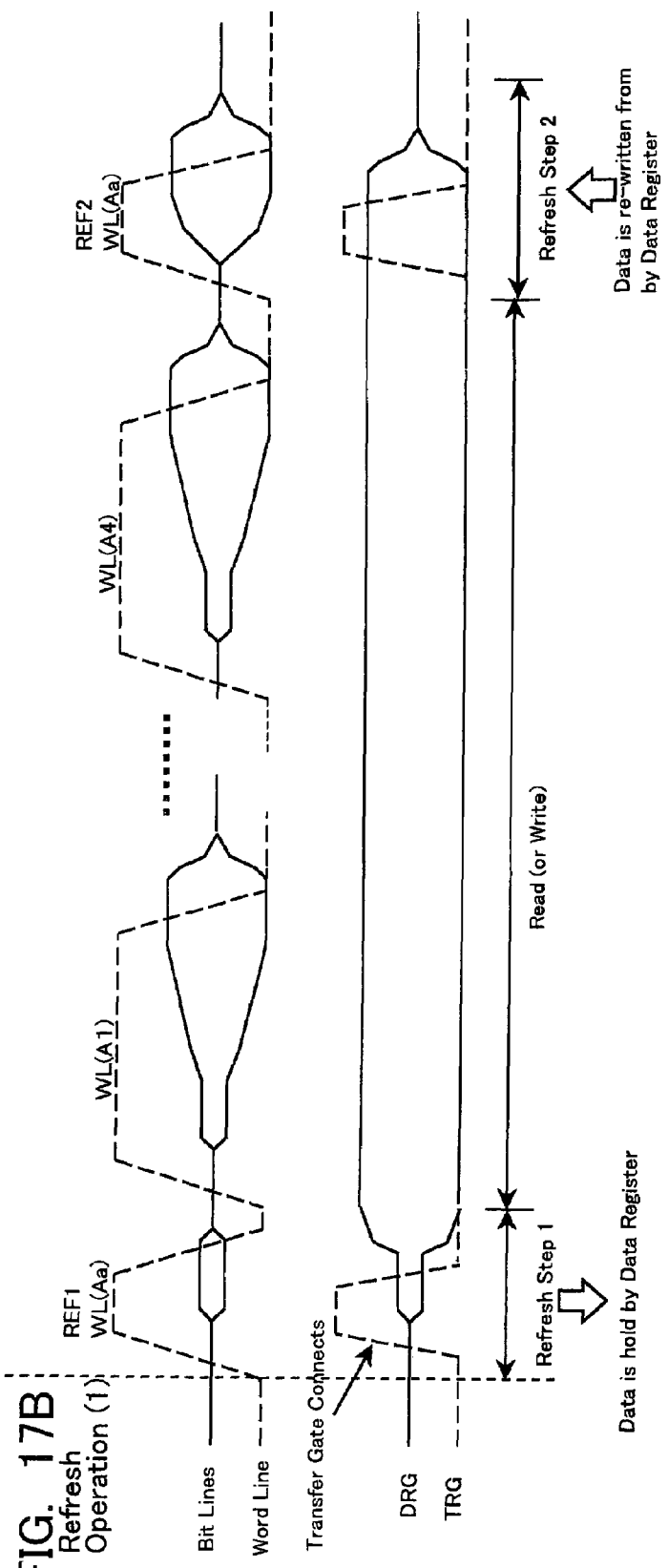
FIG. 17A Normal Refresh Operation
FIG. 17B Refresh Operation (1)

FIG. 23
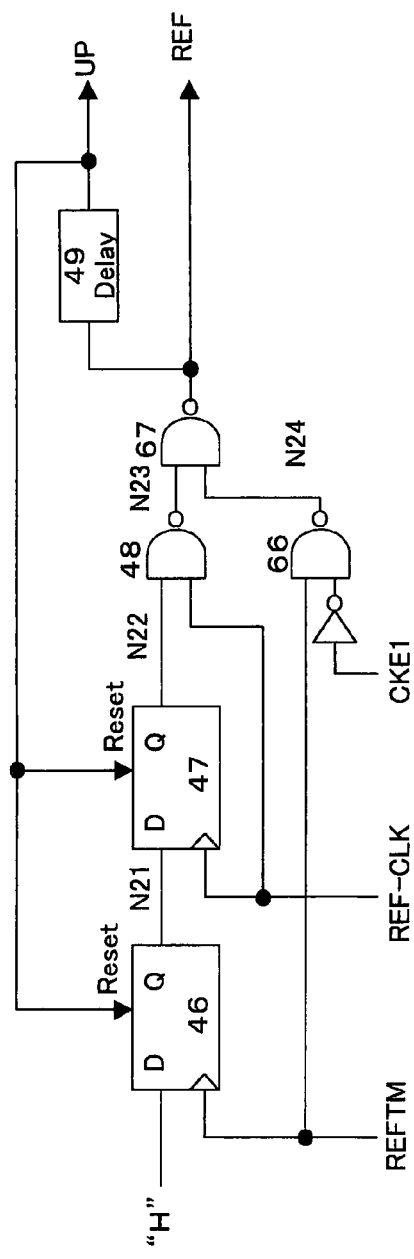
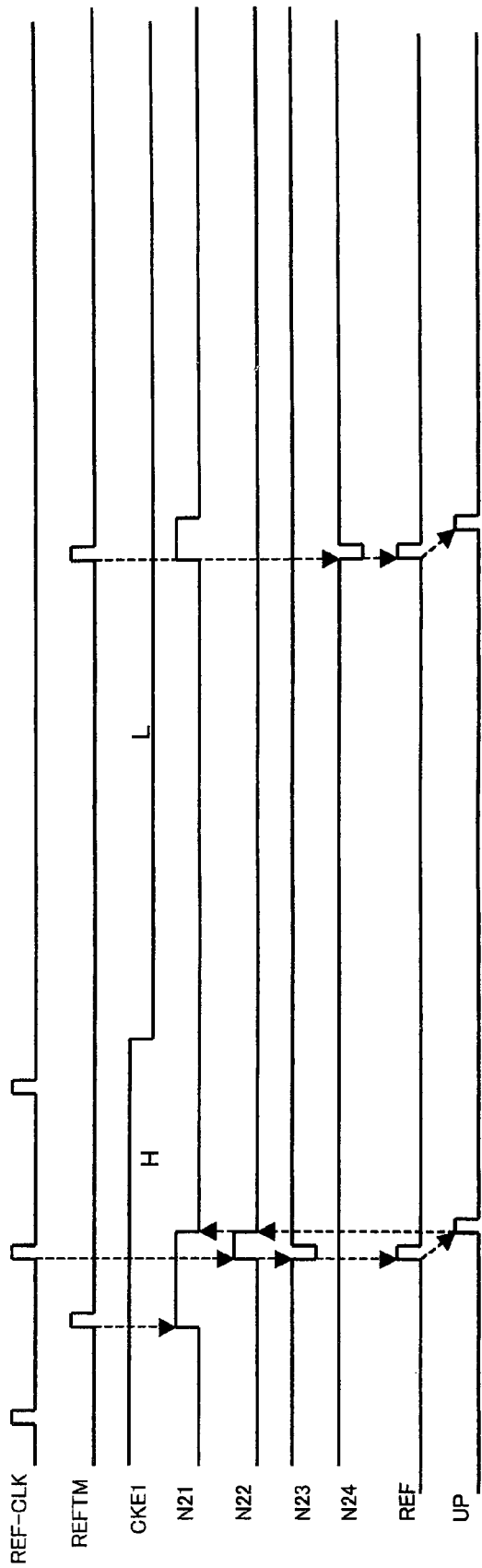

Fourth Embodiment

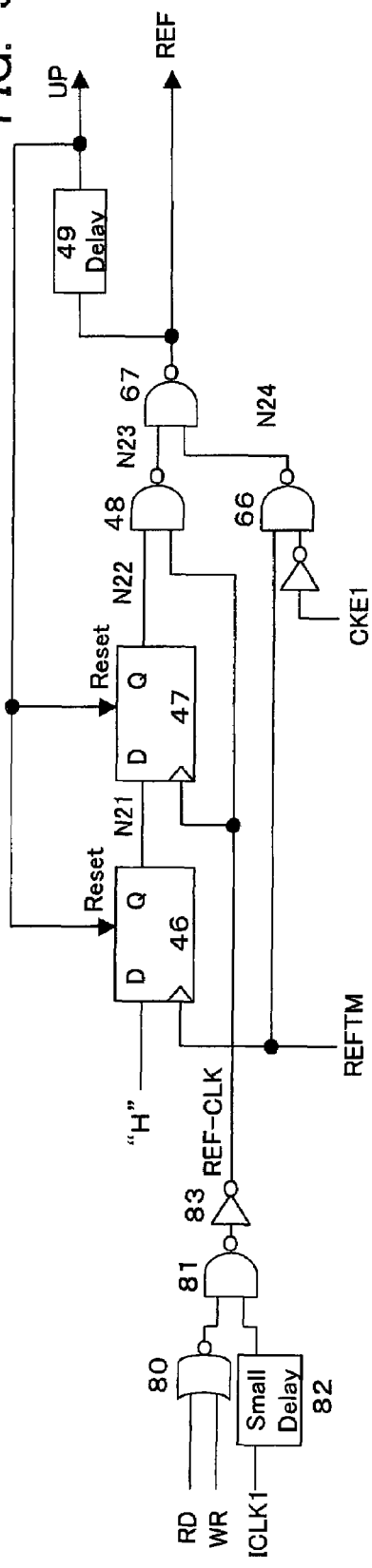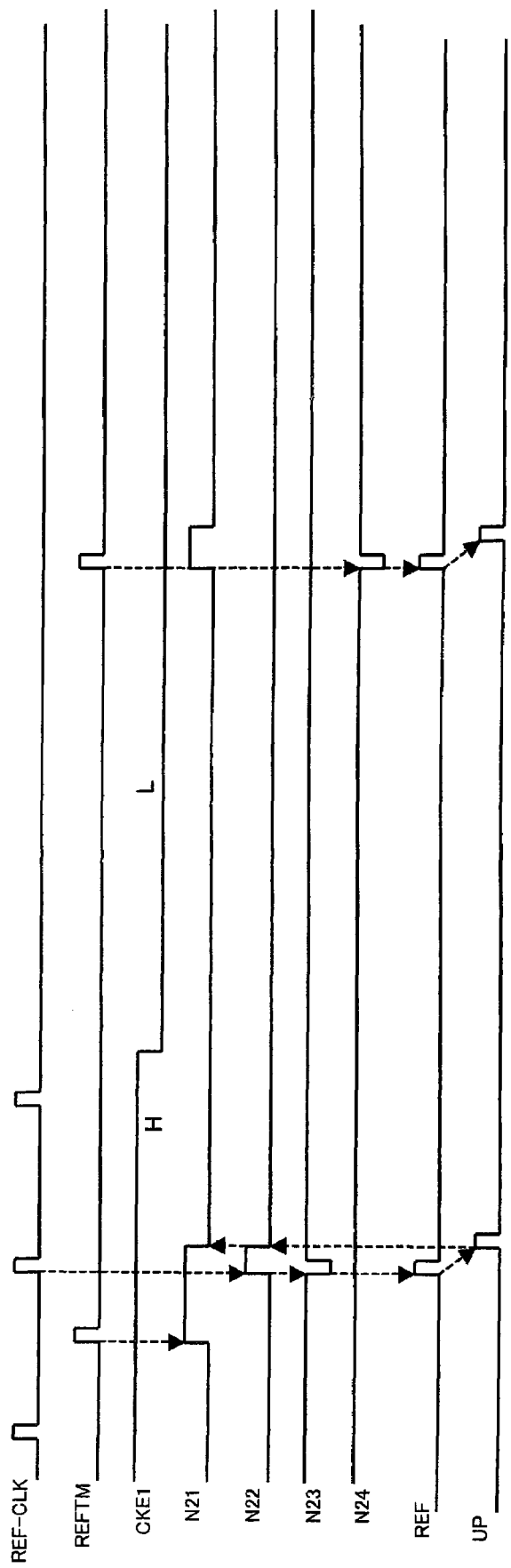
FIG. 33

FIG. 39 Fifth Embodiment

Operation in sync with external command timing

Operation asynchronous with external command timing

MEMORY CIRCUIT WITH AUTOMATIC PRECHARGE FUNCTION, AND INTEGRATED CIRCUIT DEVICE WITH AUTOMATIC INTERNAL COMMAND FUNCTION

CROSS-REFERENCE TO RELATED APPLICATIONS

This is a Divisional of U.S. application Ser. No. 11/413, 204 filed Apr. 28, 2006, which is a Divisional of U.S. application Ser. No. 10/830,149 filed Apr. 23, 2004 now U.S. Pat. No. 7,064,997, which is a Divisional of U.S. application Ser. No. 10/438,927 filed May 16, 2003 now U.S. Pat. No. 6,747,906, which is Divisional of U.S. application Ser. No. 09/841,611 filed Apr. 25, 2001 now U.S. Pat. No. 6,636,449.

BACKGROUND OF THE INVENTION

1. Field of the Invention

This invention relates to a memory circuit which requires periodic refresh operations, such as dynamic random access memory, and further relates to a memory circuit in which refresh operations are executed automatically without requiring a refresh command from outside, and which is capable of high-speed internal execution of operating commands from outside. This invention also relates to an integrated circuit device, which, in addition to external commands, is able to automatically generate and execute commands internally.

2. Description of the Related Art

Dynamic random access memory (DRAM) is widely used as large capacity memory. Because DRAM is volatile memory, refresh operations are necessary.

FIG. 1 is a configurational view of a conventional memory circuit. The conventional memory circuit has a clock buffer 10 for input of an external clock signal CLK1 and generation of an internal clock signal CLK1 in sync with this; a command decoder 11 for input of commands in sync with the internal clock signal CLK1; an address buffer 12 for input of addresses; and a data input/output buffer 13 for data input and output. In addition, a control circuit 14 controls operations of a memory core 15 in response to commands CMD input by the command decoder 11. Operations of the memory core are also controlled in sync with the internal clock signal CLK1.

Such clock-synchronous DRAM (SDRAM) has, as refresh operations, auto-refresh and self-refresh. Auto-refresh is a refresh operation which is performed periodically between normal read and write operations, and is executed by means of an auto-refresh command supplied from outside. That is, when an auto-refresh command is input from outside, the command decoder 11 generates an auto-refresh command AR1, and in response to AR1 the refresh control circuit 16 generates an internal refresh command REF. By means of this internal refresh command REF, the control circuit 14 controls the refresh operation. A selector 18 selects the address from the refresh address counter 17 and outputs the address to the address latch circuit 19.

On the other hand, self-refresh is a refresh operation in which the memory device itself executes the refresh operation while in the power-down mode state, in response to refresh timing automatically generated by an internal oscillator OSC. In the power-down mode state, no commands (read or write) are supplied from outside, and so the refresh control circuit 16 generates an internal refresh command REF in response to refresh timing generated with arbitrary timing. Thus, the control circuit 5 14 controls the refresh operation.

In this way, commands are supplied from outside while in the normal operating state, and refresh commands are also supplied from outside and refresh operations executed in response. While in the power-down state, no commands are supplied from outside, and so refresh timing is automatically generated internally and refresh operations are executed.

In this way, in conventional memory circuits the memory controller which controls the memory circuit must control the refresh timing during the interval of the normal operating state. That is, the memory controller is equipped with a timer, and must issue auto-refresh commands to the memory circuit each time the refresh timing occurs. Hence, a problem with the memory controller is the complexity of memory circuit control.

In conventional memory circuits, the control circuit 14 executes control in response to read and write commands supplied in sync with the clock signal. Here, if the control circuit 14 is executing the previous internal operation, the next internal operation is executed in response to the newly supplied command, regardless of previous internal operations. Memory circuits have also been proposed in which, if during execution of the previous internal operation a new command is supplied from outside, that command is refused.

In the above latter case, refusal of a command from the memory controller is undesirable, and so memory circuits generally execute internal operations as-is in response to supplied commands, as in the former case. Hence, in the normal operating state, if a refresh command is issued autonomously within the memory circuit and refresh operations are executed, a command supplied during these operations may disturb the refresh operation. And if, as in the latter case, a supplied command is refused, control by the memory controller becomes even more complex.

SUMMARY OF THE INVENTION

Hence, one object of this invention is to provide a memory circuit capable of automatically executing refresh operations without receiving refresh commands from the memory controller.

Another object of this invention is to provide a memory circuit which, in normal operation, can automatically execute refresh operations without requiring refresh commands from outside, and which can also rapidly execute internal operations in response to normal commands from outside.

Yet another object of this invention is to provide an integrated circuit device capable of automatically issuing internal commands in addition to receipt of externally supplied commands, and of executing internal commands without disturbing operations corresponding to external 5 commands.

In order to achieve the above objects, in a first aspect of this invention, an integrated circuit device comprises a first circuit which receives commands in sync with a clock signal and which internally generates a first internal command, and a second circuit which internally generates a second internal command in a prescribed cycle. The internal circuit executes internal operations in accordance with the first internal command through clock-asynchronous operations, and when a second internal command is issued, sequentially executes internal operations corresponding to the second internal command and internal operations corresponding to the first internal command through clock-asynchronous operations.

In a more preferred embodiment, the above integrated circuit device is a memory circuit which requires refresh operations; the above first internal command is a read or a write command; the above second internal command is a refresh command; and the internal circuit is a memory control circuit. That is, in this embodiment, in the normal state the memory control circuit executes control operations corresponding to the first internal command through clock-synchronous operations, in accordance with commands received in sync with the clock signal. When a refresh command is generated internally as the second internal command, the memory control circuit, in clock-synchronous operation, sequentially executes control operations corresponding to this refresh command and the first internal command. When internal operation cycles finally catch up to external operation cycles, the memory control circuit again executes control operations for the first internal command through clock-synchronous operations.

In another preferred embodiment, the integrated circuit device further comprises an internal clock generation circuit which generates a first internal clock signal in sync with an external clock signal and a second internal clock signal faster than the external clock signal. The internal circuit executes an internal operation corresponding to the first internal command in sync with the first internal clock signal during a normal state, and executes internal operations corresponding to the first internal command and internal operations corresponding to the second internal command in sync with the second internal clock signal when the second internal command is generated.

The first aspect of the invention can be applicable to asynchronous memory circuit. In this case, a specification of the memory circuit defines a minimum external command cycle according to which external commands are permitted to be supplied. And a memory controller has an internal operation cycle shorter than the minimum external command cycle. The memory control circuit executes an internal operation in response to the external command during a normal state, and executes internal operations-continuously according to the internal operation cycle.

A second aspect of this invention is a clock synchronous integrated circuit device having, for every M external operation cycles (M≧2), N internal operation cycles, where N is greater than M (M<N<2M). For M external operation cycles, at most M internal operation cycles corresponding to M external commands, and at least one internal operation cycle corresponding to an internal command and not to an external command, are assigned. That is, by making internal operation cycles slightly shorter than external operation cycles, it is possible to execute internal commands which may occur within expanded operation cycles consisting of M external operation cycles.

In a more preferred embodiment of the above second aspect, application is to a memory circuit requiring refresh operations. In this case, when a refresh command is generated internally during expanded operation cycles consisting of M operation cycles, (N−M) internal operation cycles are utilized to execute the refresh operation. These (N−M) cycles are the difference during expanded operation cycles between the number of internal operation cycles N and the number of external operation cycles M. However, by holding the latency from the input of the external command until read data output to several clock cycles, it is possible to continuously output read data, to an external memory controller, corresponding to continuous external commands.

In the memory circuit of the above preferred embodiment, an internal clock generation circuit is provided which generates, during an expanded operation cycle consisting of M external clock cycles, N internal clocks. An external command is input in sync with the external clock signal (or after waiting for a prescribed phase difference), and the internal command is generated in sync with the internal clock signal. Read data is output from the memory core in sync with the delayed internal clock signal, and is output from the data output terminal in sync with the external clock signal. Similarly, write data is input from the data input terminal in sync with the external clock signal, and is input to the memory core in sync with the internal clock signal. Hence, the phase difference between the external clock signal and internal clock signal is absorbed by the command and data input/output circuit units.

In the other preferred embodiment of the above second aspect, application is similarly to a memory circuit in which refresh operations are required. In this case, when a refresh command is generated internally during an expanded operation cycle consisting of M operation cycles, (N−M) internal operation cycles are utilized to execute the refresh operation. Further, the refresh operation can be divided into a plurality of internal operation cycles and executed. Thus, the latency (access time) from input of the external command until output of the read data can be shortened, and high-speed operation can be ensured.

In another preferred embodiment, when refresh operations are divided into operations involving word-line driving and operations involving writing to memory cells, when the refresh address during a refresh operation (row address) and the address of subsequent read or write operations (row address) coincide, data read out and held during the first half of the refresh operation is used as readout data for subsequent read or write operations. Thus, even though data in memory cells is destroyed during the first half of the refresh operation, there are no impediments to subsequent operations.

A third aspect of this invention is characterized in that, when in the above second aspect the external clock signal controlling input of external commands has a shorter cycle than the external operation cycle, a second internal operation cycle is generated according to the external commands input in sync with the external clock signal. Hence, when this third aspect is applied to a memory circuit, the refresh command generation circuit generates refresh commands according to the state of input of external commands.

By means of this third aspect, even in the case of an integrated circuit device or memory circuit installed in a high-speed clock system, a second internal operation cycle 5 can be autonomously generated and executed.

BRIEF DESCRIPTION OF THE DRAWINGS

FIG. 3 is a drawing showing clock-synchronous operation and clock-asynchronous operation;

FIG. 15 is a drawing showing the refresh command generation circuit and the operation timing chart thereof;

FIG. 17 is a drawing explaining the refresh operation of the third embodiment;

FIG. 23 is a drawing showing the refresh command generation circuit in the power-down state and the operation timing chart thereof;

FIG. 33 is a drawing showing a refresh command generation circuit applied to the fourth embodiment, and the operation thereof;

DESCRIPTION OF THE PREFERRED EMBODIMENTS

Figure 1:
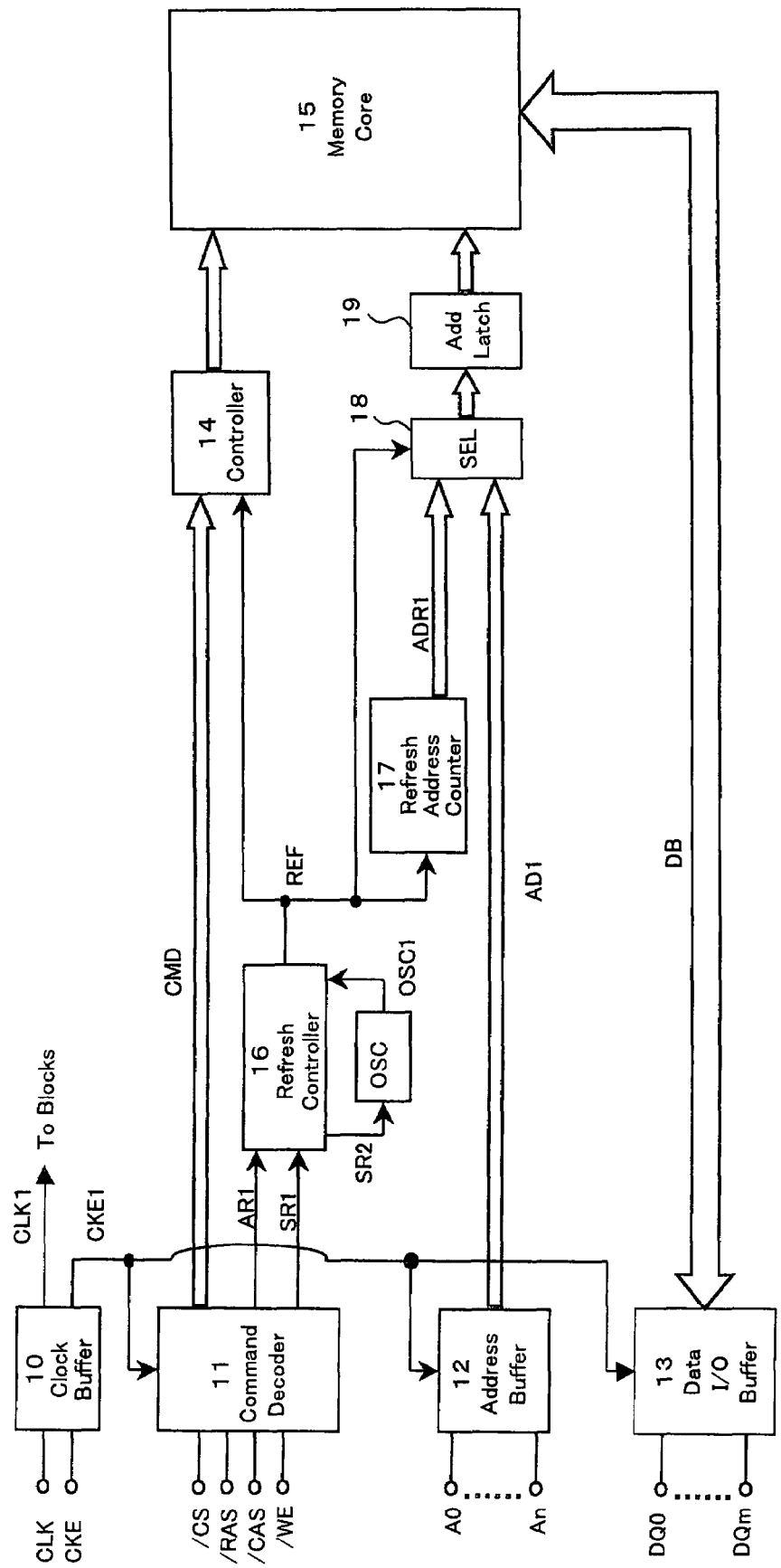
FIG. 1 is a configurational view of a conventional memory circuit.

Embodiments of this invention are explained hereinbelow, referring to the drawings. However, these embodiments do not limit the technical scope of this invention. Further, the embodiments described below are explained for the example of a memory circuit, but this invention is not limited to a memory circuit, and can also be applied to general integrated circuit devices.

First Embodiment of the Invention

Figure 2:
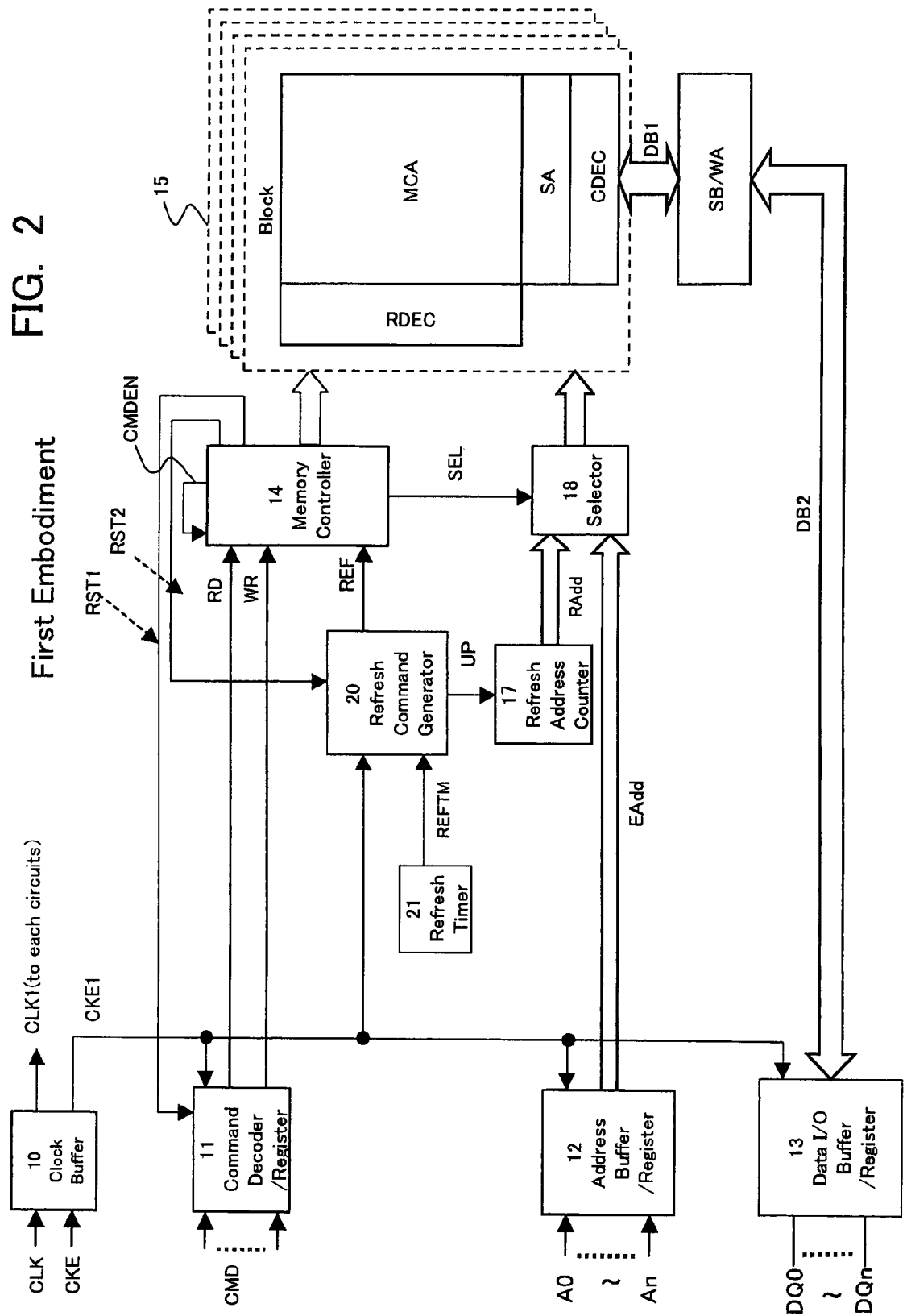
FIG. 2 is an overall configurational view of the memory circuit in a first embodiment of this invention.

FIG. 2 is an overall configurational view of the memory circuit in a first embodiment of this invention. Elements which are the same as in FIG. 1 are assigned the same reference numbers. An external clock signal CLK supplied from outside is input to the clock buffer 10, and an internal clock signal CLK1, synchronized with the clock signal CLK but with phase shifted slightly, is generated. This internal clock signal CLK1 is supplied to circuits, not shown, including a command decoder register 11, address buffer register 12, data input/output buffer register 13, memory control circuit 14, and refresh command generation circuit 20, contributing to operation in sync with the clock. The clock-enable signal CKE is a signal indicating the normal state and power-down state.

In the memory circuit in the first embodiment, the command decoder register 11 receives a command CMD in sync with the clock signal CLK1, generates a read command RD or a write command WR, and supplies this to the memory control circuit 14. The refresh command generation circuit 20 generates a refresh command REF in response to a refresh timer signal REFTM, generated in a fixed refresh cycle by an internal refresh timer 21. In contrast with conventional examples, the refresh command generation circuit 20 responds to the refresh timer signal REFTM whether in the normal state or in the power-down state, and generates a refresh command REF.

The memory control circuit 14 normally executes read control operations or write control operations through clock-synchronous operations, according to internal RD and WR commands. When a refresh command REF is generated, the memory control circuit 14 executes a refresh control operation or a subsequent internal command control operation, through clock-asynchronous operations. The control circuit 14 executes control operations corresponding to commands by supplying to the memory core 15 signals such as, for example, word line driving signal, sense amplifier activation signal, column select signal, and precharge signal.

To this end, when one operation cycle is ended, the memory control circuit 14 generates a command reception signal CMDEN to receive the next command. When, after issuing a command reception signal CMDEN, an internal command RD, WR, or REF is received, a reset signal RST1 is supplied to the command decoder register 11, a reset signal RST2 is supplied to the refresh command generation circuit 20, and the respective internal commands are reset.

FIG. 3 is a drawing showing clock-synchronous operation and clock-asynchronous operation. FIG. 3A is a drawing which explains clock-synchronous operation. The commands RD and WR are input, generated, and held by the command register 11 in sync with the clock signal CLK1. The memory control circuit 14 receives the internal commands RD and WR held by the command register 11 while the command reception signal CMDEN is at H level. Then, control operations corresponding to the internal command are executed.

The memory core 15 has a memory cell array; the minimum operation cycle of this memory cell array consists of a word line rise ta, bit line amplification tb, word line fall tc, and bit line precharge td. These make up the memory cell array operation interval tmca.

In normal synchronous DRAM, in consideration of scattering due to manufacturing processes and other factors, even when the memory cell array operation interval tmca is repeated in sync with the clock signal CLK1, there is a command wait time t1 between the memory cell array operation intervals tmca. Hence, as shown in FIG. 3A, even when the memory cell array operation interval tmca has ended and a command reception signal CMDEN is generated, a new command is not input until the command wait time t1 has elapsed. After the new command is input, the internal command is received by the memory control circuit 14, and the corresponding control operation begins. As a result, the memory cell array operation interval tmca is repeated in sync with the clock signal CLK1.

Next, FIG. 3B shows the clock-asynchronous operation. The commands RD, WR are either held in sync with the clock signal CLK1, or else a refresh command REF, not shown, is generated asynchronously. When the memory cell array operation interval tmca has ended, the internal commands RD, WR, REF are already generated, and so the memory control circuit 14 receives the internal command in response to the command reception signal CMDEN, and the corresponding memory cell array operation interval begins. Hence, in this case, no command wait time t1 exists between memory cell array operation intervals tmca, and the memory cell array operations are repeated in the minimum operation cycle.

When performing clock-asynchronous operations, there exists no command wait time t1, and so even if memory array operations begin with a lag behind the phase of the clock signal CLK1, by executing a plurality of commands with a minimum operation cycle, the memory cell array operations can gradually catch up to the phase of the clock signal CLK1.

In this way, clock-synchronous operations are normal operations, and clock-asynchronous operations correspond to high-speed operations. Switching between these normal operations and high-speed operations can easily be performed by taking the logical AND of the internal command held by the command register 11, and the command reception signal CMDEN generated at the time of completion of the operation interval. That is, if the command reception signal CMDEN is generated earlier, the memory cell array operation interval is begun according to the internal command subsequently generated in sync with the clock signal. Hence, in this case, operations are the clock-synchronous operations (normal operations) of FIG. 3A. On the other hand, if the internal command exists earlier than CMDEN, the memory cell array operation interval begins in response to the subsequently generated command reception signal CMDEN, without the wait time t1. In this case, operations are the clock-asynchronous operations (high-speed operations) of FIG. 3A.

When the memory cell array begins operations in response to a command, the command reception signal CMDEN is reset, and the internal command of the command register 11 is reset. Also, the refresh command of the refresh command generation circuit 20 is reset.

Figure 4:
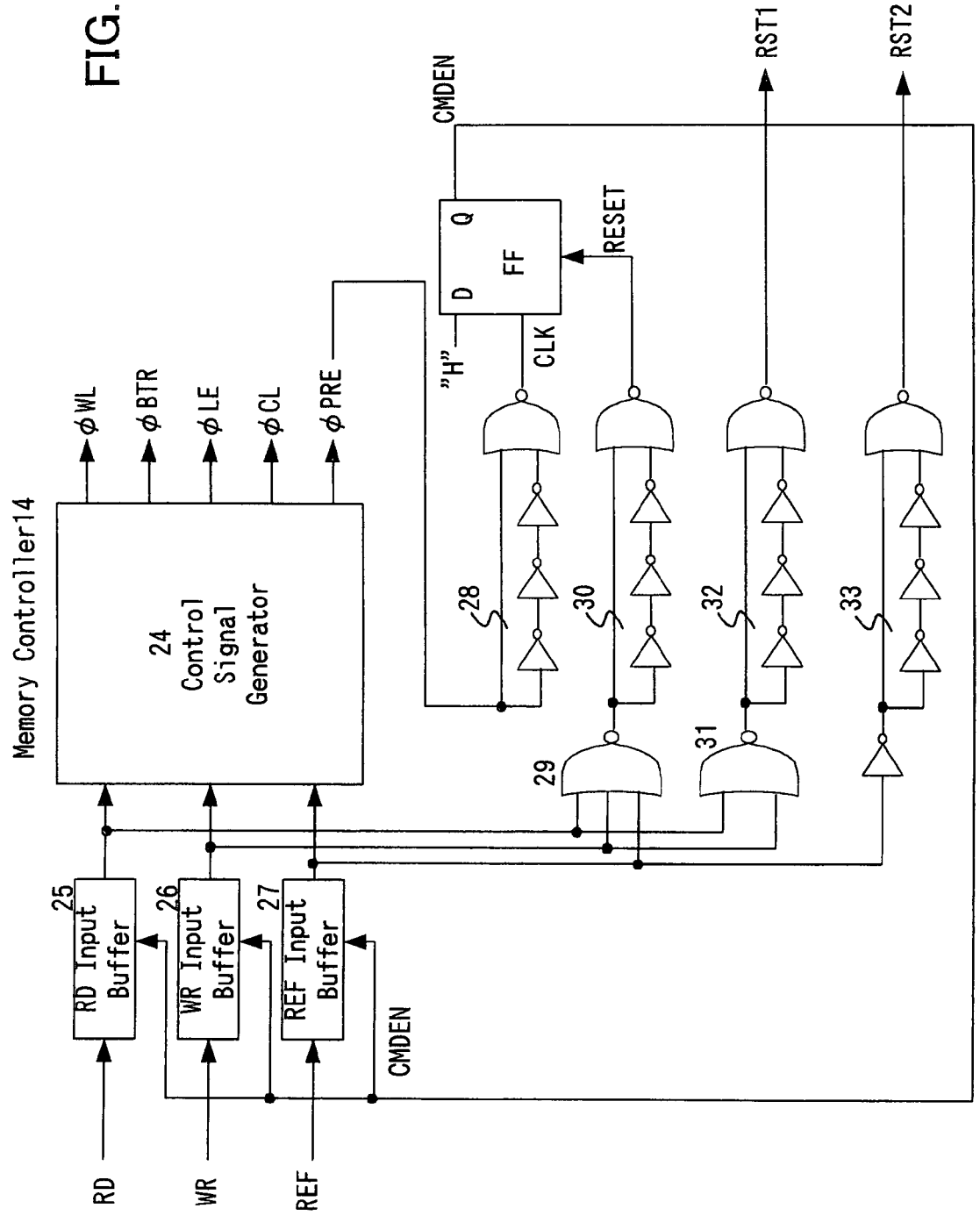
FIG. 4 is a drawing showing an example of the configuration of the memory control circuit 14.

FIG. 4 is a drawing showing an example of the configuration of the memory control circuit 14. The memory control circuit 14 has a control signal generation circuit 24 which supplies various control signals $\phi$ to the memory core 15, and internal command input buffers 25, 26, 27. Control signals include word line driving signals $\phi$WL which drive word lines, bit line transfer gate signals $\phi$BTR which drive the bit line transfer gates between bit line pairs and sense amplifiers, activation signals $\phi$LE which activate sense amplifiers, column gate driving signals JCL, and precharge signals +PRE.

The memory control circuit 14 also has pulse generation circuits 28, 30, 32, 33 which generate pulses at the falling edge of an input pulse, and a flip-flop FF 5 which generates the command reception signal CMDEN. Internal commands RD, WR, REF are, for example, in the inactive state at L level, and in the active state at H level.

Figure 5:
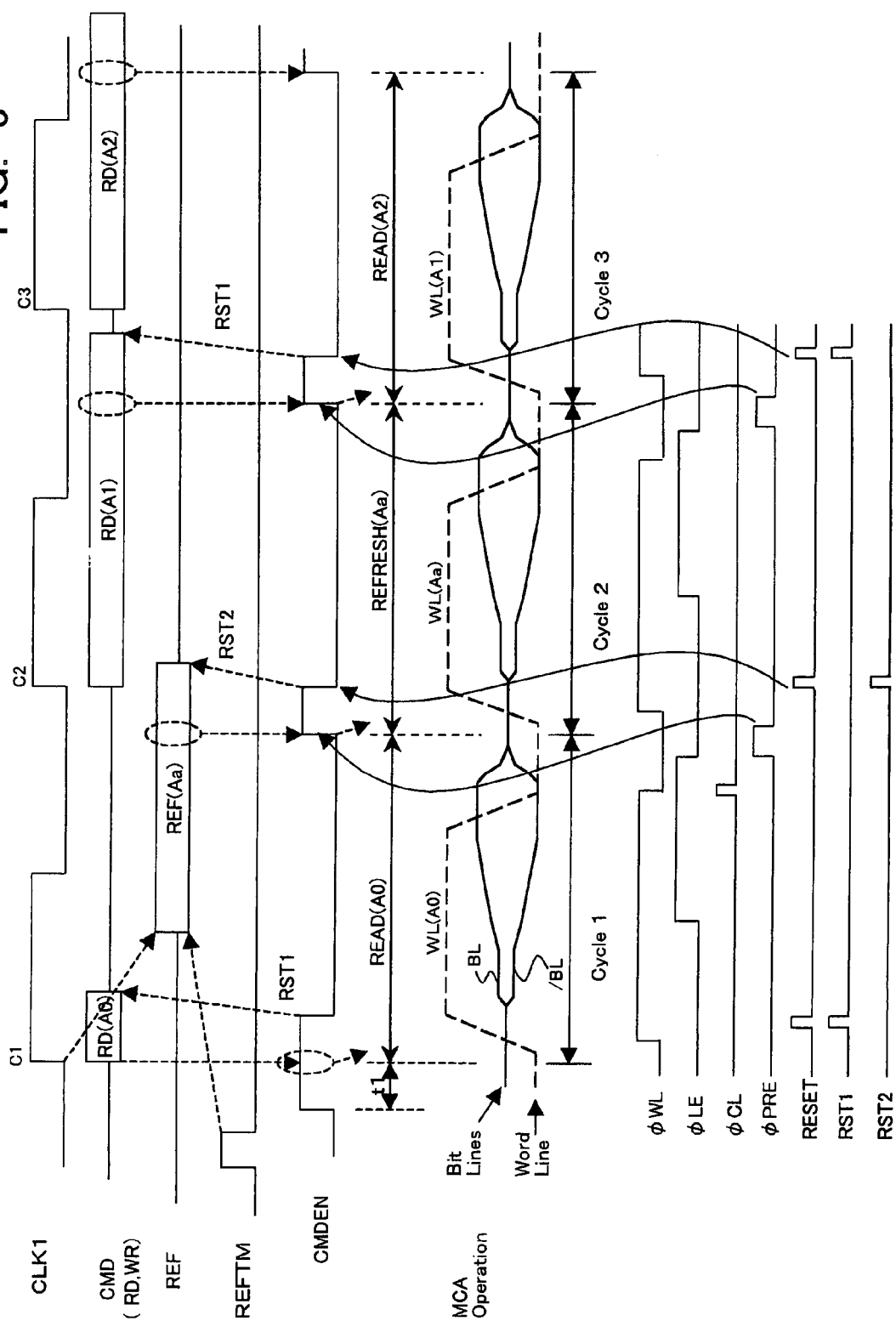
FIG. 5 is a timing chart which shows a transmission from clock-synchronous operation to clock-asynchronous operation when a refresh command is generated.

FIG. 5 is a timing chart which shows the case when making a transmission from clock-synchronous operation to clock-asynchronous operation when a refresh command is generated. The memory cell array repeats normal operations, synchronized with the clock, until the rising edge C1 of the clock signal CLK1. Hence, before the clock rising edge C1, the command reception signal CMDEN is generated. Also, it is assumed that before the clock rising edge C1, the refresh timer signal REFTM is generated.

When the refresh timer signal REFTM is generated prior to the operation cycle 1, the refresh command generation circuit 20 generates a refresh command REF after a delay for a prescribed length of time from the rising edge C1 of the subsequent clock signal. Thus, an internal command RD(A0) corresponding to a command from outside is given precedence, and internal operation cycle thereof can be executed.

Because the command reception signal CMDEN has been received, the internal command RD(A0) (read command) generated at the rising edge C1 is input to the command input buffer 25 of the memory control circuit 14 in sync with the clock signal CLK1. Consequently, various control signals are generated for the read operation by the control signal generation circuit 24, and the cycle 1 starts from the leading edge C1. In the cycle 1, the word line driving signal φWL, sense amplifier activation signal φLE, column select signal φCL, and other signals are generated, and finally the precharge signal φPRE is generated. When the precharge interval ends, the flip-flop FF generates a command reception signal CMDEN. When operations for the internal command RD(A0) are begun, the command is reset by the reset signal RST1.

At this point, a refresh command REF is already generated, and so the command input buffer 27 inputs this REF command in response to the command reception signal CMDEN, and the control signal generation circuit 24 generates various control signals φ corresponding to the refresh operation. In actuality, the refresh operation is the same as a read operation. When the REF command is input, a reset signal RESET is generated, and the command reception signal CMDEN goes to L level. At the same time, a reset signal RST2 is generated, and the refresh command REF is reset. Hence, the operation of cycle 2 corresponding to the refresh command begins before the clock rising edge C2, without an intervening wait time t1. That is, clock-asynchronous operation occurs.

When the refresh operation ends, a command reception signal CMDEN is again generated. At this time, the internal command RD(A1) is already held in the command register 11, in sync with the clock edge C2. Hence, in response to the command reception signal CMDEN, the internal command RD(A1) is input to the command input buffer 25, and operation of the next cycle 3 begins. This operation is also a clock-asynchronous operation.

Subsequently, internal commands generated in sync with the clock edge are similarly executed through sequential clock-asynchronous operations. Clock-asynchronous operation is high-speed operation without wait time, so that the internal operation cycle gradually catches up with the clock CLK1 cycles, and the command reception signal CMDEN advances ahead of the phase of the clock CLK1 rising edge. As a result, the internal operation cycles become clock-synchronous operations, in sync with the clock signal CLK1 and with a wait time t1 in between.

Figure 6:
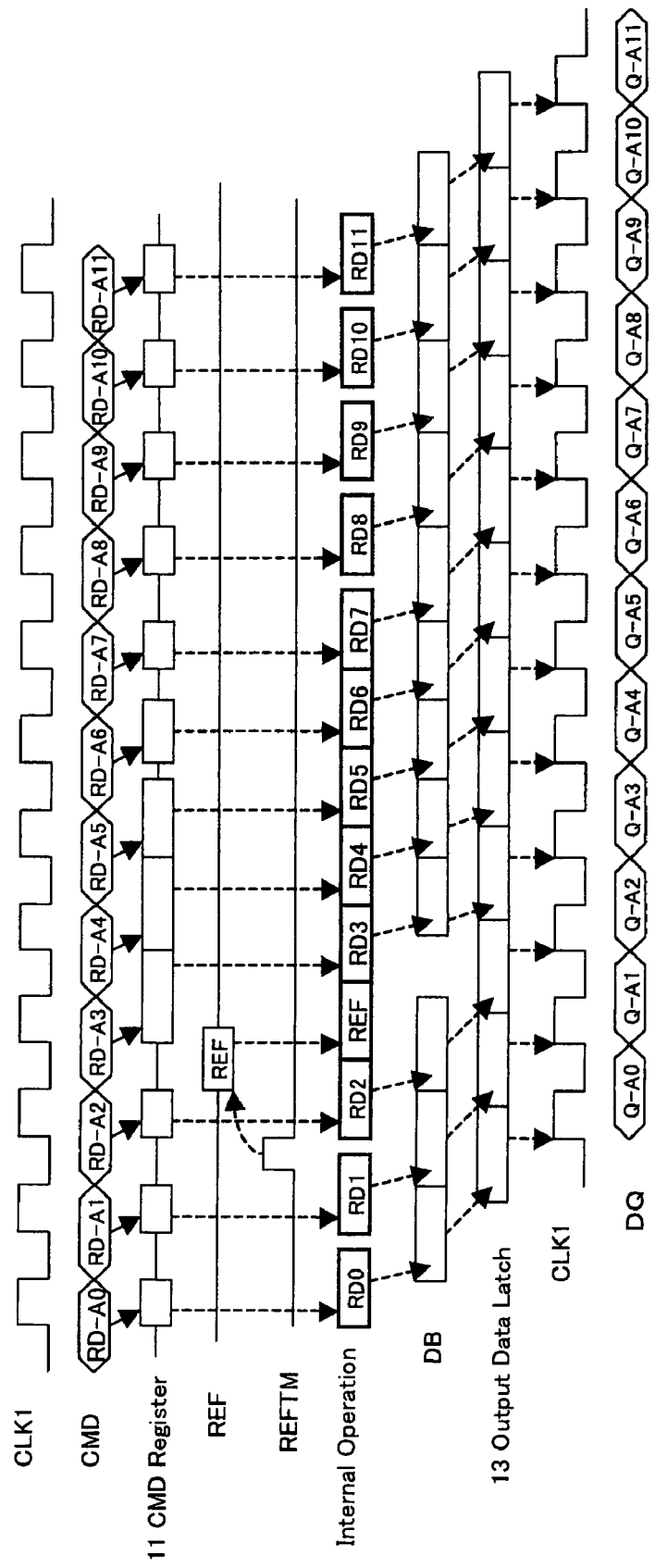
FIG. 6 is a timing chart which shows clock synchronous operation and clock-asynchronous operation in the first embodiment.

FIG. 6 is a timing chart which shows clock-synchronous operation and clock-asynchronous operation (high-speed operation) in the first embodiment. FIG. 6 shows the operation of FIG. 5 through more numerous operation cycles. The command CMD from outside is supplied in sync with the clock signal CLK1, and internal commands are held by the command register 11. In the example of FIG. 6, the read command RD is supplied continuously.

Initially, the internal operation cycles RD0-2 are executed in sync with the clock signal CLK1. When, at the time of the internal operation cycle RD1, the refresh timer generates a refresh timer signal REFTM, an internal refresh command REF is output after a fixed delay. When the internal operation cycle RD2 ends, an internal operation cycle begins according to the existing refresh command REF. Thereafter, a transition to clock-synchronous operation is made, and internal operation cycles RD3 to RD7 are high-speed operations. When internal operation cycles eventually catch up to the clock CLK1 cycles, the internal operation cycle RD8 and subsequent cycles again become clock-synchronous operations.

That is, in response to continuously input read commands, all are input and held, when necessary refresh operation cycles are interrupted, and the held read commands are executed through clock-asynchronous highspeed operations. Consequently, the read data is output continuously to the data output terminal DQ, and the memory controller does not "see" the internal refresh operations; it appears that normal continuous reading is being performed.

Figure 7:
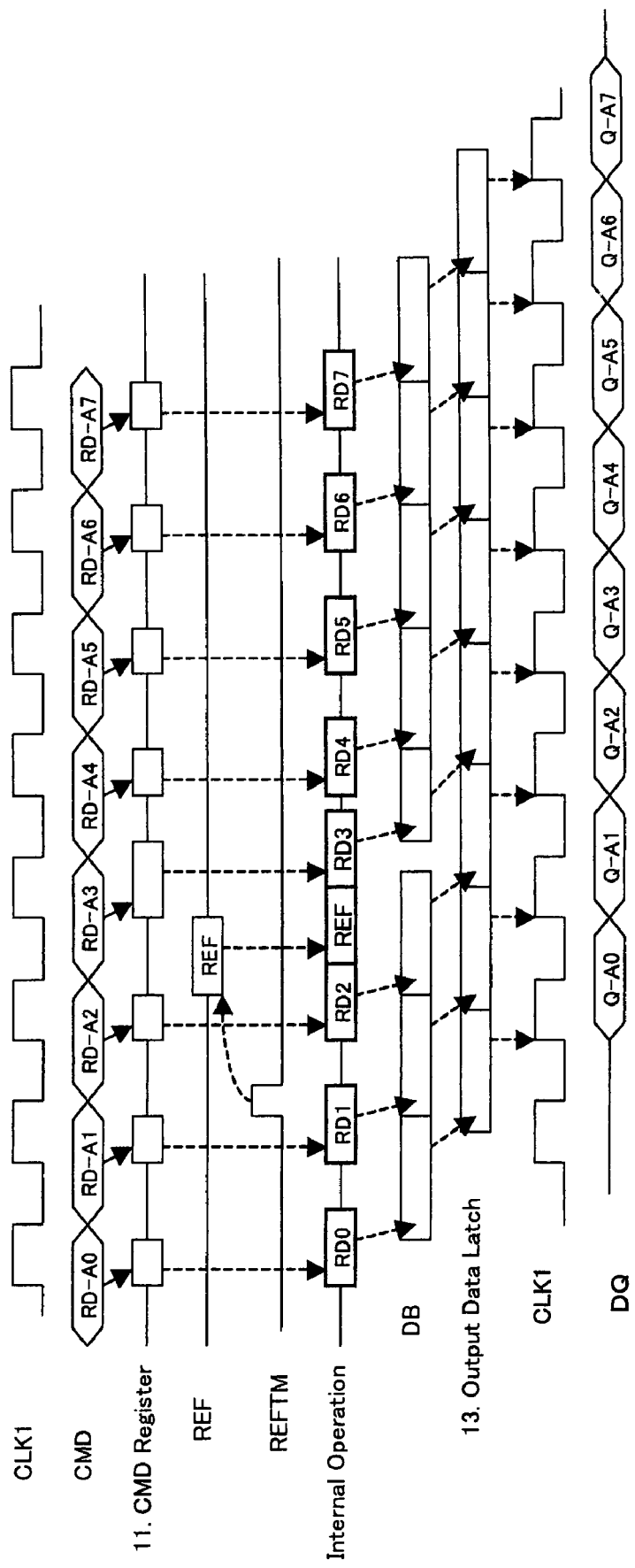
FIG. 7 is a timing chart which shows clock synchronous operation and clock-asynchronous operation in the case of a slower external clock.

FIG. 7 is a timing chart which shows clock-asynchronous operation and clock-asynchronous operation 25 (high-speed operation) in the case of a slower external clock. In this case, internal high-speed operation (clock-synchronous operation) cycles are considerably shorter than clock CLK1 cycles. Hence, clock-asynchronous operation begins from a refresh operation cycle REF after generation of a refresh command REF; but this high-speed operation continues until the next read operation cycle RD3, after which clock-synchronous operation occurs. That is, after execution of refresh operation, the interval until internal operation cycles catch up with clock CLK1 cycles is shortened.

Figure 8:
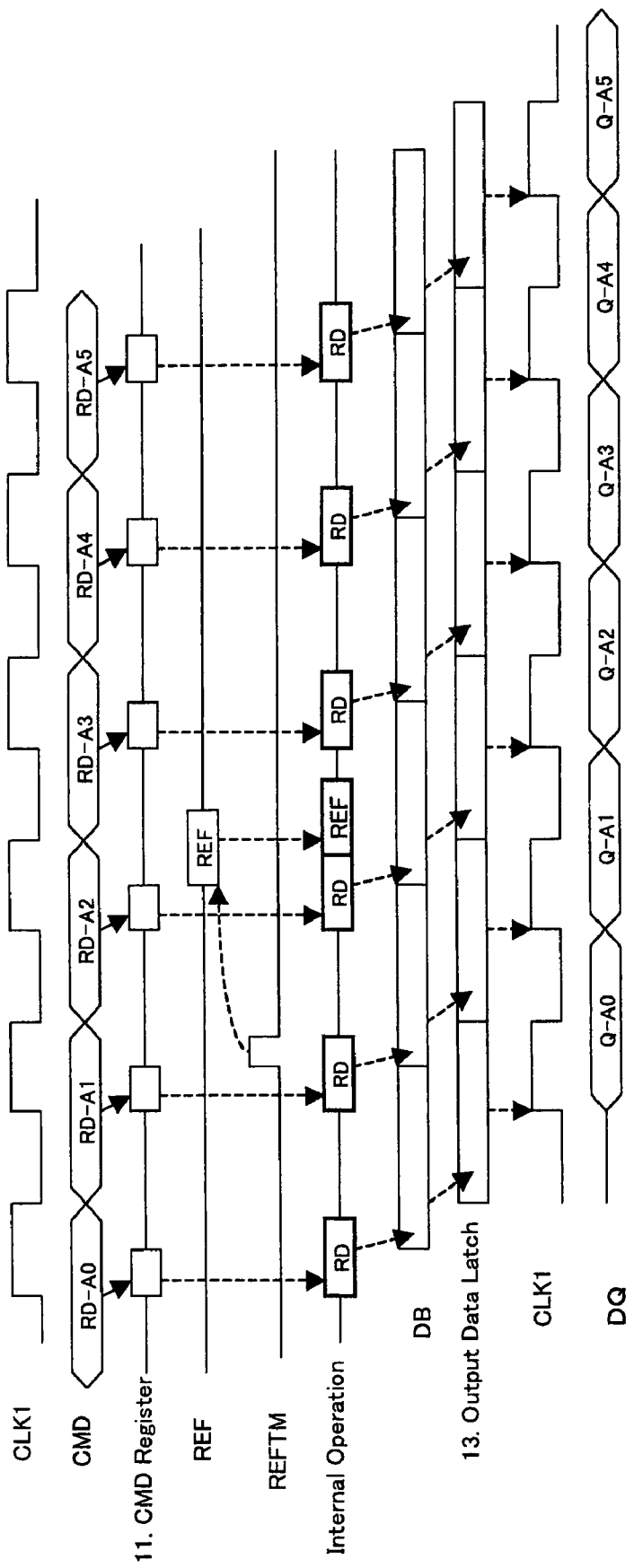
FIG. 8 is a timing chart which shows clock-synchronous operation and clock-asynchronous operation in the case of a still slower external clock.

FIG. 8 is a timing chart which shows clock-asynchronous operation and clock-asynchronous operation (high-speed operation) in the case of a still slower external clock. In this case, after the third read operation cycle RD, a refresh operation is performed clock-asynchronously; but this refresh operation is completed before the next clock CLK1 rising edge, and from the next read operation cycle, operation returns to clock-synchronous operation.

In all of the cases of FIGS. 6, 7 and 8, internal circuits are controlled such that read data is output to the data output terminal DQ two clock cycles after input of the external command, so that even when continuous commands during normal operation are interrupted by refresh operations during processing, read data can be output continuously without problem.

Figure 9:
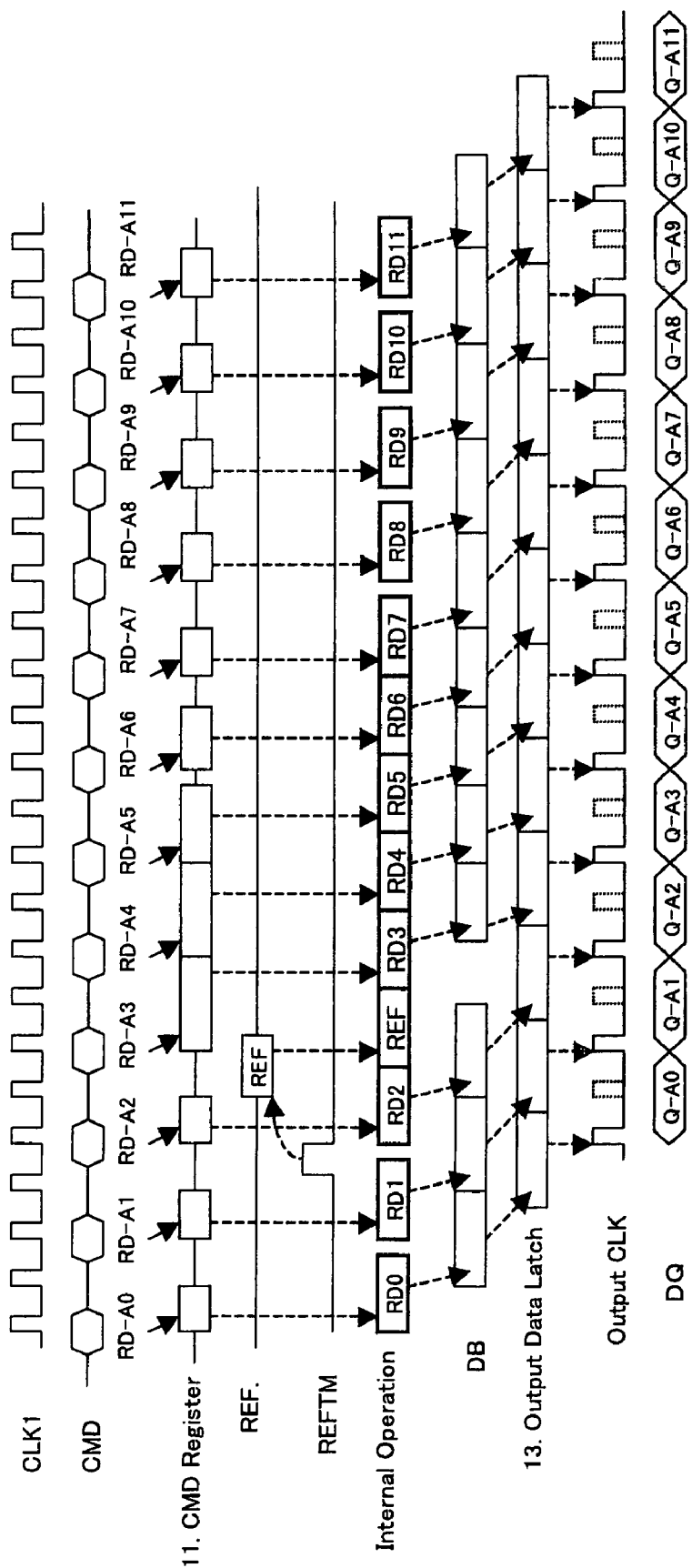
FIG. 9 is a timing chart which shows clock-synchronous operation and clock-asynchronous operation in the case in which internal operation cycles are twice as 5 long as the external clock CLK1 cycles.

FIG. 9 is a timing chart which shows clock synchronous operation and clock-asynchronous operation (high-speed operation) in the case in which internal operation cycles are twice as long as the external clock CLK1 cycles. This is an example for cases in which the clock CLK1 in the system equipped with the memory device is fast, and compared with this, operations within the device are slow. In this case, specifications are such that the continuous supply of commands from outside in sync with the external clock CLK1 is not permitted. Hence, at the fastest, commands from outside are supplied in sync with odd-numbered or with even-numbered clock rising edges.

Even in this case, as shown in FIG. 9, the wait time t1 between internal operation cycles can be utilized, similarly to the case of FIG. 6, so that a refresh operation cycle can be inserted. However, in the case of FIG. 9, read data is output to the data output terminal DQ four clock cycles after input of the external command. There are also cases in which, after a command has been input in sync with an odd-numbered clock cycle, the command is supplied in sync with an even-numbered clock cycle. However, even in this case, commands are not supplied in sync with continuous clock cycles. Hence, in this case, two clock cycles exist between commands, and there is no impediment to the insertion of an internal refresh operation cycle.

In the above first embodiment, the refresh timer signal REFTM is at, for example, a frequency approximately two orders of magnitude lower than the clock signal CLK. Hence, for several hundred clock cycles CLK, the refresh timer signal REFTM is generated once or so. As a result, for several hundred external operation cycles, there are internal operation cycles in which one refresh cycle is added to several hundred cycles. There is no need to allocate two types of internal operation cycle, normal internal operation cycles and refresh operation cycles, to all external operation cycles, and high-speed operation is assured in normal operation.

Second Embodiment of the Invention

The second embodiment of this invention is a memory circuit, which executes commands through internal operation cycles, which are shorter than external operation cycles. In a memory circuit which requires refresh operations, the memory control circuit has, for every M external operation cycles (Ma2), N internal operation cycles, where N is greater than M (M<N<2M). External commands are input in sync with external operation cycles. Read data output and write data input are also performed in sync with external operation cycles. However, the N internal operation cycles have first internal operation cycles, which execute external commands corresponding to external operation cycles, and second internal operation. cycles which execute refresh commands. When refresh commands are issued internally, the above second internal operation cycles are used to perform refresh operations.

In this way, the memory circuit of the second embodiment generates, within an expanded operation cycle consisting of M external operation cycles, N internal operation cycles, where N is greater than M, and by utilizing the (N−M_internal operation cycles, executes refresh operation corresponding to refresh commands which are automatically generated internally. However, commands and write data are input, and read data output continuously in sync with external operation cycles in response to continuously input read commands, with a delay of a prescribed read latency.

In the following embodiment, the case of M=7 and N=8 is explained.

Figure 10:
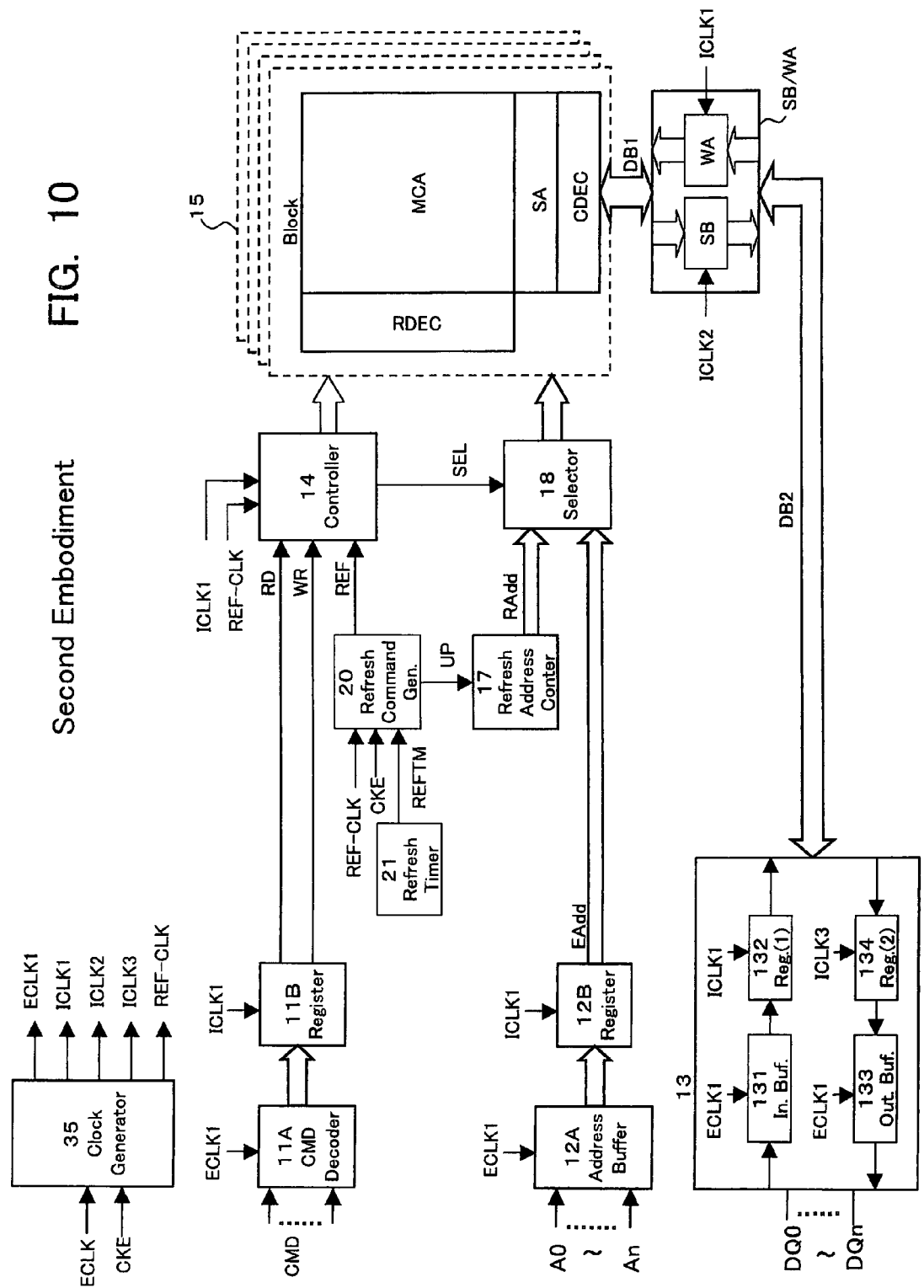
FIG. 10 is a configurational view of the memory circuit in a second embodiment of the invention.
Figure 11:
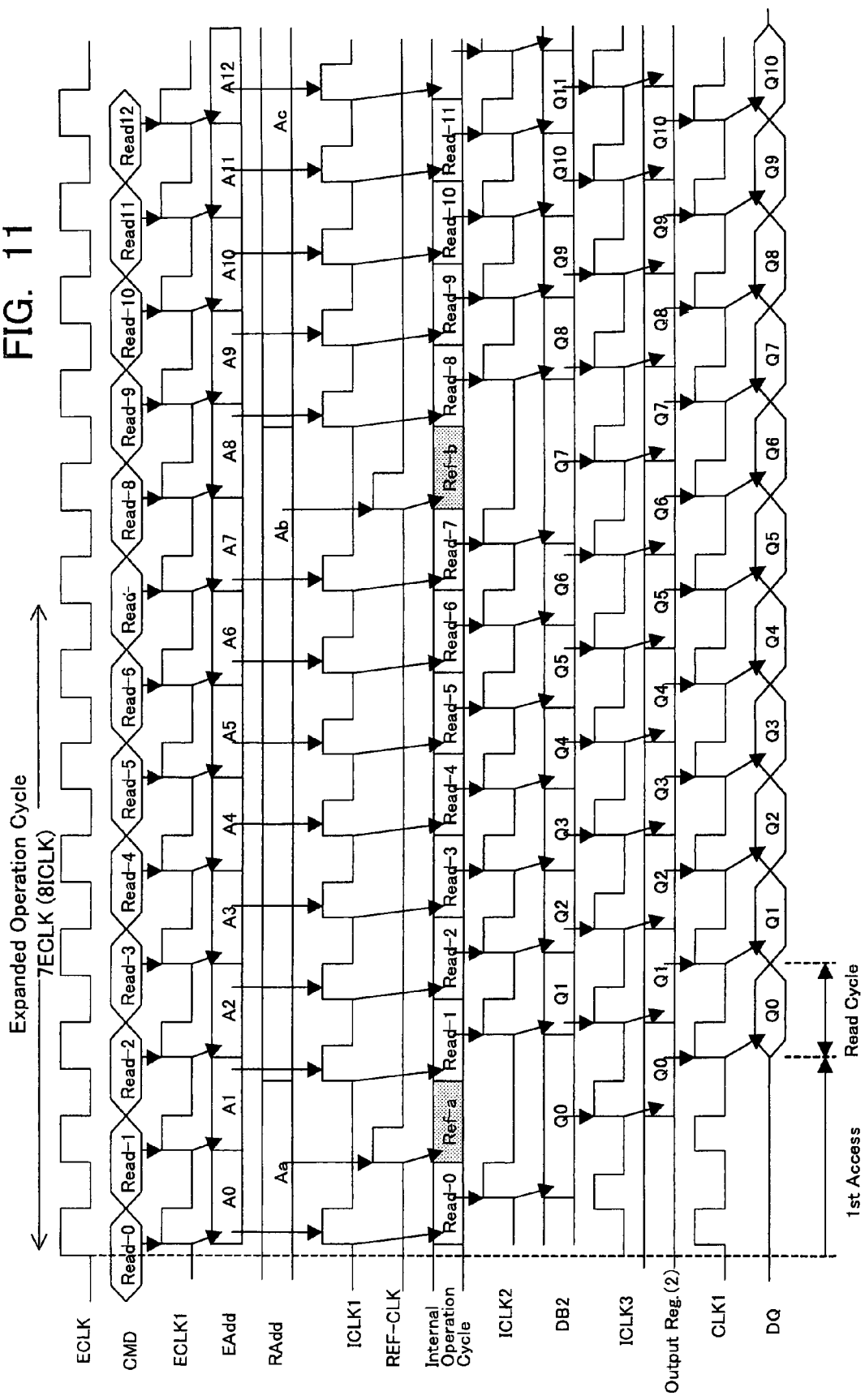
FIG. 11 is an operation timing chart of the memory circuit of the second embodiment.

FIG. 10 is a configurational diagram of the memory circuit in the second embodiment of the invention. Elements, which are the same as in FIG. 2, are assigned the same reference numbers. FIG. 11 is the operation timing chart. Compared with FIG. 2, the memory circuit of FIG. 10 differs in being provided with a clock generation circuit 35, which generates a clock signal ECLK1 from the external, internal clock ECLK, and in sync with the external clock, and international clock signals ICLK1 to ICLK3 and REF-CLK which control internal operation cycles. As shown in FIG. 11, internal clock ICLK defines eight internal operation cycles occurring for every seven external operation cycles. Hence, the period of the internal clock cycles is slightly shorter than the period of external clock cycles.

Among the clock signals generated by the above clock generation circuit 35, the external clock signal ECLK1 is synchronized with the external clock signal ECLK, and controls the input and output timing of commands, addresses, and data. The internal clock signal ICLK1 controls the start of internal operation cycles to execute external commands. The internal clock signal ICLK2 lags behind the above clock signal ICLK1, and outputs data read from the memory core to the data bus BD2. The output latch clock ICLK3 receives data output of the data bus DB2 into the output register 134 within the data input/output circuit 13. The refresh clock signal REF-CLK controls refresh internal operation cycles.

Hence, in the memory circuit of FIG. 10, external commands CMD are input to the command decoder 11A and external addresses are input to the address buffer 12A, both in sync with the clock signal ECLK1. In the data input/output buffer 13, read data is output from the output buffer 133 and write data is input to the input buffer 131, in sync with the clock signal ECLK1.

The command register 11B and address register 12B supply commands RD, WR and external addresses EAdd to the memory control circuit 14 and memory core 15 in sync with the internal clock signal ICLK1. Similarly, read data is output from the memory core to the sense buffer in sync with the internal clock signal ICLK2, and read data in the data bus is latched by the register 134 in sync with the output latch clock ICLK3. Write data is latched by the register 132 in sync with the internal clock signal ICLK1. Hence, the registers 11B, 12B, 134 and 132 absorb phase shifts between the external clock signals and internal clock signals, and latch and transmit corresponding signals in accordance with internal operation cycles.

The timing chart of FIG. 11 shows the case in which, as external commands, the read commands Read-0 to Read-12 are supplied in sync with the external clock ECLK. A cycle consisting of seven external clock cycles ECLK is called an expanded operation cycle. In this expanded operation cycle, seven internal clock cycles ICLK1 and one refresh clock cycle REF-CLK are generated.

First, in sync with the external clock signal ECLK1, an external command is input to the command decoder 11A and the external address is also input to the address buffer 12A. The first read command Read-0 is latched by the register 11B in sync with the internal clock signal ICLK1, and is supplied to the memory control circuit 14. Then, the read operation cycles are executed in sync with the internal clock signal ICLK1. Read data which is read from the memory core 15 is output to the data bus DB2 by the sense buffer SB in sync with the internal clock signal ICLK2, and is latched by the output register 134 in sync with the output latch clock ICLK3. Finally, the read data is output to the output terminal DQ from the output buffer 133 in sync with the external. clock signal ECLK1. In the example of FIG. 11, the latency from input of the first read command Read 0 to output of the read data Q0 is two external clock cycles.

In the example of FIG. 11, the second internal operation cycle within the expanded operation cycle is allocated as a refresh operation cycle. Hence, the refresh clock signal REF CLK is generated as the second internal clock signal. The refresh command generation circuit 20 generates a refresh command REF in sync with the refresh clock signal REF CLK, in response to the refresh timer signal REFTM generated at each refresh cycle by the refresh timer 21. Hence, when the refresh timer signal is generated, the refresh operation is executed in the second internal operation cycle within the expanded operation cycle. In the refresh operation, the selector 18 selects the refresh address RAdd of the refresh address counter 17 and supplies it to the row decoder RDEC. When the refresh operation is executed, the refresh address counter 17 is incremented. If no refresh timer signal is generated, no operations are performed in the second internal operation cycle. In the third through the eighth internal operation cycles, read operations corresponding to the remaining six read commands, Read 1 to Read 6, are executed.

Hence, compared with external operation cycles (the cycles of the external clock ECLK), internal operation cycles subsequent to an inserted refresh operation lag considerably; but because internal operation cycles are each ⅛ shorter than external clock cycles, the internal operation cycles gradually approach the external clock cycles, and finally catch up at the end of the expanded operation cycle.

Figure 12:
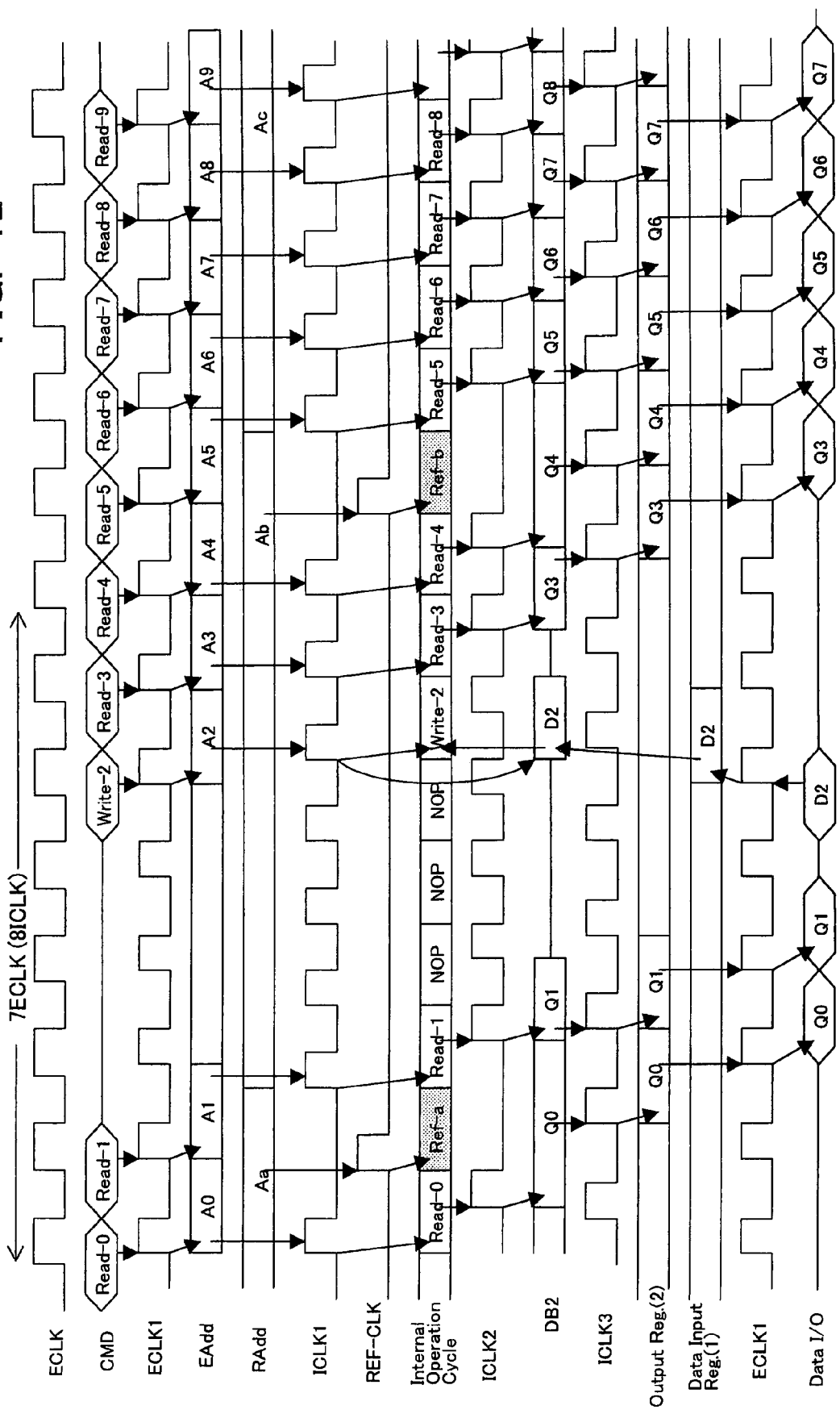
FIG. 12 is an operation timing chart for the case in which read commands and write commands are intermixed.

FIG. 12 is an operation timing chart for the case in which read commands and write commands are intermixed. In this case also, similarly to the case of FIG. 11, there exist eight internal operation cycles for seven external clock cycles. Write data D2 is input in sync with the external clock ECLK1, and write operations are executed in sync with internal operation cycles. Because the read latency is 2, the next write command Write 2 is supplied four clock cycles after the read command Read 1. Thus, conflicts between read data Q1 and write data D2 at the input/output terminal DB are avoided.

Figure 13:
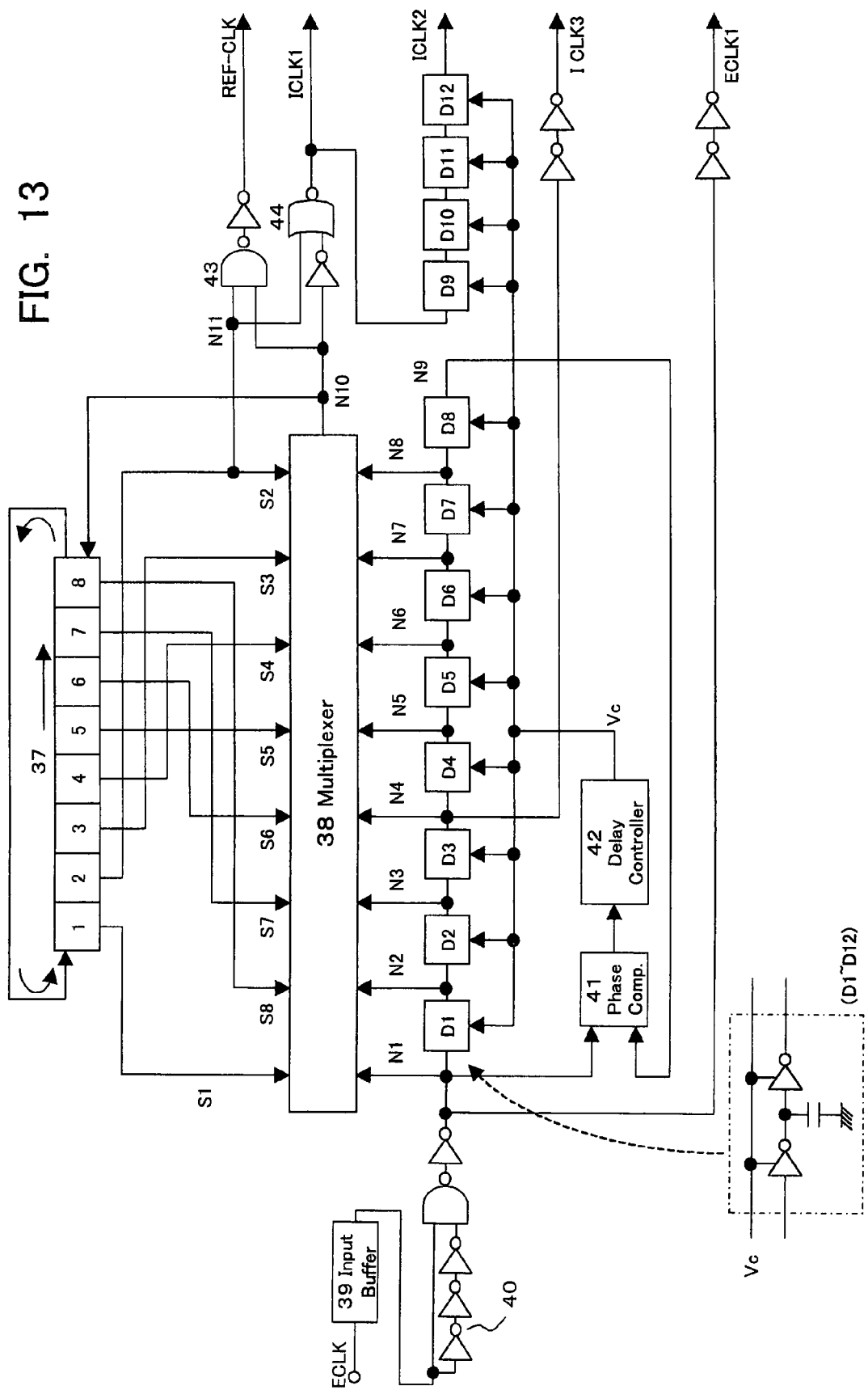
FIG. 13 is a circuit diagram for the clock generation circuit.
Figure 14:
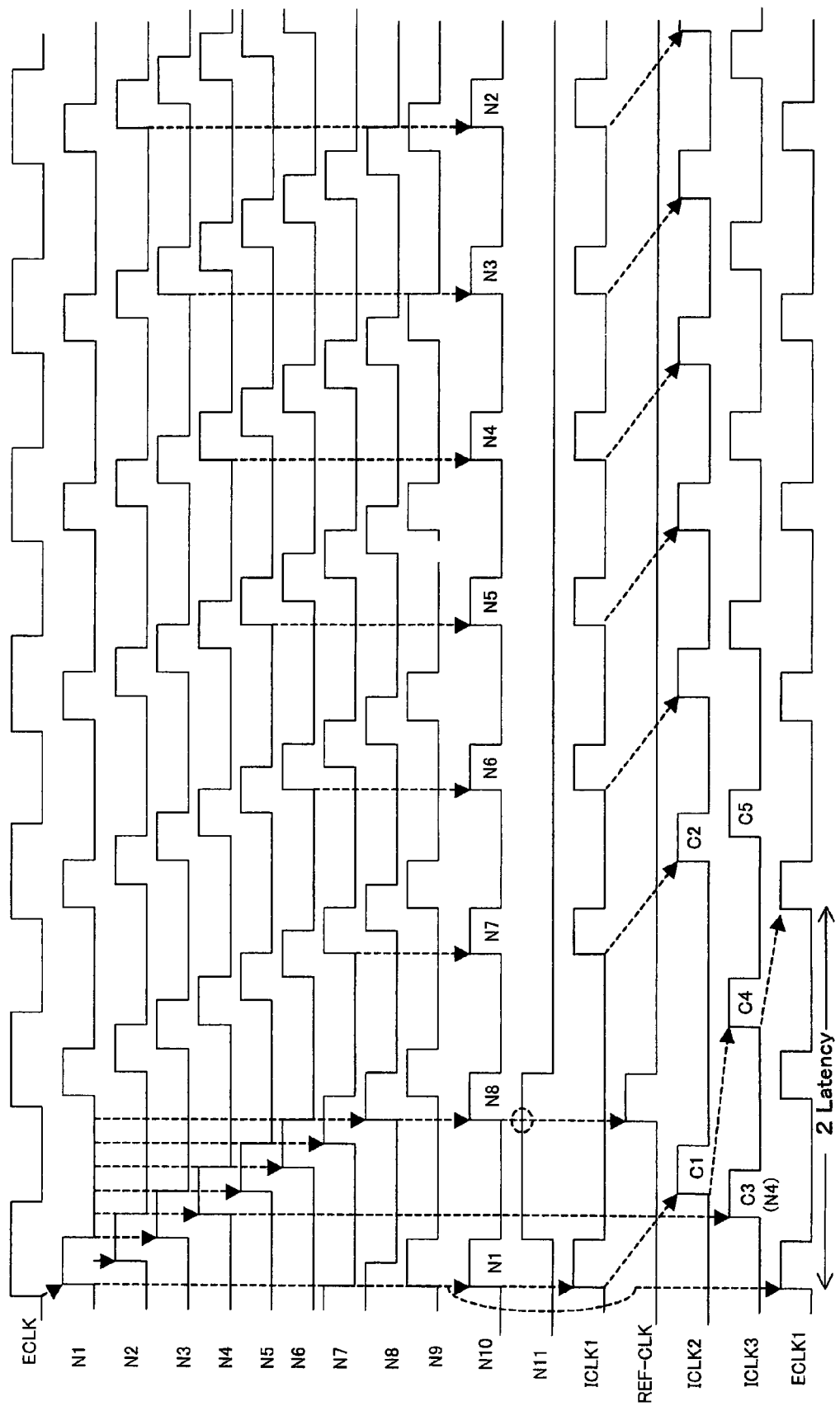
FIG. 14 is an operation timing chart for the clock generation circuit.

FIG. 13 is a circuit diagram for the clock generation circuit. FIG. 14 is the operation timing chart thereof. The clock generation circuit 35 inputs the external clock signal ECLK to the input buffer 39, and via the pulse width adjustment circuit 40, generates a clock signal ECLK1 having a pulse width equal to three gates' worth from the rising edge. Hence, this clock signal ECLK1 is synchronized with the external clock ECLK, and lags somewhat in phase.

The output N1 of the pulse width adjustment circuit 40 is supplied to one input of the phase comparator 41, and is also supplied to the other input via the variable delay elements D1 to D8. In response to the phase difference detected by the phase comparator 41, the delay control circuit 42 outputs a delay control voltage Vc such that the phase difference disappears. The delay times of each of the variable delay elements D1 to D8 are adjusted according to this delay control voltage Vc.

Hence, as the output of the variable delay elements, eight internal clock signals N1 to N8 are generated, having phase shifts resulting from division of one cycle of the external clock ECLK into eight equal parts. These internal clock signals N1 to N8 are selected by the multiplexer 38 according to select signals S1 to S8 output by the shift register 37, and are output as the internal clock signal N10. The shift register 37 is shifted by the falling edge of the internal clock signal N10. The select signals S1 to S8 generated in sequence select the internal clock signals N1 to N8 in the order S1, S8, S7, . . . , S2. As a result, the internal clock signal N10 is a short-cycle clock having ⅞ the cycle of the external clock ECLK, and with phase advanced by ⅛ cycle relative to the external clock ECLK.

From this internal clock signal N10, the second clock cycle is eliminated by the NOR gate 44, so that seven internal clocks ICLK1 are generated. Further, the second clock is selected by the NAND gate 43, and one refresh clock signal REF CLK is generated. An internal clock signal ICLK2 is generated, with phase lagging by the delay time of the variable delay elements D9 through D12 with respect to the internal clock ICLK1. From the clock N4, an output latch clock ICLK3 is generated with phase lagging by two inverter stages' worth. By selecting the clock N4, C1 and C2 of the internal clock ICLK2, and C3, C4, C5 of the output latch clock ICLK3, are generated in the order C3 C1 C4 C2 C5. Thus, even when a refresh operation is inserted in the second internal operation cycle, the output register 134 can be latched continuously in the same order as the read data in response to continuous read commands.

FIG. 15 is a drawing showing the refresh command generation circuit and the operation timing chart thereof. The refresh command generation circuit 20 has delay flip-flops 46, 47; a NAND gate 48; and a delay circuit 49. As shown in the operation timing chart, the signal N22 goes to H level in sync with the refresh clock signal REF CLK following generation of a refresh timer signal REFTM, and a refresh command REF is generated. After the delay of the delay circuit 49, the count up signal UP is generated, and the address of the refresh address counter 17 is incremented. Thus, the flip flops 46, 47 are reset.

In this way, of the eight internal operation cycles within the expanded operation cycle, the second internal operation cycle is reserved for refresh operations. When the refresh timer signal REFTM is generated, a refresh command REF is generated in the immediately following second internal operation cycle, and refresh operations are executed in the memory core 15. In these refresh operations, word lines are driven corresponding to the refresh address RAdd from the refresh address counter, and data read to bit line pairs is amplified by the sense amplifier SA and rewritten to the memory cells. Then word line levels are lowered, and precharge operations are performed.

Third Embodiment of the Invention

In the second embodiment, the second internal operation cycle was allocated as a refresh operation cycle. Hence, the read access time (read latency) of read commands corresponding to the first internal operation cycle was, as shown in FIG. 11, relatively long. This is because the output timing of read data in cycles before and after the second internal operation cycle is made continuous in sync with the external clock.

On the other hand, in the third embodiment of this invention, among eight external operation cycles, there are eight first internal operation cycles for execution of external commands, and two second internal operation cycles to perform refresh operations. The second internal operation cycles for refresh operations are of approximately half the length of the first internal operation cycles, and a single refresh operation is divided into two second internal operations. As a result, the worst read access time can be shortened compared with 5 the second aspect.

Figure 16:
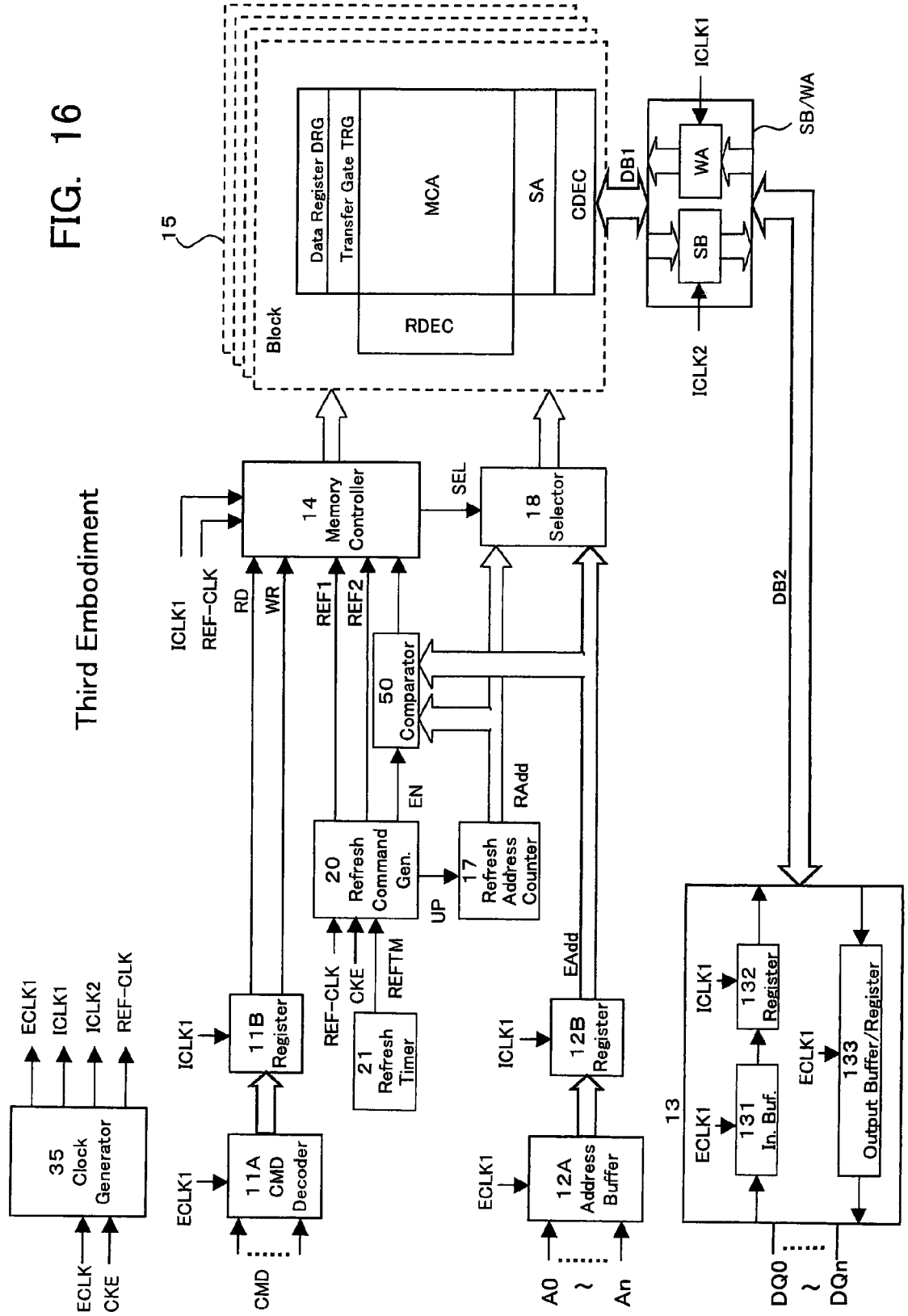
FIG. 16 is a configurational view of the memory circuit in a third embodiment of the invention.

FIG. 16 is a configurational diagram of the memory circuit in the third embodiment of the invention. Differences with FIG. 10 include the generation of two refresh commands REF1, REF2, and the provision of a comparator 50 which compares the refresh address RAdd and the external address Eadd and generates a comparison result signal. This configuration also differs from FIG. 10 in that within the memory core 15 are provided a data register DRG which temporarily holds memory cell read data, and a transfer gate TRG provided between bit line pairs (not shown) within the cell array MCA, and the data register DRG. The data register DRG, which is essentially the same circuit as the sense amplifier SA, amplifies and holds the voltage of bit line pairs in the first half of the refresh operation cycle. Otherwise, the same reference numbers have been assigned, and so explanations are omitted.

Figure 18:
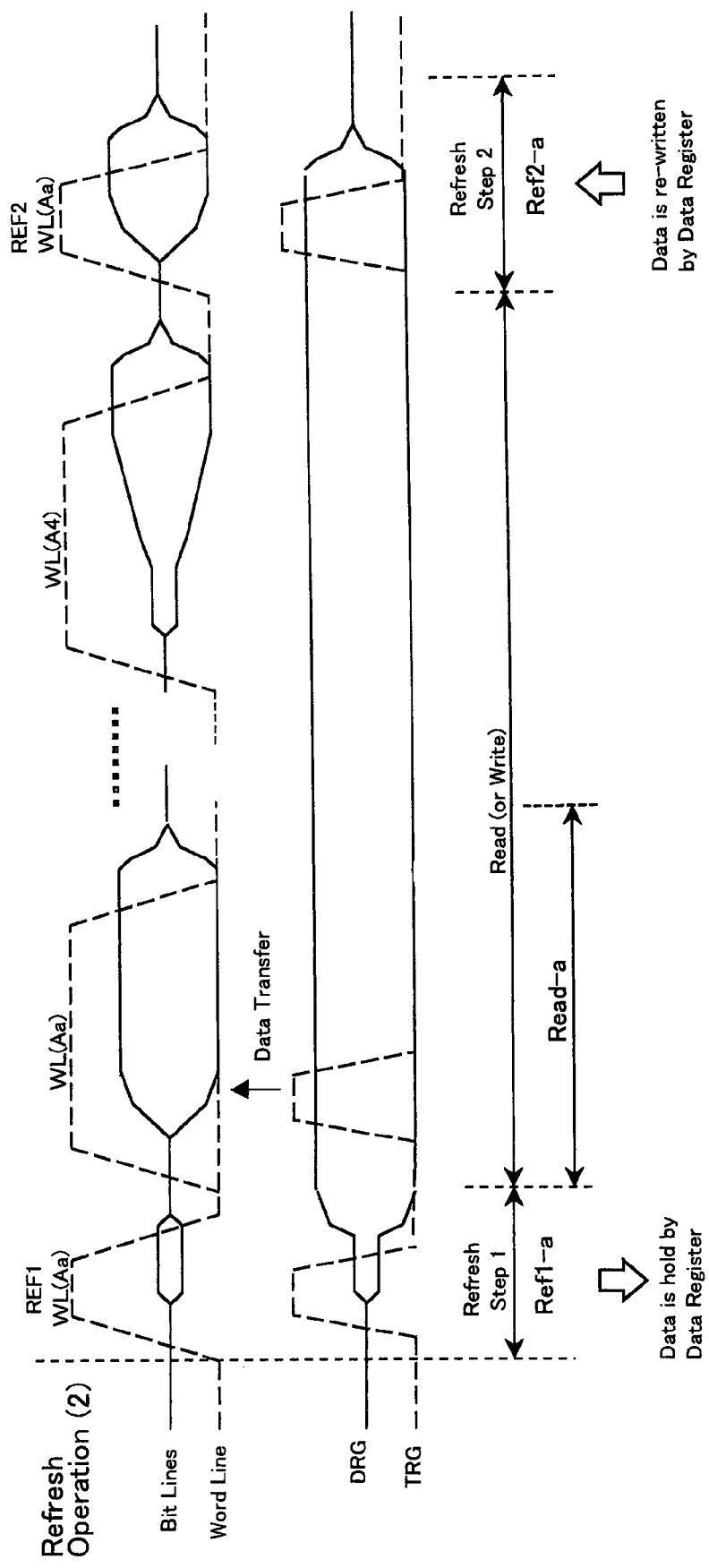
FIG. 18 is a drawing explaining the refresh operation of the third embodiment.

FIGS. 17 and 18 are drawings, which explain refresh operations in the third embodiment. FIG. 17A shows a normal refresh operation and a read or write operation. In either case, a word line WL selected by a row address is driven, and data in memory cells is read to bit line pairs BL, /BL; this is amplified by the sense amplifier SA, and after rewriting, precharging is performed.

FIG. 17B shows a refresh operation in this embodiment. Refresh operations in this aspect are divided into two refresh operation cycles REF1, REF2 and executed. In the initial refresh step 1, the word line is driven and memory cells for refreshing are selected, and this data is transferred to the data register DRG via bit line pairs and the transfer gate TRG. The data register DRG is essentially the same circuit as the sense amplifier, can amplify the voltage on bit line pairs, and holds this data. Next, in refresh step 2, the memory cells for refreshing are again selected, and data held by the data register is rewritten to memory cells via the transfer gate. In both refresh steps, precharging is performed lastly. Further, between the two refresh steps are inserted normal read or write operation cycles corresponding to external commands.

FIG. 18 shows another refresh operation of this aspect. By dividing the refresh operation into two refresh cycles, in the initial refresh step 1, the data of the memory cells for refreshing is destroyed. In refresh step 2, following several internal operation cycles, rewriting from the data register is performed; but if, in normal internal operation cycles during this interval, row addresses which are the same as the refreshed memory cells are accessed, read and write operations cannot be performed normally.

Hence, as shown in FIG. 18, when the row address of refreshed memory cells Aa and the row address of subsequent normal internal operations Aa coincide, in the internal operation cycle, the transfer gate TRG is opened, and data held by the data register DRG is read, or data corresponding to write data from the write amplifier WA is written to the data register DRG. Hence, in this internal operation cycle, it is not always necessary to drive word lines.

In the subsequent refresh step 2, word lines are driven, the transfer gate TRG is again opened, and data held in the data register DRG is written to memory cells via bit line pairs. Thus, rewriting in read operations, and rewriting in write operations, are performed.

To this end, an address comparator 50 is provided as shown in FIG. 16, and the memory control circuit 14 controls opening and closing of the transfer gate TRG according to the comparison result signal. An enable signal EN is output to this address comparator 50 only during the interval between the initial refresh command REF1 and the next refresh command REF2, and during this interval refresh address RAdd and external addresses EAdd are compared.

Figure 19:
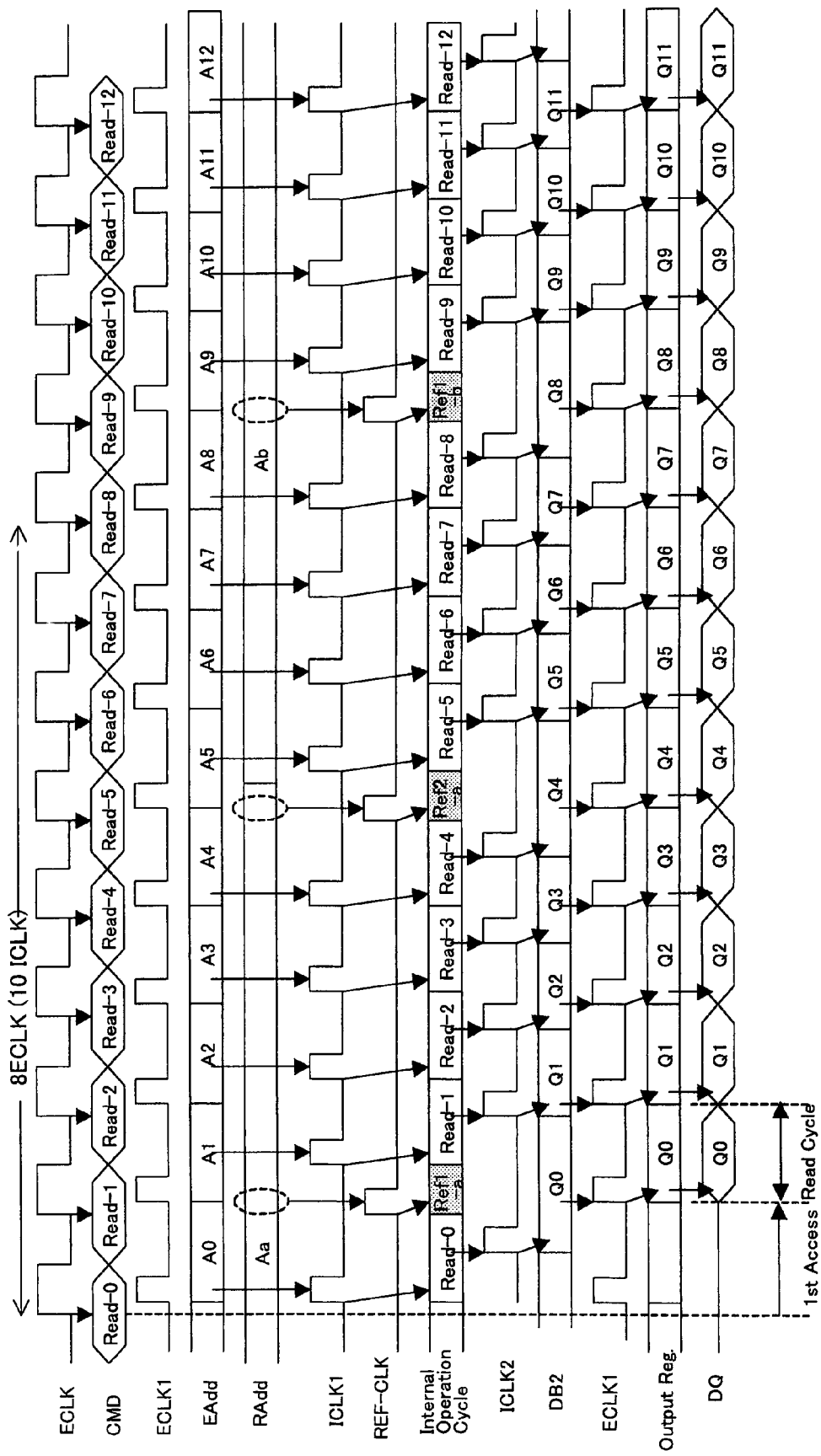
FIG. 19 is an operation timing chart for the third embodiment.

FIG. 19 is an operation timing chart for the third embodiment. Ten internal operation cycles are generated for eight external operation cycles. on the second and the seventh internal cycles, the refresh operation cycles divided into two, Ref1a and Ref2a, are executed. Hence, refresh operation cycles are executed after every four normal internal operation cycles to execute external commands. Moreover, because refresh operations are divided into two cycles, individual refresh operation cycles end in approximately half the time of a normal internal operation cycle. As a result, the access time for a read command Read 0 is shortened compared with FIG. 11. This is because the time of the refresh operation cycle Ref1a following the internal operation cycle Read 0 is short, so that even if output data Q0 from the internal operation cycle Read 0 and output data Q1 from the following internal operation cycle Read 1 are made continuous, the output data Q0 need not be delayed so much.

As shown in FIG. 19, for eight external clock cycles ECLK, eight internal clock cycles ICLK1 controlling execution of external commands and two refresh clock cycles REF CLK are generated. Thus, ten internal operation cycles are generated.

Figure 20:
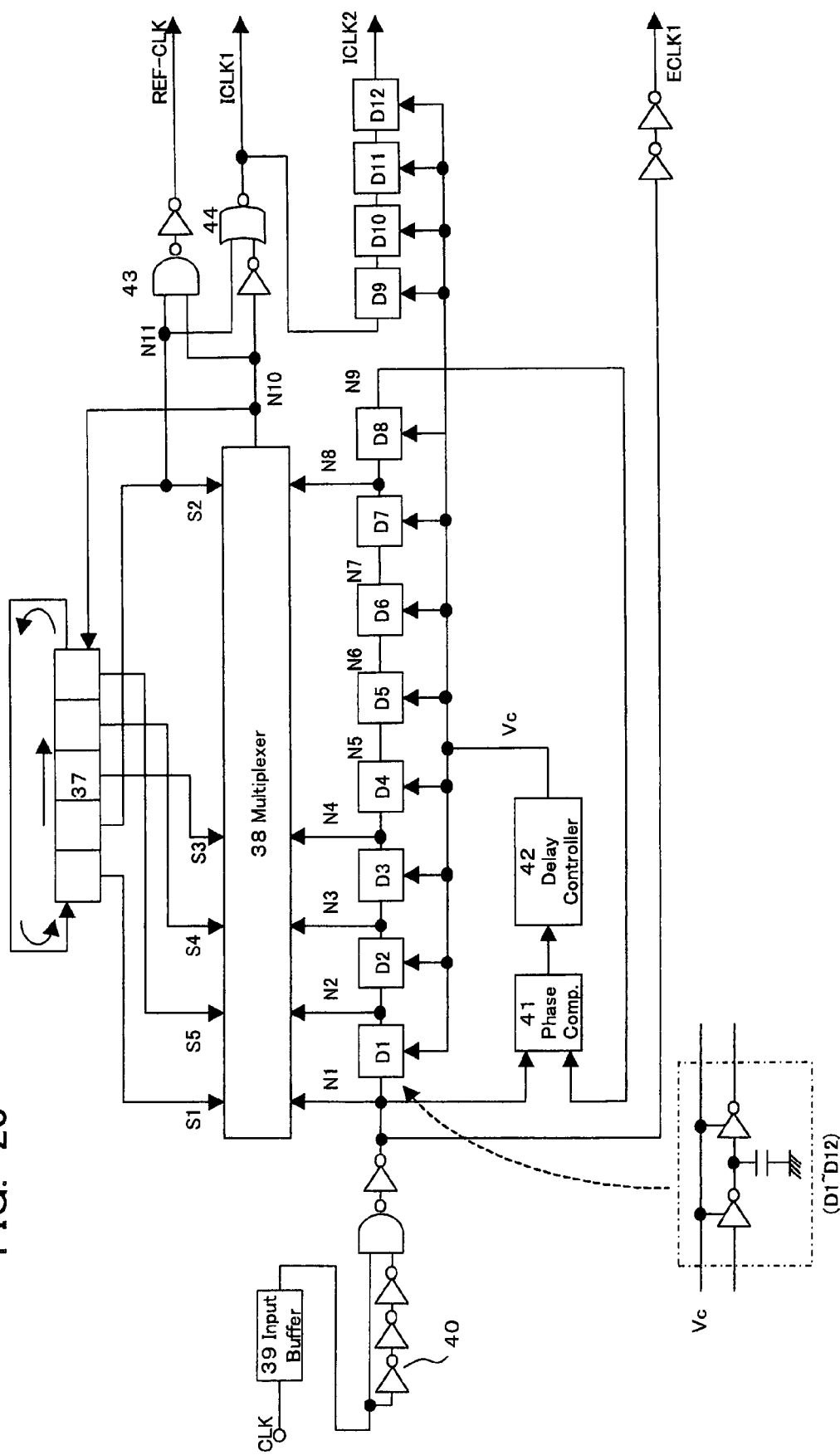
FIG. 20 is a drawing showing the clock generation circuit applied to the third embodiment.
Figure 21:
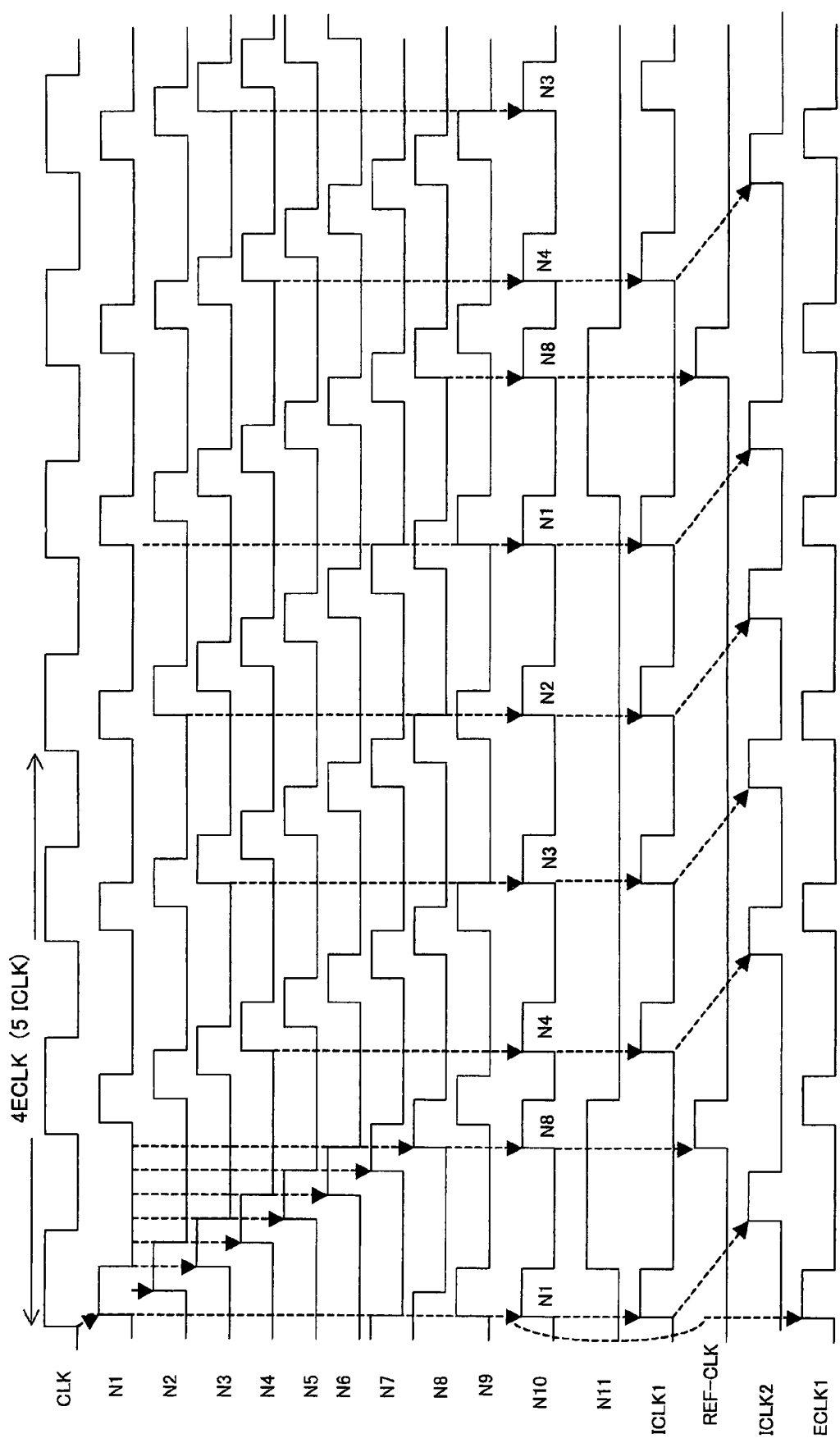
FIG. 21 is an operation timing chart for the clock generation circuit.

FIG. 20 is a drawing showing the clock generation circuit 35 applied to the third aspect. The same reference numbers as in FIG. 13 are assigned. FIG. 21 is the operation timing chart thereof. In contrast with the clock generation circuit of FIG. 13, in the clock generation circuit of FIG. 20, the shift register 37 has a five stage configuration. Select signals S1, S5, S4, S3, S2 generated by the shift register 37 are applied to the multiplexer 38, and N1, N8, N4, N3, N2 are selected in that order as the internal clock signal N10. Hence, for four external clock cycles ECLK, five internal clock cycles N10 are generated.

The internal clock cycle N10 with the timing of the clock signal N8 is selected by the NAND gate 43, and the refresh clock signal REF CLK is generated. The internal clock cycle N10 with the timing of the clock signal N8 is removed by the NOR gate 44, and an internal clock signal ICLK1 to begin internal operation cycles is generated. The internal clock signal ICLK1 is delayed by the delay elements D9 to D12, to become another internal clock signal ICLK2. In FIG. 20, the circuit, which generates the output latch clock signal ICLK3, is omitted.

Figure 22:
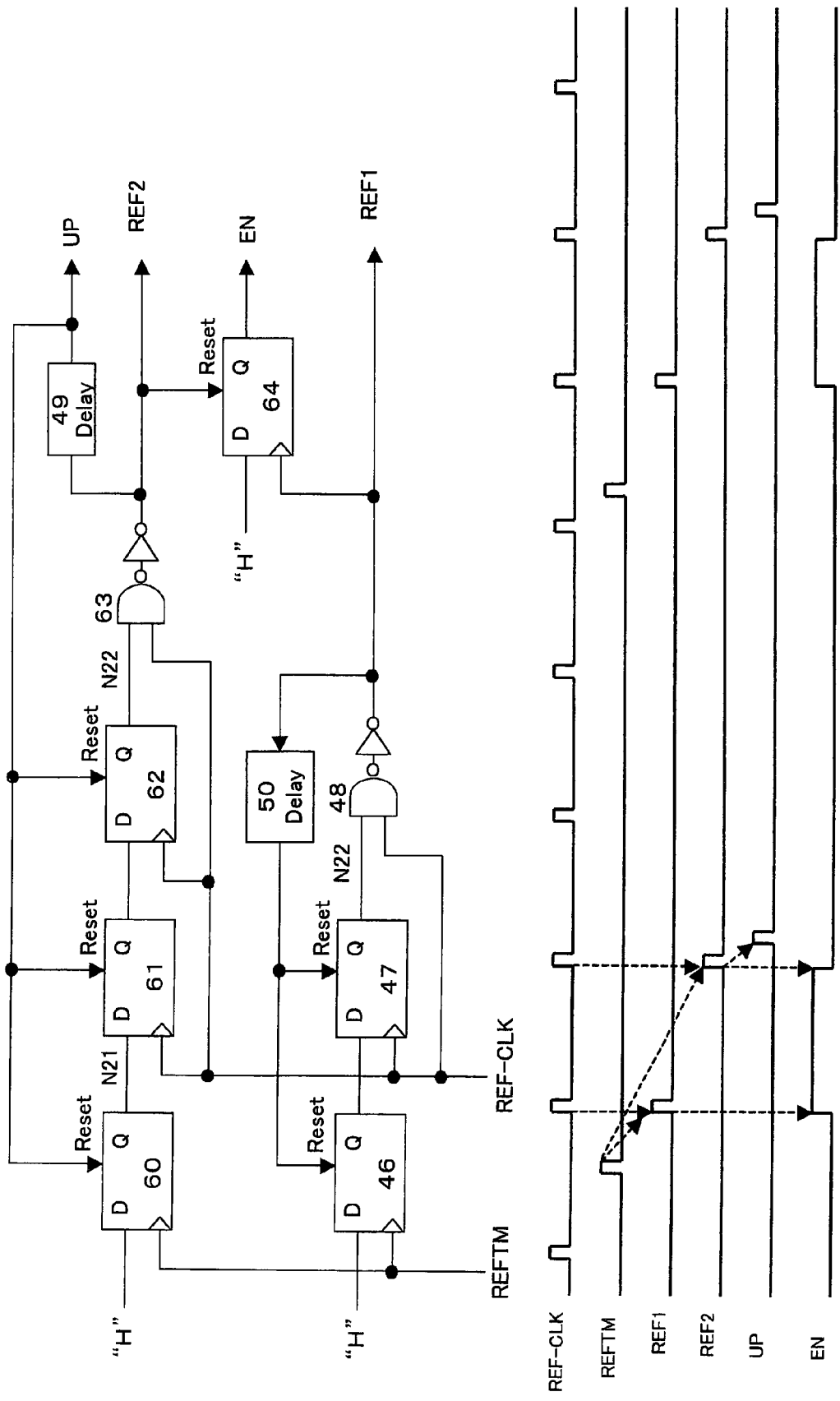
FIG. 22 is a drawing showing the refresh command generation circuit applied to the third embodiment, and 5 the operation timing chart thereof.

FIG. 22 is a drawing showing the refresh command generation circuit applied to the third embodiment, and the operation timing chart thereof. Compared with the refresh command generation circuit applied to the second embodiment shown in FIG. 15, the refresh command generation circuit of FIG. 22 has flip flops 60, 61, 62 and a NAND gate 63 added. Hence, by means of the flip-flops 46, 47 and NAND gate 48, after a refresh timer signal REFTM is generated, the first refresh command REF1 is generated in sync with the next refresh clock cycle REF CLK. And, through the use of the flip flops 60, 61, 62 and NAND gate 63, after the refresh timer signal REFTM is generated, the second refresh command REF2 is generated in sync with the second refresh clock cycle REF CLK. And, through the use of the refresh flip flop 64, in the interval after the first refresh command REF1 is generated and until the second refresh command REF2 is generated, a comparator enable signal EN is generated. After the second refresh command REF2 is generated, a count up signal up is generated via the delay circuit 49.

In the second embodiment shown in FIG. 10 and the third embodiment shown in FIG. 16, the clock enable signal CKE is supplied from outside. This clock enable signal CKE is a signal that indicates the normal operation state and power down state. That is, when the clock enable signal CKE is at H level, the state is the normal operation state (active state), and when at L level, the state is the power down state. In the power down state, the clock generation circuit 35 stops generation of the different clock signals. As a result, the command, address, and data input/output circuits, to which the external clock signal CLK1 is supplied, stop input and output of external signals. Further, the memory control circuit 14 also stops operations corresponding to external commands.

FIG. 23 is a drawing showing the refresh command generation circuit in the power down state and the operation timing chart thereof. Compared with the refresh command generation circuit of FIG. 15, NAND gates 66, 67 are added, and a clock enable signal CKE is supplied.

As shown in the timing chart, in the normal operation state in which the clock enable signal CKE is at H level, similar to FIG. 15, after the refresh timer signal REFTM is generated, a refresh command REF is generated in sync with the refresh clock signal REF CLK. On the other hand, in the power down state in which the clock enable signal CKE is at L level, when a refresh timer signal REFTM is generated a refresh command REF is generated. This is because in the power down state, no refresh clock signal REF CLK is generated.

Fourth Embodiment of the Invention

In the second and third embodiments, external operation cycles and external clock cycles are the same. However, integrated circuit devices and memory circuits which are mounted in a system synchronized with a fast clock signal must perform internal operations in response to a high speed external clock which has cycles shorter by a factor of two or more than internal operation cycles. In these cases, external operation cycles are of lengths adjusted to the internal operation cycles of the integrated circuit device or memory circuit.

The fourth embodiment is a memory circuit applied to a case in which, for example, the external operation cycle is 20 ns, whereas the external clock cycle is 10 ns. That is, this memory circuit is capable of operating at an external operation cycle with frequency of 50 MHz, and moreover can be mounted in a system with a clock cycle with frequency of 100 MHz. In such a case, a system operating with a fast clock is constrained to an interval of two clock cycles or more between command inputs, in coordination with the operation cycles of the memory circuit. Hence, even the fastest command input is limited to input of external commands in sync with every other external clock cycle. External commands are permitted to be input in sync with either odd numbered external clock edges or even numbered external clock edges. As a result, when, after an external command is supplied at an odd-numbered clock edge, the next external command is supplied at an even numbered clock edge, two external clock cycles must be inserted therebetween.

Figure 24:
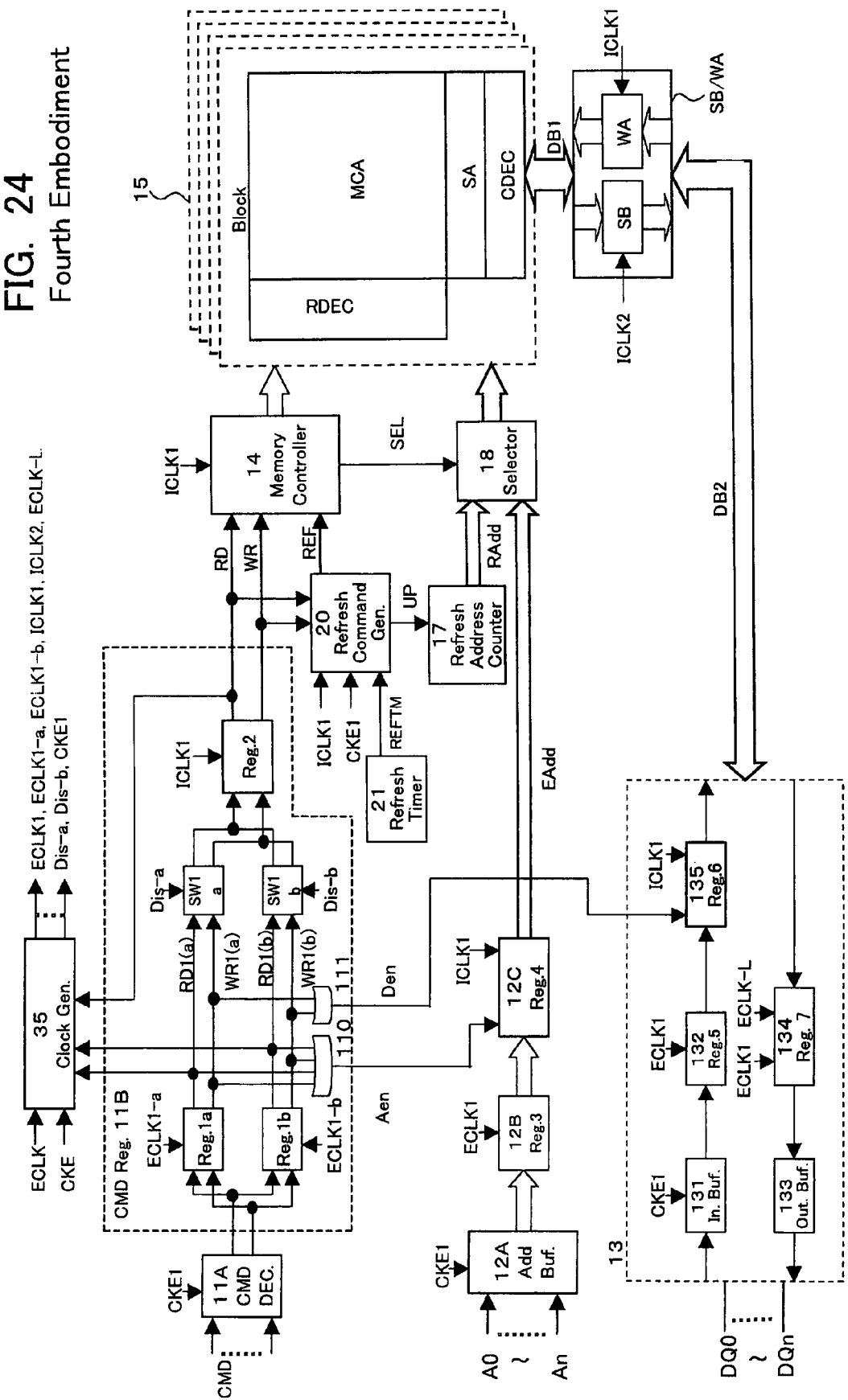
FIG. 24 is a drawing showing the memory circuit of a fourth embodiment of this invention.
Figure 25:
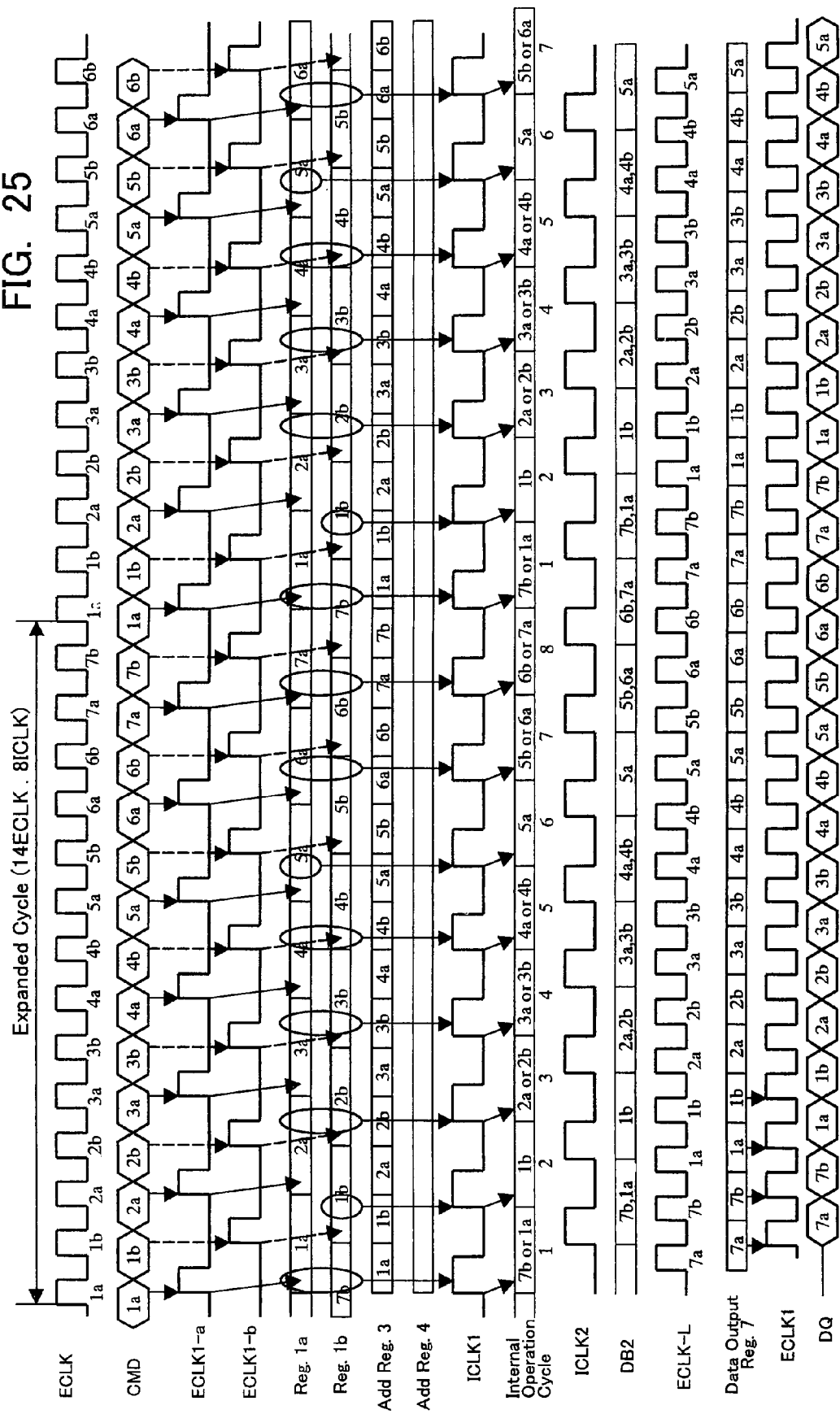
FIG. 25 is an operation timing chart of the fourth embodiment.
Figure 26:
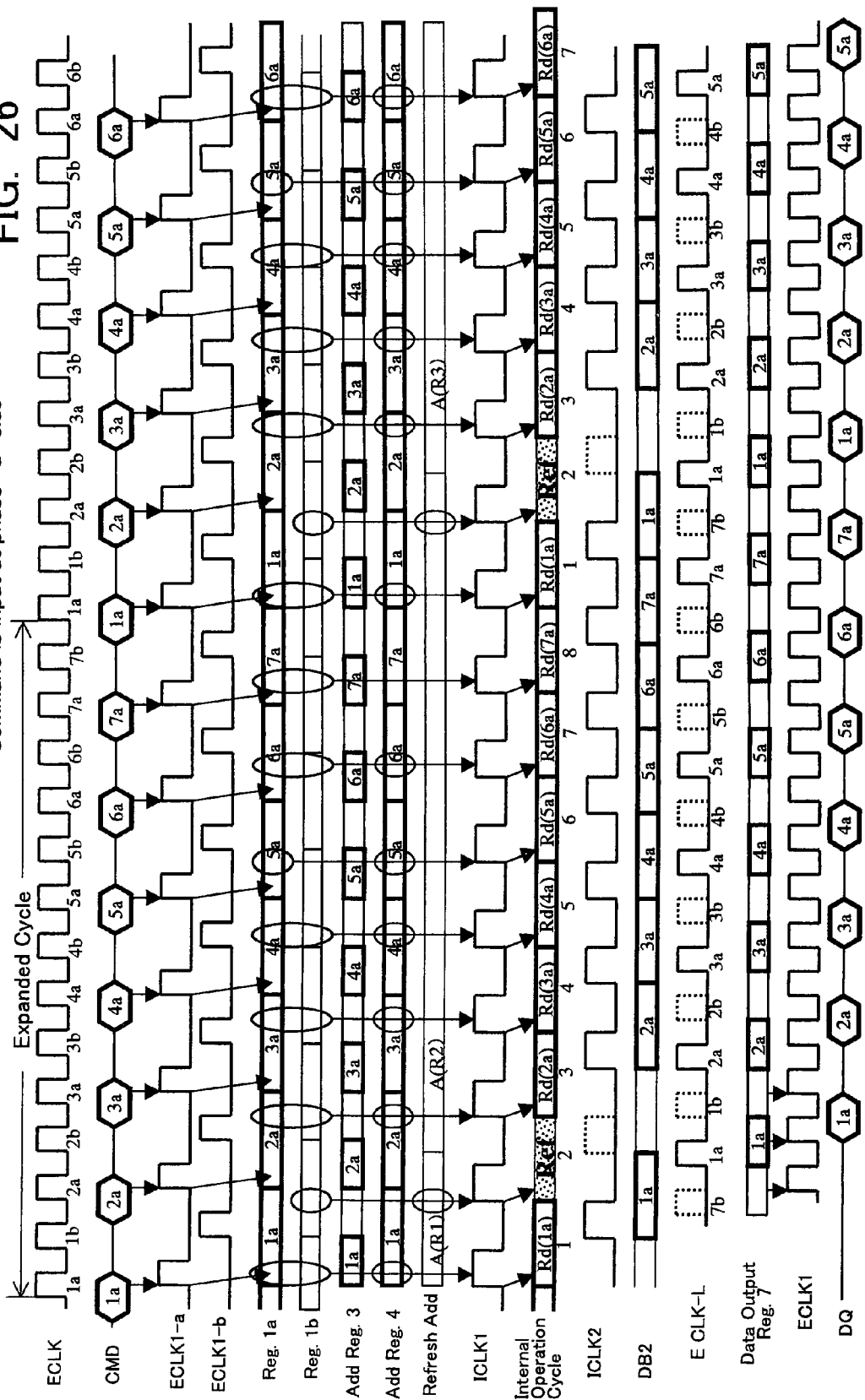
FIG. 26 is an operation timing chart of the fourth embodiment.
Figure 27:
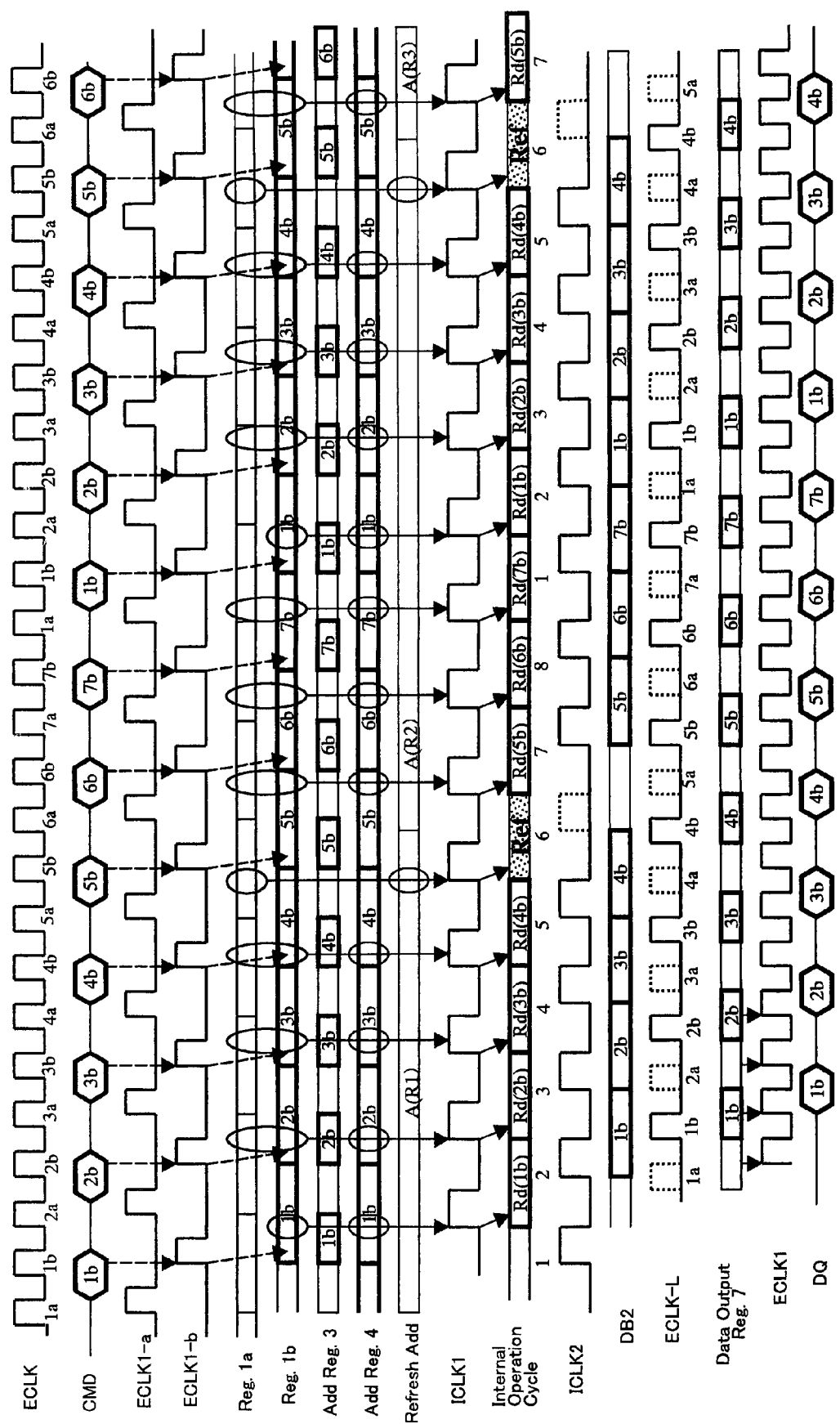
FIG. 27 is an operation timing chart of the fourth embodiment.
Figure 28:
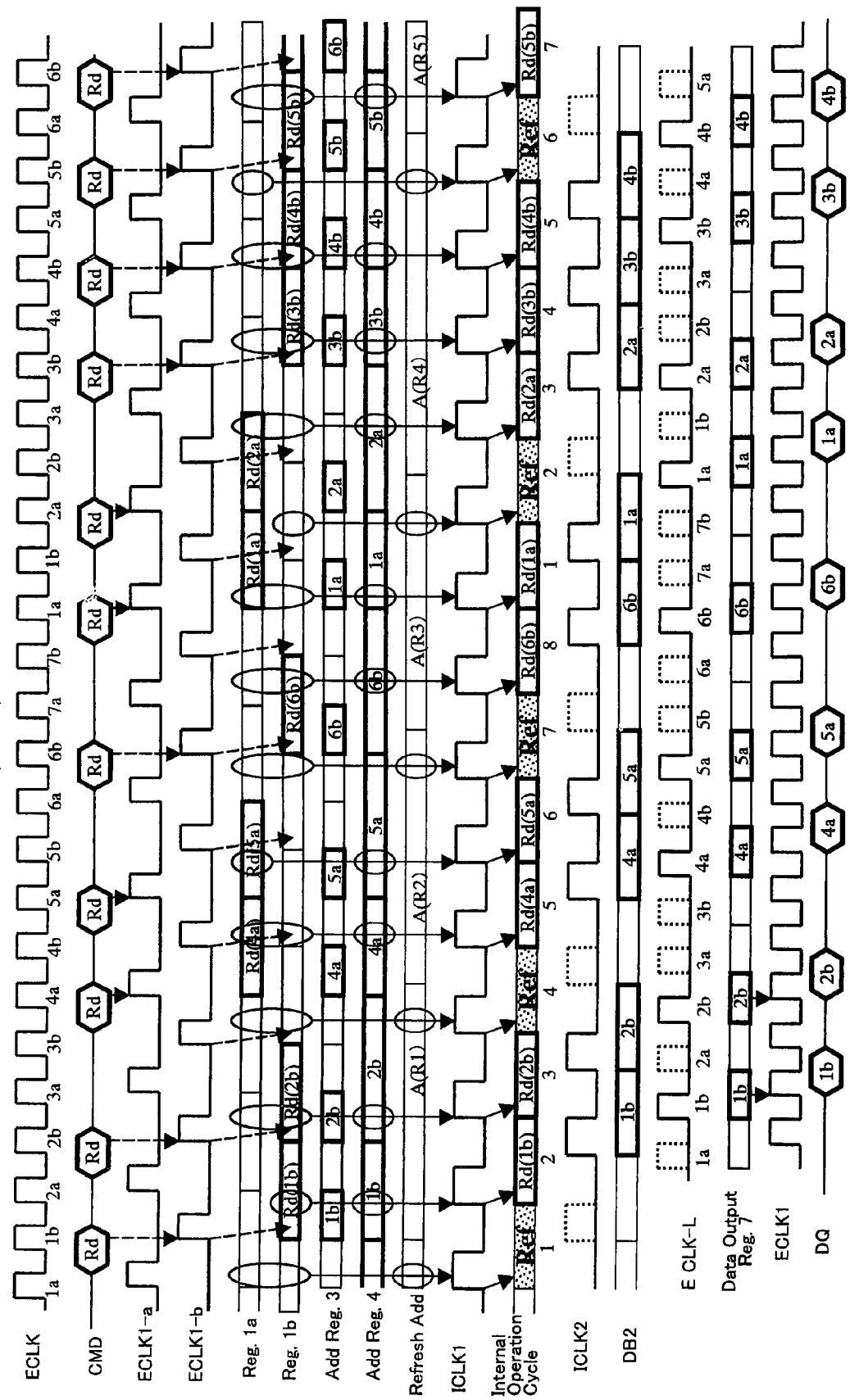
FIG. 28 is an operation timing chart of the fourth embodiment.

FIG. 24 is a drawing showing the memory circuit of the fourth embodiment of this invention. FIGS. 25 to 28 are operation timing charts of the fourth embodiment. FIG. 25 shows basic operation; FIG. 26 shows operation when an external command is input on the phase "a" side of the external clock signal ECLK; FIG. 27 shows operation when an external command is input on the phase "b" side of the external clock signal ECLK; and FIG. 28 shows operation when external commands are input randomly on both the phase "a" and "b" sides of the external clock signal ECLK.

Thus, in the fourth embodiment, there exist two types of phase relation between external operation cycles and internal operation cycles. That is, there are the two types shown in FIGS. 26 and 27. Hence, when, as shown in FIG. 26, an external command is input on the phase "a" side, of the eight internal operation cycles generated within the expanded cycle consisting of seven external operation cycles, the second internal operation cycle is allocated to refresh operations. On the other hand, when as shown in FIG. 27 an external command is input on the phase "b" side, of the eight internal operation cycles, the sixth internal operation cycle is allocated to refresh operations. And when, as shown in FIG. 28, external commands are input randomly, the internal operation cycle used for refresh operations cannot be specified in advance. Hence, in the fourth embodiment, the cycle used for refresh operations is determined according to the state of input of external commands. Specifically, the refresh command generation circuit 20 assumes a state which permits generation of refresh commands according to the state of input of external commands in sync with two consecutive external clock cycles.

Further, on the memory circuit side it is not possible to predirt with which phase an external command will be supplied, and so the command decoder 11A which inputs external commands must input external commands at both phases "a" and "b", in sync with the external clock signal, and must hold internal commands. Hence, as shown in FIG. 24, the command register 11B has a register 1a to hold internal commands for external commands input with external clock phase "a", and a register 1b to hold internal commands with phase "b". These registers 1a, 1b hold commands in sync with the clocks ECLK1-a, ECLK1-b, which are the external clock ECLK divided by two.

The internal commands in these first stage registers 1a, 1b are held in the later stage register 2 via the switches SW1a, SW1b in sync with the internal clock signal ICLK1. As in the above described embodiments, the internal clock signal ICLK1 has a frequency 8/7 times the external operation cycle (⅞ the cycle length). The later stage register 2 has, for example, an OR logic input, and holds the internal command held by one of the previous stage registers 1a, 1b. If an internal command is not held by the previous stage registers 1a, 1b, the later stage register 2 does not hold an internal command.

The command register 11B is configured in this way; as described in the command registers 1a, 1b of FIG. 25, in each internal operation cycle the switches SW1, SW2 are simultaneously made conducting, and the internal commands of both the initial stage registers 1a, 1b are simultaneously transferred to the later stage register 2. An external command is input at one of the two phases "a", "b", so that one of the internal commands RD, WR is transferred to the later stage register 2 and is executed by the control circuit 14.

Of the eight internal operation cycles in the expanded cycle, in the second internal operation cycle the contents of the initial stage register 1b alone are transferred to the later stage register 2. Similarly, in the sixth internal operation cycle, the contents of the initial stage register 1a alone are transferred. When the later stage register 2 holds some internal command, RD or WR, the refresh command generation circuit 20 stops generation of refresh commands; if neither of the internal commands RD, WR is held generation of refresh commands is permitted.

The meaning of the above operations is as follows. In the second internal operation cycle, only the initial-stage register 1b is monitored, and so if an external command is not input on the external clock signal 1b, this cycle is allocated as a refresh operation cycle Ref. This operation is shown in FIG. 26. In the sixth internal operation cycle, only the initial stage register 1a is monitored, and so if an external command is not input on the external clock signal 5a, this cycle is allocated as a refresh operation cycle Ref. This operation is shown in FIG. 27.

Even if a cycle is a normal internal operation cycle, if external commands are not input continuously at both the phases "a", "b" of the external clock ECLK, the later-stage register 2 does not hold an internal command, and so the cycle is allocated as a refresh operation cycle. This operation is shown in FIG. 28. As in FIG. 28, when external commands are input randomly at both the phases "a", "b" of the external clock, an interval of two external clock cycles is required between the external commands, and so more internal operation cycles become refresh operation cycles.

In this way, internal operation cycles are allocated as refresh operation cycles according to the state of input of external commands. When a refresh timer signal REFTM is generated, the refresh command generation circuit 20 generates a refresh command in a refresh operation cycle.

As shown in FIGS. 26, 27 and 28, eight internal clock cycles ICLK1 are generated for every seven external operation cycles (one external operation cycle is equivalent to two external clock cycles ECLK). The second internal clock signal ICLK2 controlling output of read data to the data bus DB2 lags behind the first internal clock signal ICLK1, and is generated by excluding the clock at the time of refresh operation cycles. The output latch clock ECLK L is generated by adding a prescribed lag to one of the external clock signals ECLK, according to whether the external command input is at phase "a" or "b". Hence, the output latch clock ECLK L is in sync with the external clock. In FIG. 26, the output latch clock ECLK L is generated by delaying the external clock ECLK with phase "a"; in FIG. 27, it is generated by delaying the external clock ECLK with phase "b". In FIG. 28, delayed external clock signals with both phases are intermixed.

Returning to FIG. 24, when an internal command is held in either of the initial stage registers 1a, 1b, an external address is input from the address register 12C. When a write command WR is held in either of the initial-stage registers 1a, 1b, write data is input from the data register 135. In either case, this means that an external address and write data are input in sync with the 5 effective external clock.

Figure 29:
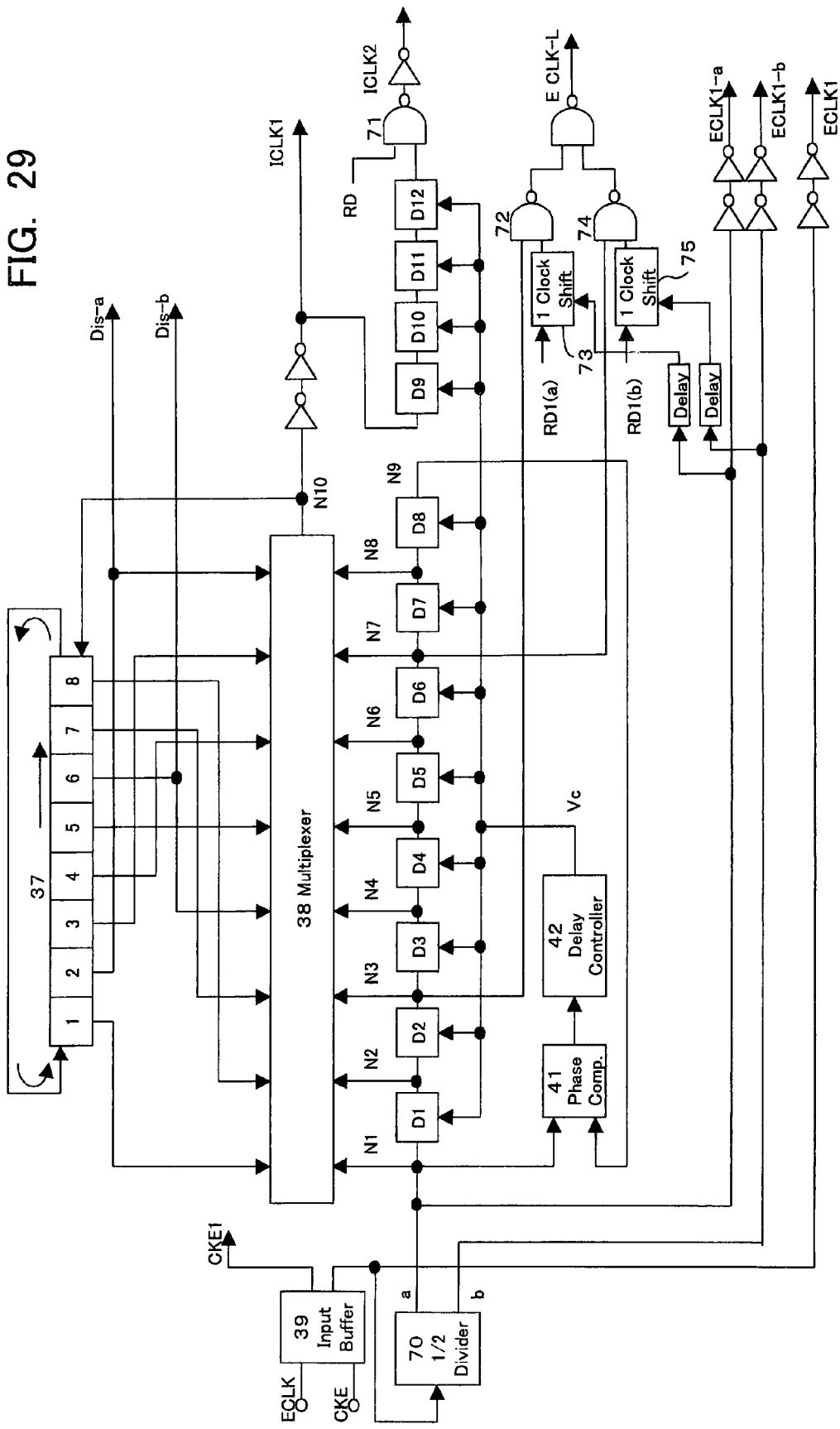
FIG. 29 is a drawing showing the clock generation circuit applied to the fourth embodiment.
Figure 30:
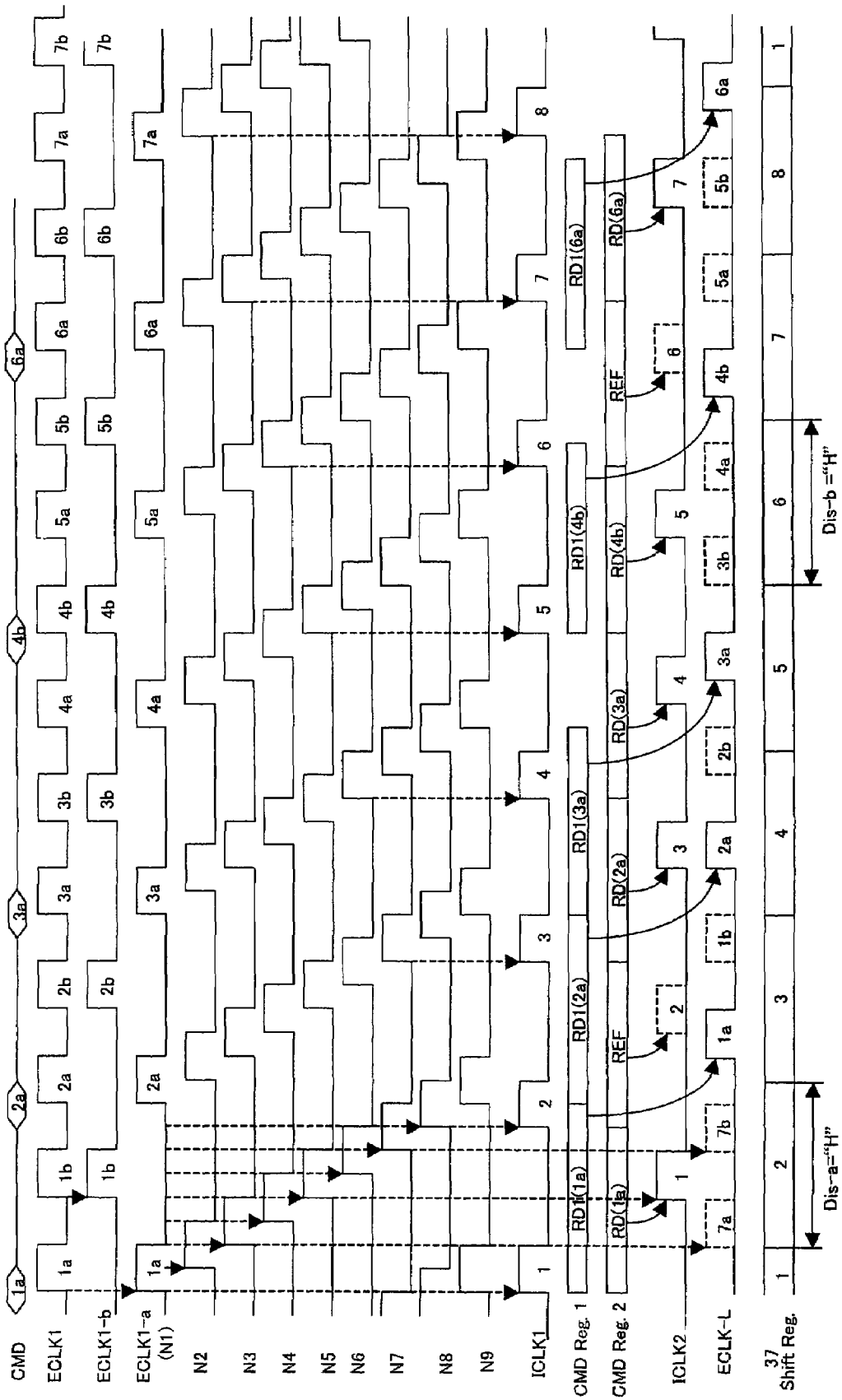
FIG. 30 is an operation timing chart of the clock generation circuit of FIG. 29.

FIG. 29 is a drawing showing the clock generation circuit applied to the fourth embodiment. FIG. 30 is the operation timing chart thereof. Similarly to the clock generation circuit of FIG. 13, an eight stage shift register 37, a multiplexer 38, a phase comparison circuit 41, a delay control circuit 42, and a DLL circuit consisting of variable delay elements D1 through D8 are provided. Differences from the example of FIG. 13 include the fact that initial stage register control clock signals ECLK1a, 1b are generated by the frequency divider 70 from the external clock signal ECLK; the fact that when a read command RD is generated, a second internal clock signal ICLK2 is generated by the NAND gate 71; and, the fact that when read commands RD1(*a*), RD1(*b*) are generated in the output of the initial stage command register, the output latch clock ECLK L is generated delayed by the timing of the frequency divided external clock. Also, switch signals Dis a, b are generated with the timing of the shift register stages 2, 6.

The operation timing chart of FIG. 30 shows the case in which external commands are input at external clock ECLK1 cycles 1a, 2a, 3a, 4b, 6a. Here, the internal operation cycles 2 and 6 are refresh operation cycles. A second internal clock signal ICLK2 is generated in response to the read command RD, and an output latch clock ECLK L is generated. When a read command RD does not occur, the second internal clock signal ICLK2, controlling output of read data from the memory core, is not generated. The output latch clock ECLK L is generated according to the presence or absence of a read command RD1 in the command register 1, delayed from the frequency divided external clock signals ECLK1a, 1b.

Figure 31:
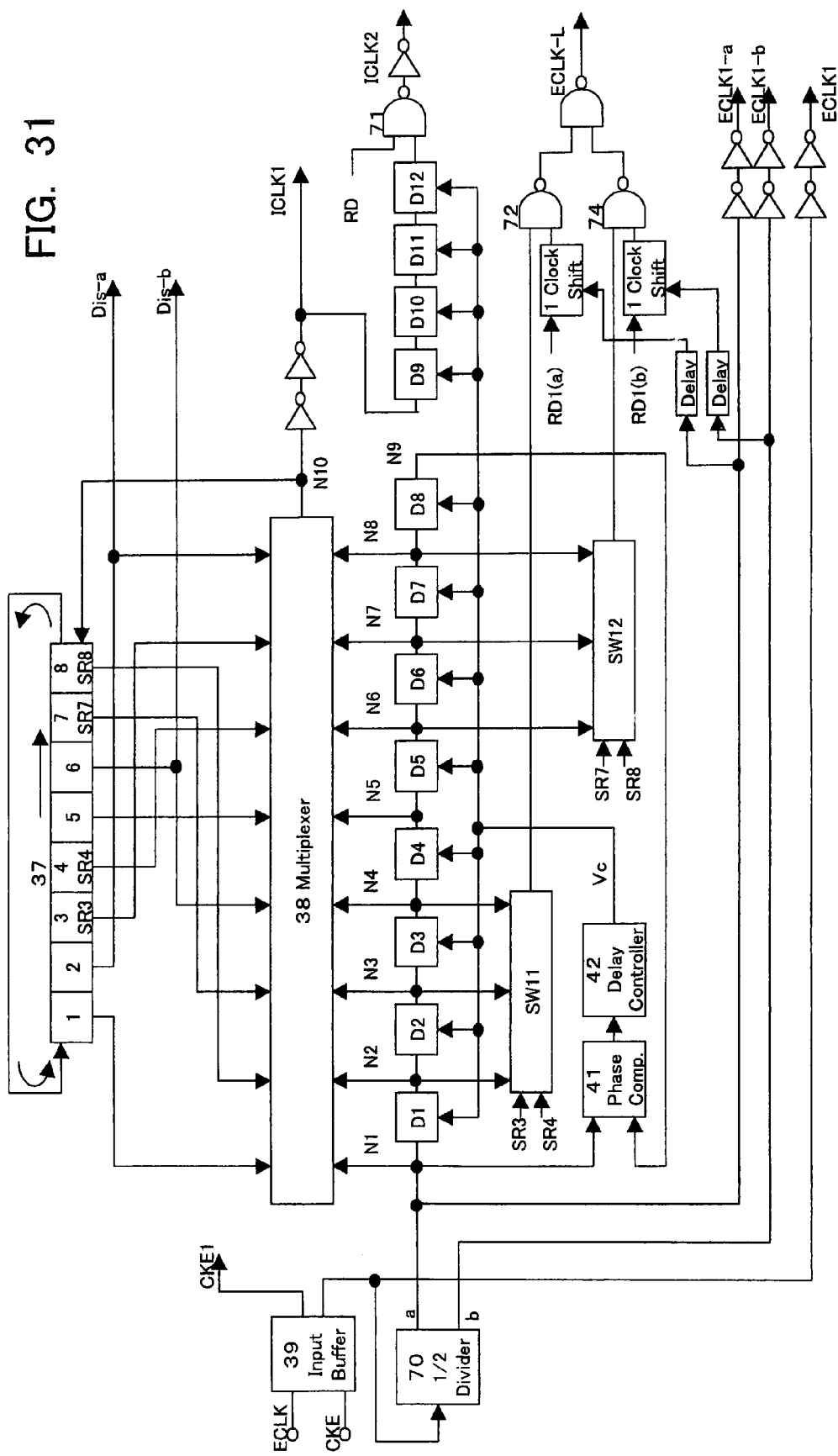
FIG. 31 is another clock generation circuit applied to the fourth embodiment.

FIG. 31 shows another clock generation circuit. Compared with the clock generation circuit shown in FIG. 29, this clock generation circuit adds switches SW11, SW12; switch SW11 selects one of the clocks N2, 3, 4, 5 according to the select signals SR3, 4 of shift register 37, and switch SW12 selects one of the clock signals N6, 7, 8 according to the select signals SR7, 8.

Figure 32:
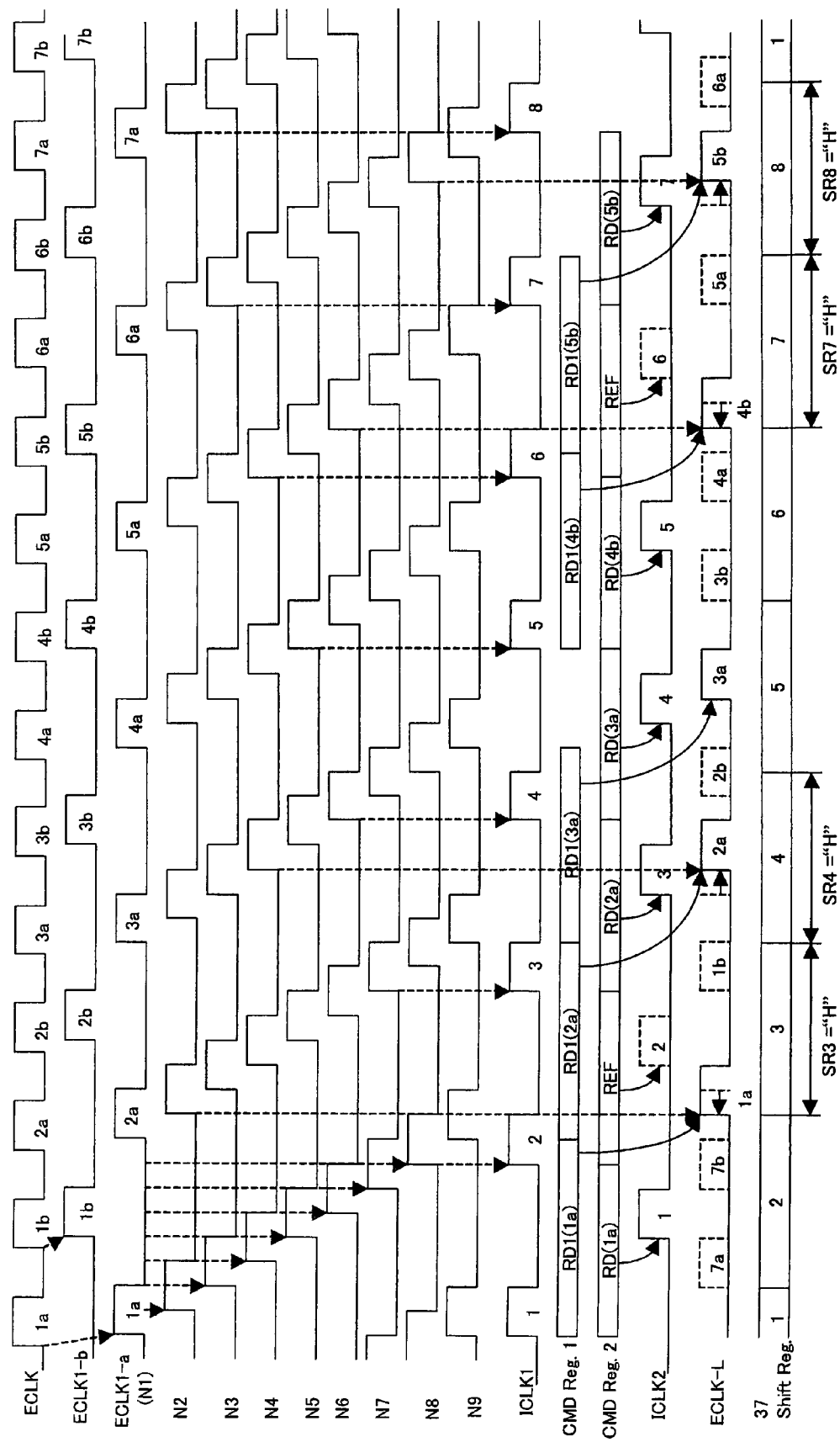
FIG. 32 is an operation timing chart of the clock generation circuit of FIG. 31.

FIG. 32 is an operation timing chart of the clock generation circuit of FIG. 31. As shown in FIGS. 31 and 32, the switch SW11 selects the clock N2 when the select signal SR3 of the shift register 37 is H, selects clock N4 when the select signal SR4=H, and otherwise selects clock N3. As a result, the phase of the output latch clock ECLK L(1*a*) advances slightly, and the internal clocks ICLK2(1), ECLK L(1*a*), and ICLK2(2) are generated without overlap, as shown in FIG. 32. Similarly, the phase of the output latch clock ECLK L(2*a*) lags slightly, and is generated after generation of the internal clock ICLK2(3). Thus, read data is output from the memory core to the data bus DB2, and the operating margin for latching by the output register 134 can be increased. The configuration and operation of switch SW12 are similar. That is, the switch SW12 selects clock N6 when SR7=H, selects clock N8 when SR8=H, and otherwise selects clock N7.

FIG. 33 is a drawing showing a refresh command generation circuit applied to the fourth embodiment, and operation thereof. This configuration differs from the refresh command generation circuit shown in FIG. 23 in that the refresh clock REF CLK is generated in response to an internal read command RD and write command WR. That is, the internal clock signal ICLK1 controlling the start of internal operation cycles passes through a small delay circuit 82 before being supplied to the NAND gate 81. If the internal operation commands RD, WR are output from the later stage command register 2, generation of the refresh clock REF CLK is prohibited by the NOR gate 80. On the other hand, if the internal operation commands RD, WR are output from the later stage command register 2, generation of the refresh clock REF CLK is permitted by the NOR gate 80.

Hence, when in the normal operation state (CKE=H), after the refresh timer signal REFTM is generated, if the refresh clock REF CLK is generated, then the refresh command REF is generated, and the count up signal UP is generated. On the other hand, in power down mode (CKE=L), if the refresh timer signal REFTM is generated, the refresh command REF is generated immediately.

As explained above, by combining the command register 11B of FIG. 24 and the refresh command generation circuit of FIG. 33, generation of internal refresh commands REF is permitted according to the state of input of external commands.

Figure 34:
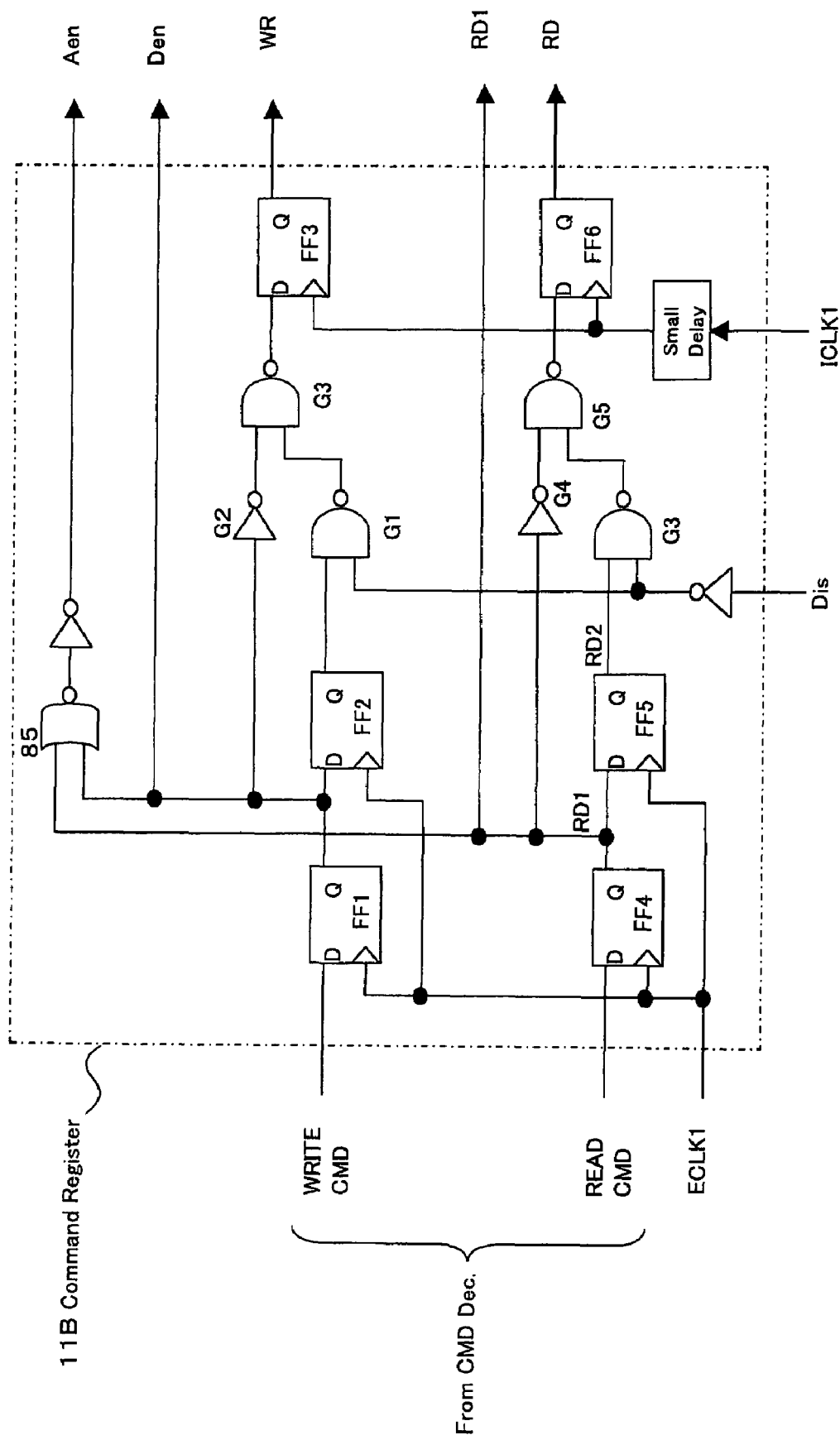
FIG. 34 is a drawing showing another command register circuit in the fourth embodiment.

FIG. 34 is a drawing showing another command register circuit applied to the fourth embodiment. The command register 11B shown in FIG. 24 is provided with two initial stage command registers in parallel, corresponding to the phases "a", "b" of the external clock ECLK. In the circuit example of FIG. 34, command registers are provided in series (FF1, FF2 and FF4, FF5) to hold internal commands in sync with both phases of the external clock signal ECLK1, and gates G1, G3 are provided in place of the switches SW1*a*, 1*b*. Respective flip flops FF3, FF6 correspond to the later stage command registers.

In the command register circuit of FIG. 34, the most recent write command and read command decoded and generated by the command decoder 11A are latched by the flip flops FF1, FF4 respectively, in sync with the clock signal ECLK1 (not frequency divided) generated in sync with the external clock. Commands latched in sync with the previous external clock cycle ECLK1 are latched by the flip flops FF2, FF5 in sync with the frequency divided internal clock ICLK1. And, in accordance with the select signal Dis generated by the clock generation circuit 35, either the logical product of the write command of the flip flops FF1, FF2 (Dis=L), or the write command of the previous stage flip flop FF1 (Dis=H), is held by the later stage flip flop FF3, by means of the OR circuit consisting of the gates G1, G2, G3. The read command side is similarly configured. The address capture signal Aen is generated by the logical product 85 of the internal read command RD1 and internal write command WR1, and the data capture signal Den is generated by the internal write command WR1.

Figure 35:
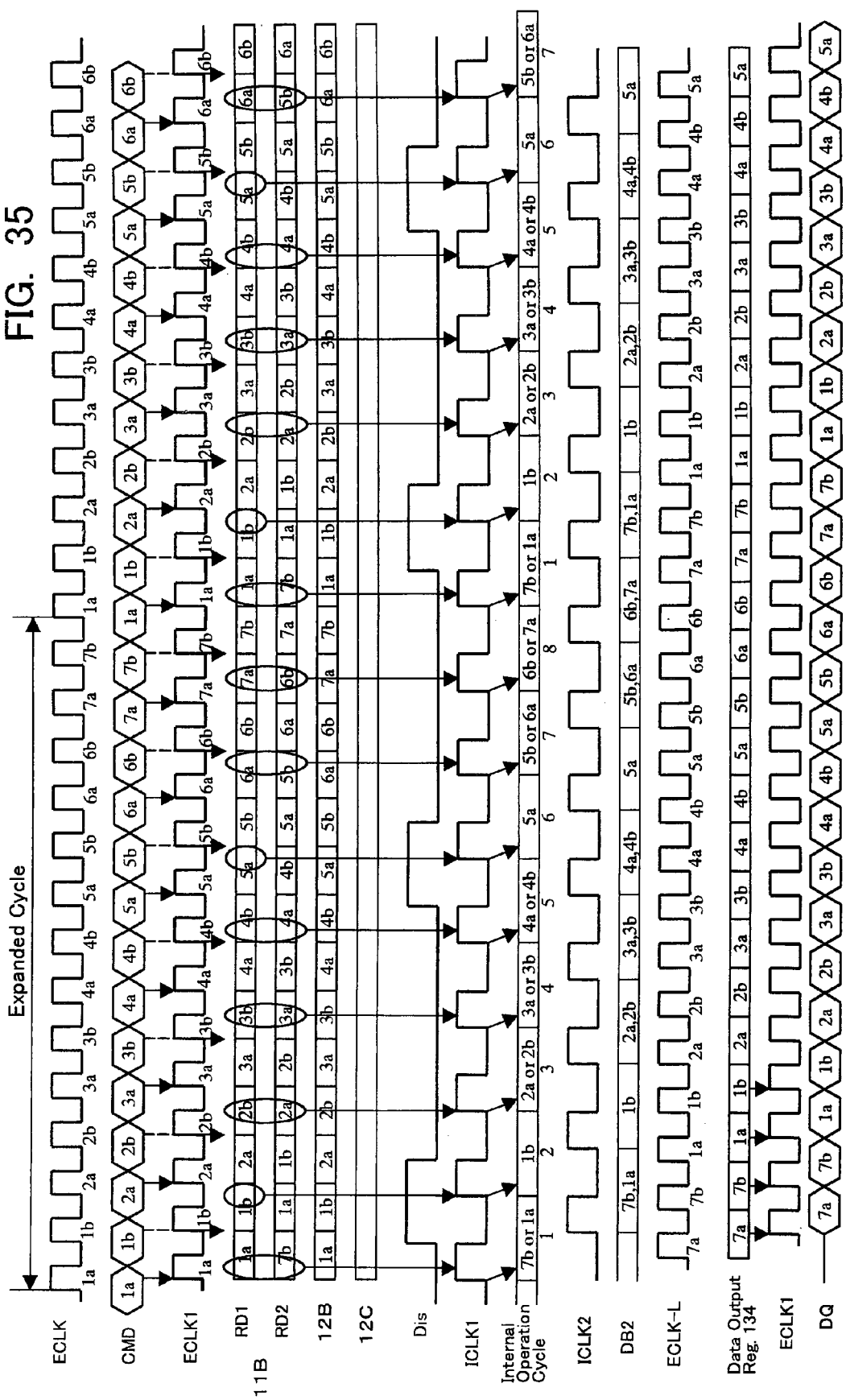
FIG. 35 is an operation timing chart of the memory circuit for the case in which the command register circuit of FIG. 34 is used.
Figure 36:
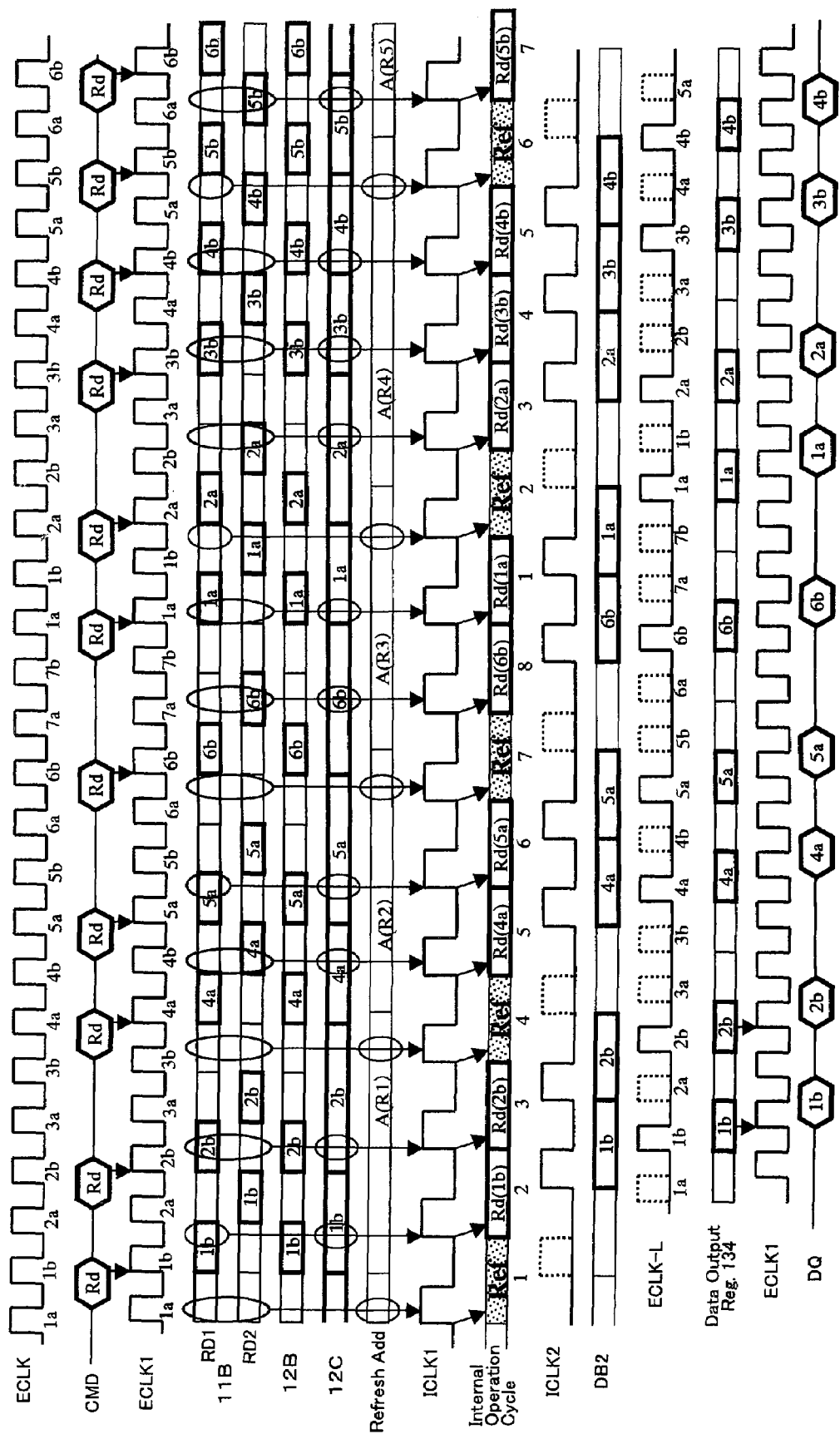
FIG. 36 is an operation timing chart of the memory circuit for the case in which the command register circuit of FIG. 34 is used.

FIGS. 35 and 36 are operation timing charts of the memory circuit for the case in which the command register circuit of FIG. 34 is used. FIG. 35 shows basic operation, while FIG. 36 shows operation for the case in which, as in FIG. 28, external commands are supplied randomly at clock phases "a" and "b".

In the command register circuit of FIG. 34, the first stage register has a series rather than a parallel configuration. Hence, as shown in FIG. 35, read commands latched in sync with continuous external clock cycles ECLK1 are arranged in the flip flops FF4, FF5. As a result, the cases in which the read commands RD1, RD2 are in the order phase "a", phase "b", and cases in which they are in the order phase "b", phase "a", occur in alternation. Hence, in FIG. 34, in place of the switches SW1a, 1b, only the commands RD1, WR1 of the initial stage flip flops FF1, 4 are always latched by the later stage flip flops FF3, FF6. That is, the switch signal Dis becomes H level at second and 6th internal operation cycles, the gates G1, G3 do not allow the output of flip flop FF2, FF5 to transfer to FF3, FF6. Through this configuration, as shown in FIG. 35, in the second internal operation cycle, the command on the phase 1b side is held in the later stage flip flop FF6, and, in the sixth internal operation cycle, the command on the phase 5a side is held in the later stage. That is, the operation is effectively the same as that of FIG. 25.

In the case of random input of external commands in FIG. 36, effective internal commands are held within bold frames, and the internal operation cycles 1, 4, 7 are allocated as refresh operation cycles. When external commands are input consecutively at the external clock phase "a", the internal operation cycle 2 is allocated as a refresh operation cycle, as in FIG. 26; when external commands are input consecutively on the external clock phase "b", the internal operation cycle 6 is allocated as a refresh operation cycle, as in FIG. 27. If, during the allocated refresh operation cycle, a refresh timer signal REFTM is generated, the refresh command REF is generated, and the refresh operation is performed.

Figure 37:
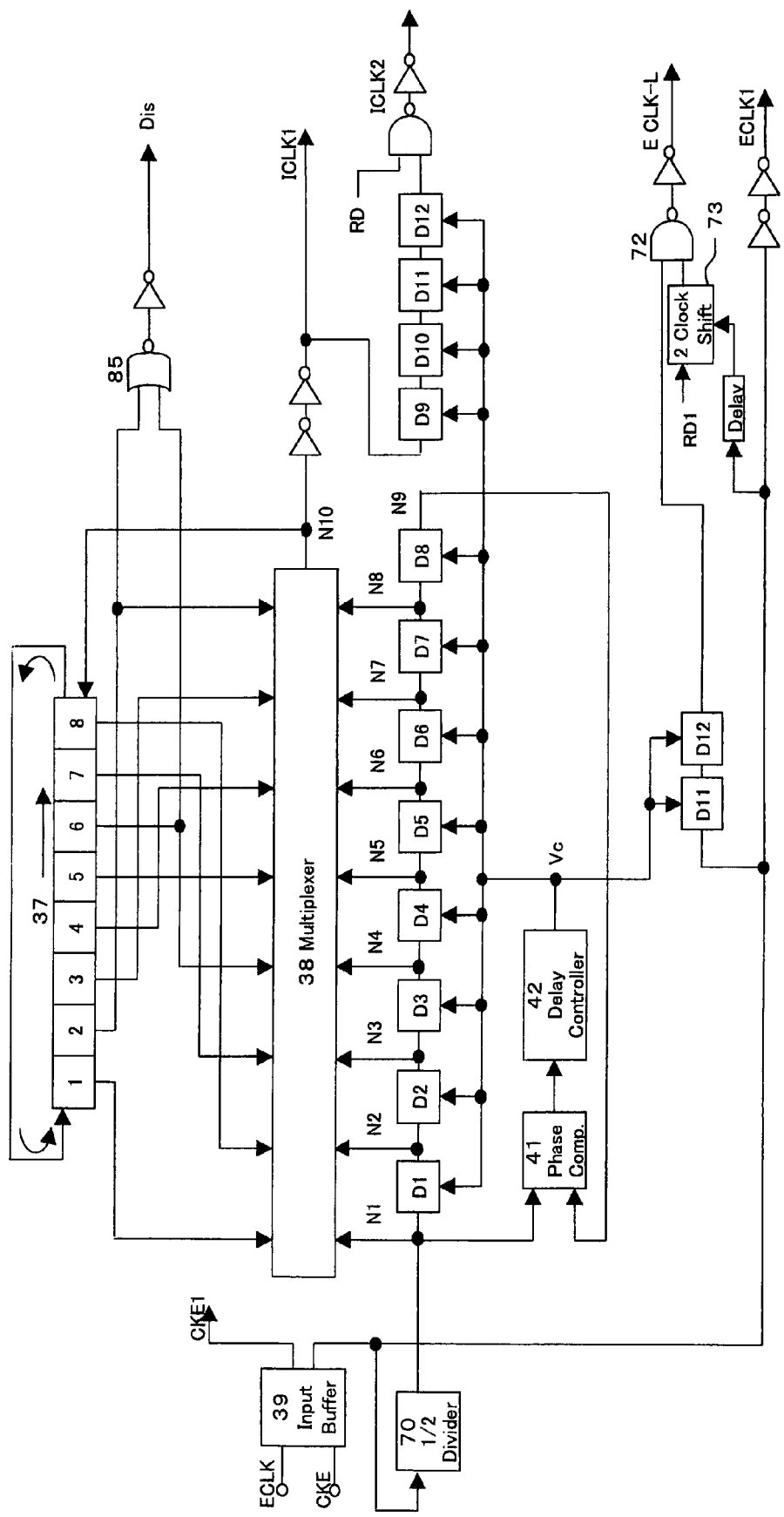
FIG. 37 is a drawing of a clock generation circuit for the case in which the command register of FIG. 34 is used.
Figure 38:
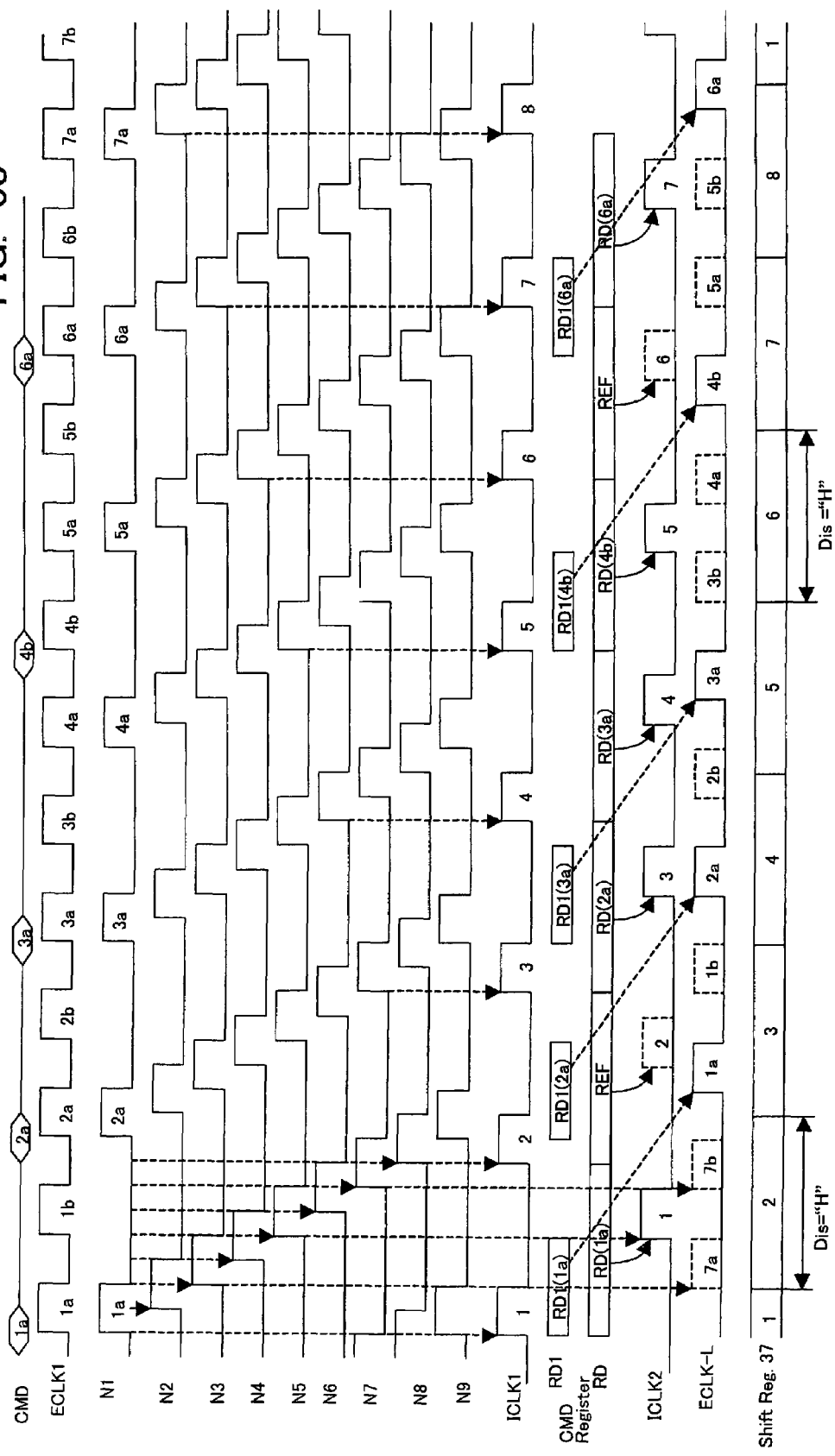
FIG. 38 is an operation timing chart for the clock generation circuit of FIG. 37.

FIG. 37 is a drawing of a clock generation circuit for the case in which the command register of FIG. 34 is used. FIG. 38 is the operation timing chart thereof. Compared with the example of FIG. 29, the clock generation circuit of FIG. 37 differs in that the select signal Dis is generated by the NOR gate 85 and later stage inverter as the logical product of the timing of the second and sixth cycles of the shift register 37, and in that, when a read command RD1 is generated, the output latch clock ECLK L is generated by delaying the output clock ECLK1. By employing a series circuit configuration for the command register of FIG. 34, the circuit to generate the output latch clock ECLK L can be simplified. This can also be applied to the output latch clock generation circuit of FIG. 29. As explained before, the switch signal Dis becomes H level at 2nd and 6th internal operation cycle, the command of front stage flip flop FF1, FF4 only transfers to the back stage flip flop FF3, FF6.

Compared with FIG. 30, in the operation timing chart of FIG. 38, there exists no frequency divided clock signals ECLK1a, 1b, and the time to hold the read command RD1 in the initial stage command register is half as long. The combination of external commands in FIG. 38 is the same as in FIG. 30, and so overall operation is the same. That is, during refresh operation cycles REF, the internal clock ICLK2 is not generated, and the output latch clock ECLK L is generated after a fixed delay, according to the read command RD1.

Fifth Embodiment of the Invention

A fifth embodiment of the invention is a memory circuit for the case in which, for external operation cycles, external clock cycles are ⅓, that is, the frequency of the external clock is three times as great as the internal clock. For example, a memory device with an external operation cycle of 30 ns can be mounted in a system with a clock cycle of 10 ns.

Figure 39:
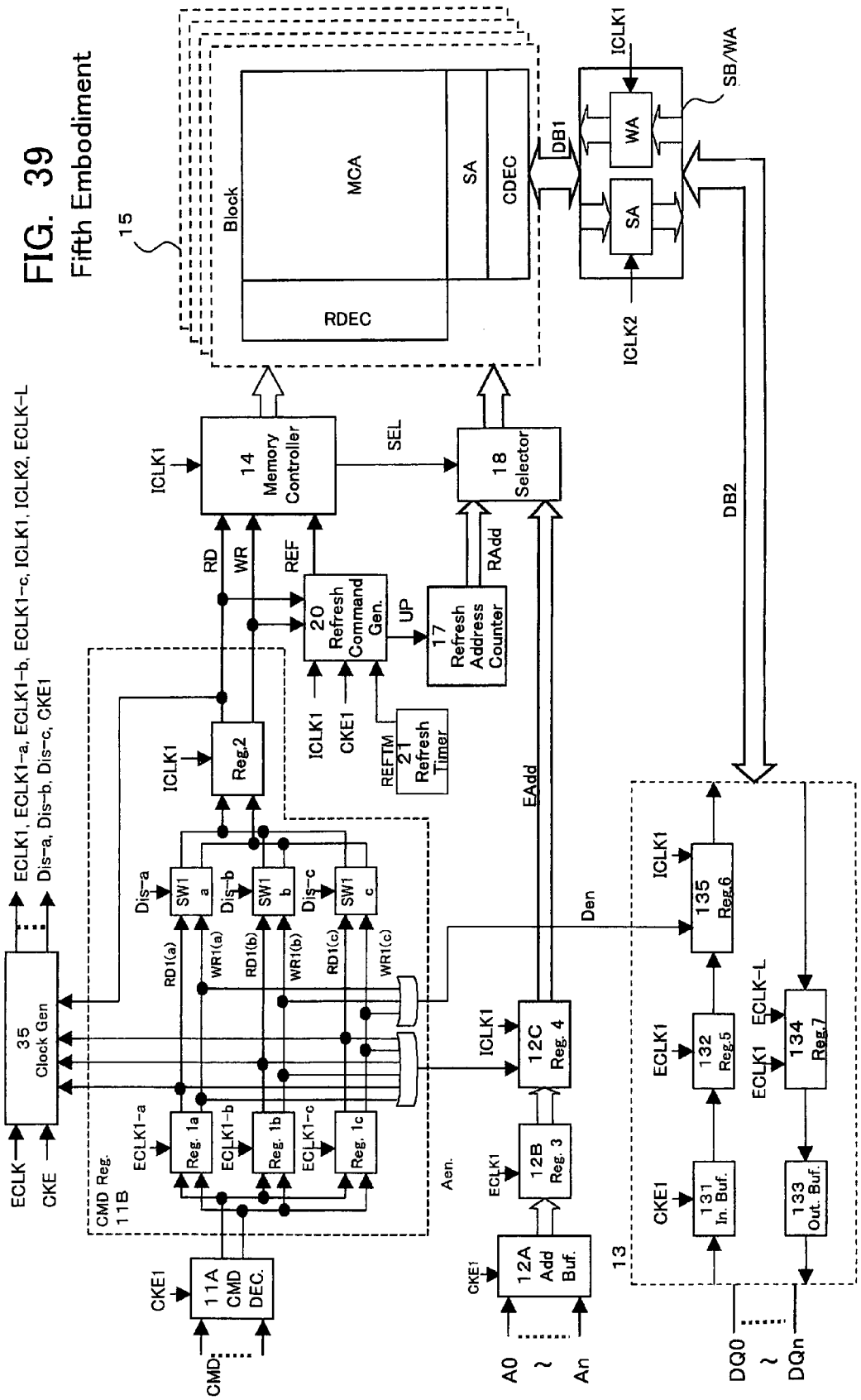
FIG. 39 is a configurational view of the memory circuit of a fifth embodiment of the invention.

FIG. 39 is a configurational diagram of the memory circuit of the fifth embodiment of the invention. Compared with FIG. 24 showing the fourth embodiment, in FIG. 39 the configuration of the command register 11B is different. In FIG. 39, the external clock ECLK has three times the frequency, and so the command register 11B comprises three parallel first stage registers 1a, 1b, 1c, and switches SW1a, 1b, 1c. Consequently, the clock signals ECLK1a, b, c, obtained by ⅓ frequency division of the external clock ECLK, control the timing of the first stage register command capture. Otherwise, the configuration is the same as in FIG. 24.

Figure 40:
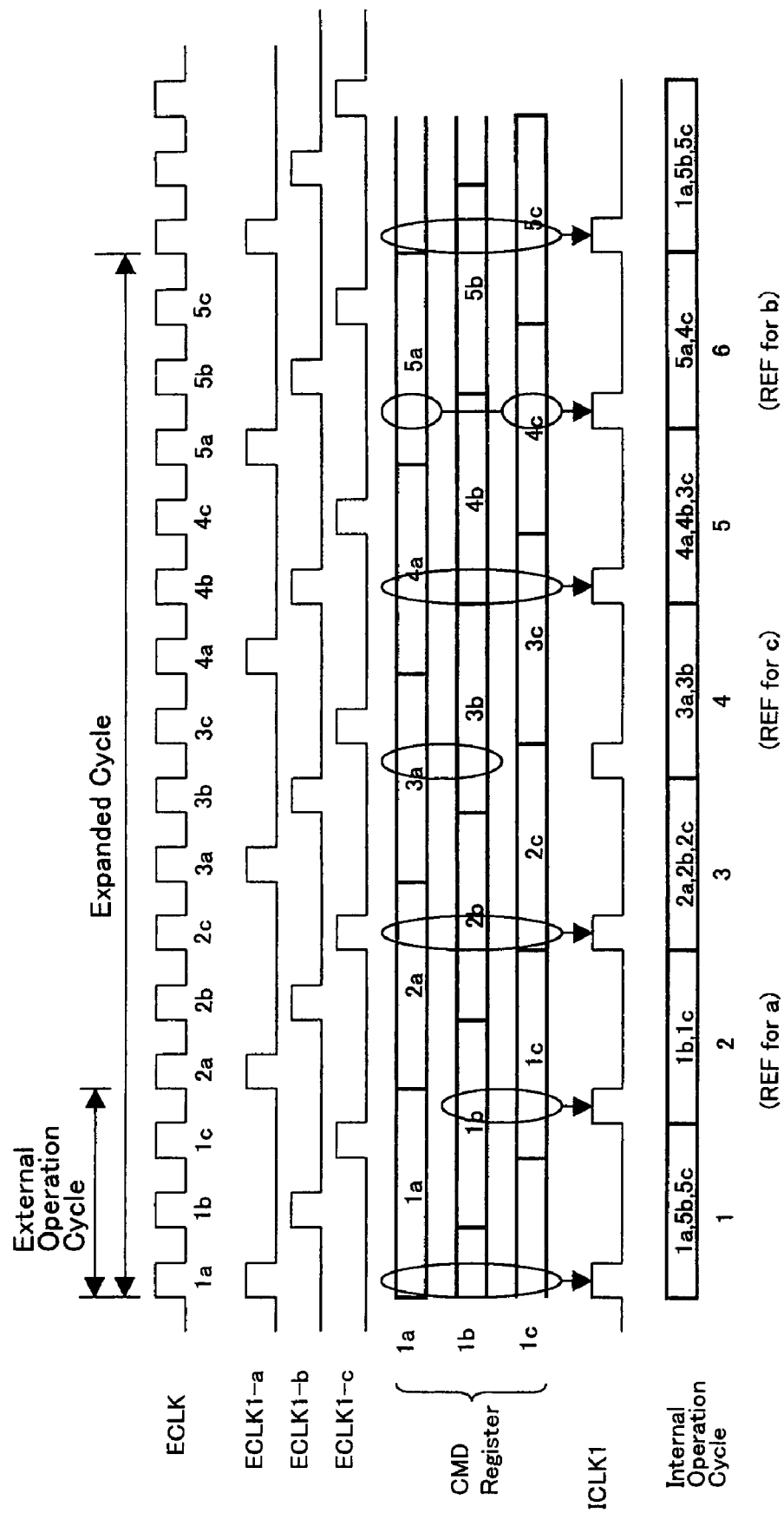
FIG. 40 is a drawing showing the flow of signals in FIG. 39.
Figure 41:
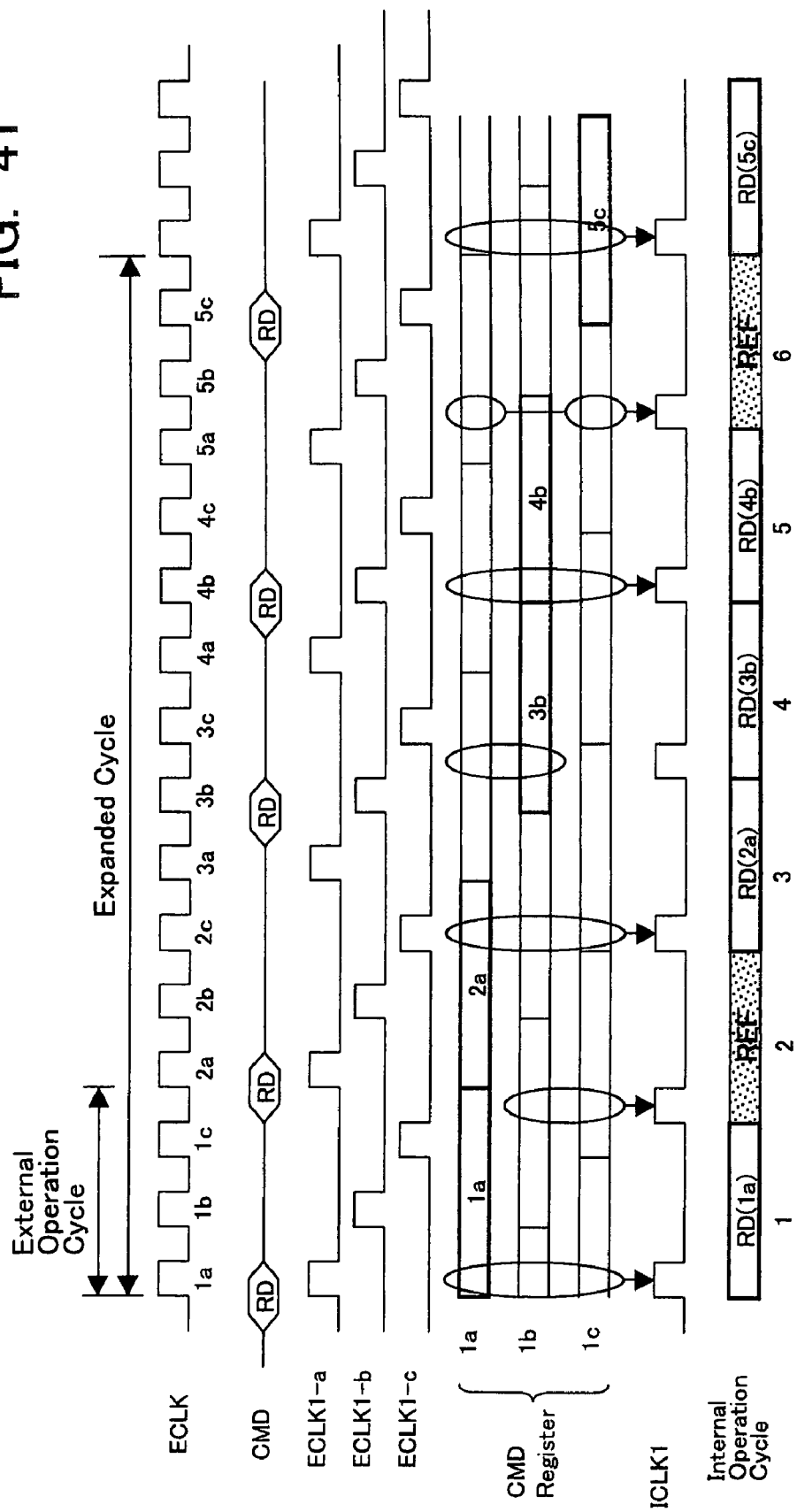
FIG. 41 is an operation timing chart for FIG. 39.

FIG. 40 is a drawing showing the flow of signals in the memory circuit of FIG. 39; FIG. 41 shows operations for the case in which external commands are input randomly with phases "a", "b", "c". Here an expanded cycle consists of five external operation cycles, and within this expanded cycle, six internal operation cycles are generated. Sequential internal commands are held in the first stage registers 1a, 1b, 1c within the command register 1b, according to the three phase clock ECLK1a, b, c obtained by ⅓ frequency division of the external clock ECLK. Via the switches SW1a, 1b, 1c, cycles to transfer to the later stage register 2 the logical sum of all commands with phases "a", "b", "c", and cycles to transfer the logical sum of commands with the sequential phase combinations changed among bc, ca, ab are generated in alternation. Therefore, as shown in FIG. 40, the logical sum of commands at phases "a", "b", "c" is transferred at the internal cycles 1, 3, 5, and the logical sum of commands at either phase bc, ab, ca is transferred at the internal cycle 2, 4, 6. It is also possible to consecutively generate a plurality of cycles to transfer all logical sums, but due to space limitations in FIG. 40, the shortest case of a single cycle is shown.

As shown in FIG. 40, in the internal operation cycle 2, the logic sum of commands with phases 1b, 1c is transferred to the later stage register. Hence, when external commands are input in the shortest cycle in sync with phase "a", the second internal operation cycle becomes a refresh operation cycle. Similarly, when external commands are input consecutively in sync with phase "b", the sixth internal operation cycle becomes a refresh cycle. When external commands are input consecutively in sync with phase "c", the fourth internal operation cycle becomes a refresh cycle.

FIG. 41 shows operation for the case in which external commands are input with phases 1a, 2a, 3b, 4b, 5c. Effective internal commands are generated within bold frames in the command register. Hence, the internal operation cycles 2, 6, within which effective commands are not generated in the later stage command register, become refresh operation compatible cycles REF. If the refresh timer signal REFTM is generated with this timing, the refresh command generation circuit 20 generates a refresh command REF.

Figure 42:
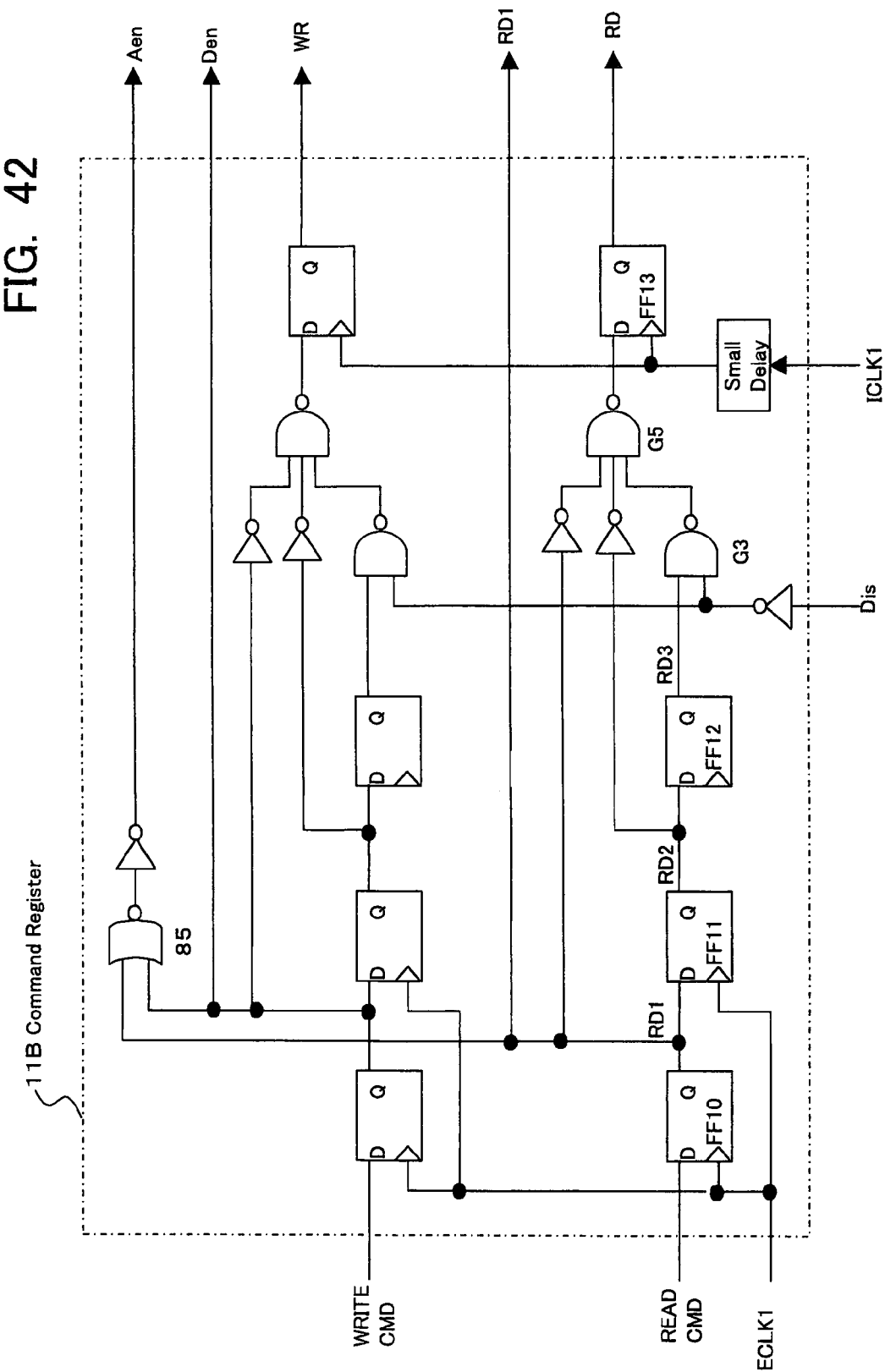
FIG. 42 is a drawing of another command register circuit in the fifth embodiment.

FIG. 42 shows another command register circuit applied to the fifth embodiment. This command register circuit 11B is an example in which the first stage registers are connected in series in three stages, corresponding to the two stage series connection of FIG. 34. In FIG. 42, read commands are latched by the flip flop FF10 in sync with the clock ECLK1, which is synchronized with the external clock ECLK, and are transferred in sequence to the later stage flip flops FF11, FF12. The logical sum of the outputs RD1, RD2, RD3 of these three flip flops passes through the gates G3, G5 and is transferred to the later stage register FF13. When the select signal Dis goes to H level, the output RD3 of the third stage flip flop FF13 is deleted by the gate G3, and the logical sum of the remaining outputs RD1, RD2 is transferred to the later stage register FF13. Configuration and operation are similar on the write command side as well.

Figure 43:
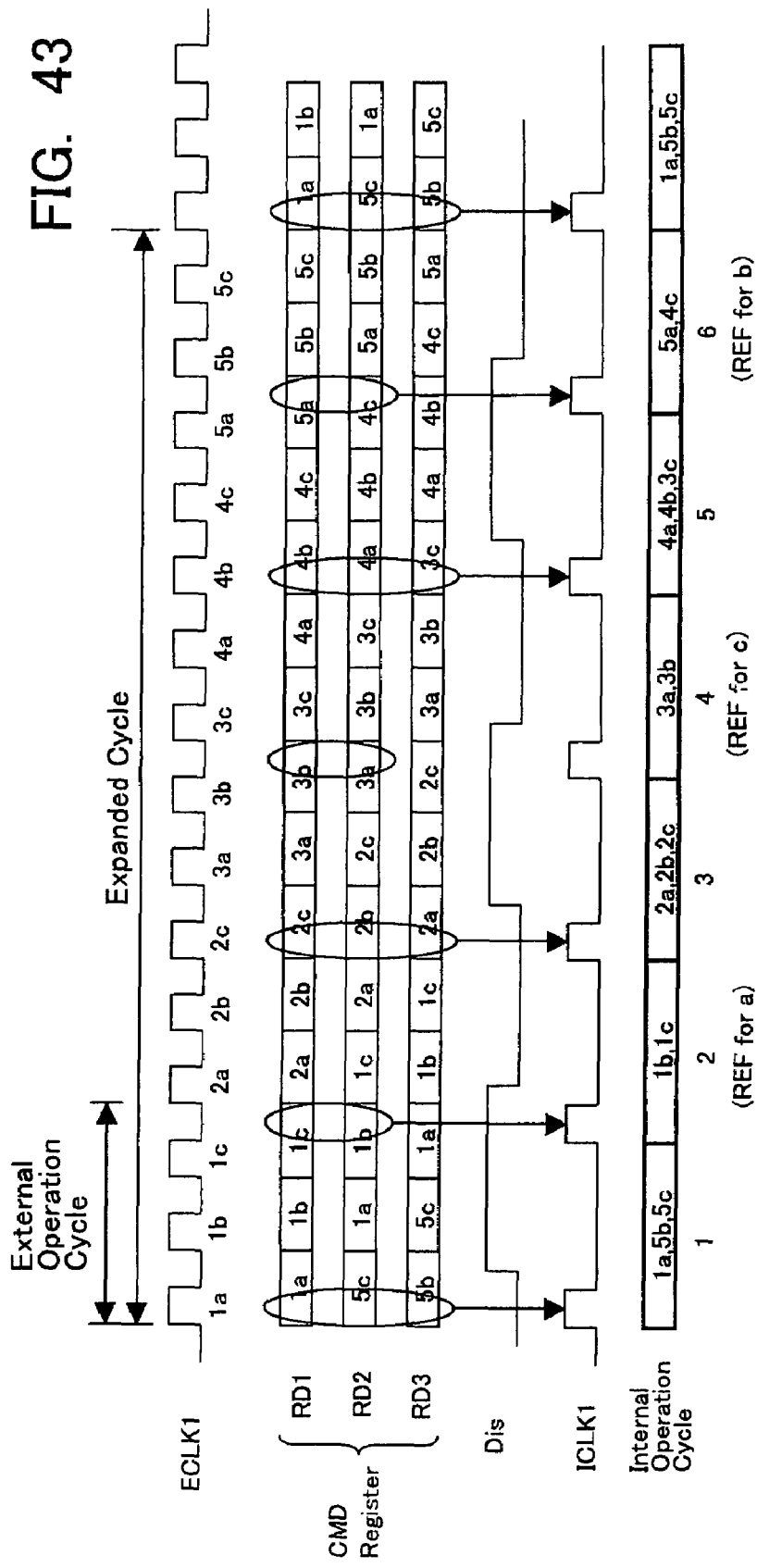
FIG. 43 is a drawing showing the flow of signals in FIG. 42.

FIG. 43 is a drawing showing the flow of signals in FIG. 42. Compared with FIG. 40, the time for which the commands RD1, 2, 3 are held in each of the command registers is shorter, and shifting in order is performed in sync with the external clock ECLK1. Otherwise, operation is the same. In the case of FIG. 43, the commands RD1, 2, 3 are shifted in order, and so by selecting the phase of the select signal Dis, the commands RD1, RD2 correspond to the external commands at phases cb, ba, ac, therefore the command register of FIG. 42 corresponds to the command register circuit shown in FIG. 42 which takes the logical sum of the two commands RD1, 2 among the three commands RD1, 2, 3. In this case also, the internal operation cycle 2 becomes a refresh operation cycle when external commands are input consecutively with phase "a".

Figure 44:
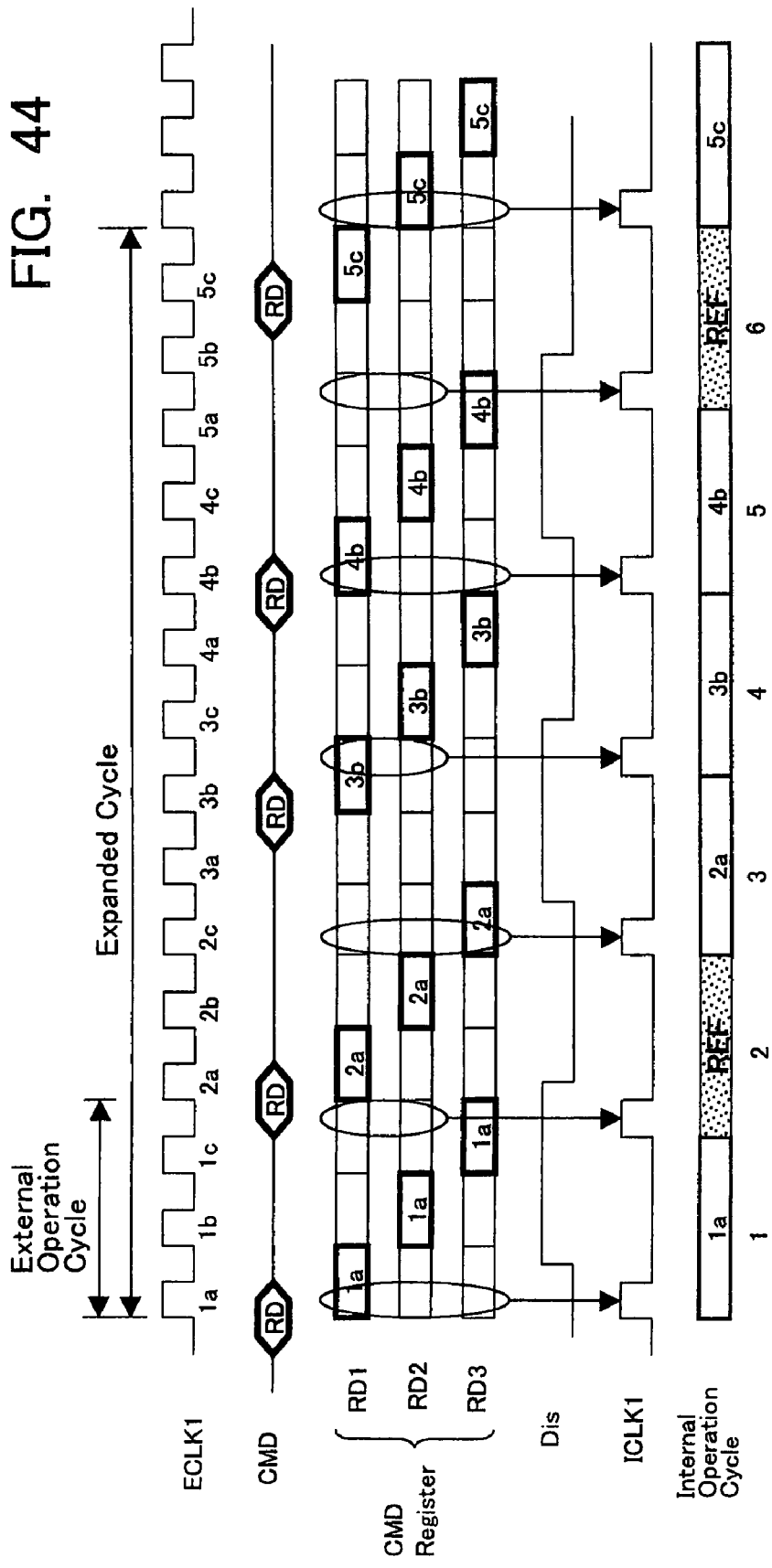
FIG. 44 is an operation timing chart for FIG. 42.

FIG. 44 shows operations for the case in which external commands are input in sync with the external clock at 1a, 2a, 3b, 4b, 5c. This figure corresponds to FIG. 41. Differences from FIG. 41 include the fact that the length of the bold frame indicating effective commands in the command register is shorter. Otherwise they are the same, and effective commands are not held in the internal operation cycles 2, 6, so that these cycles are allocated as refresh operation cycles. In this case also, if a refresh timer signal is present, a refresh command is generated.

If the fifth embodiment is expanded, a memory circuit can be configured corresponding to an external clock which has L times the external operation cycles (where L is four or greater). In this case, generation of a refresh command is permitted depending on the circumstances of external commands input in sync with L consecutive external clock cycles. In this case, if a refresh timer signal is generated to indicate a time at which the refresh operation should be performed, the internal operation actually becomes a refresh operation.

Another Clock Generation Circuit

Figure 45:
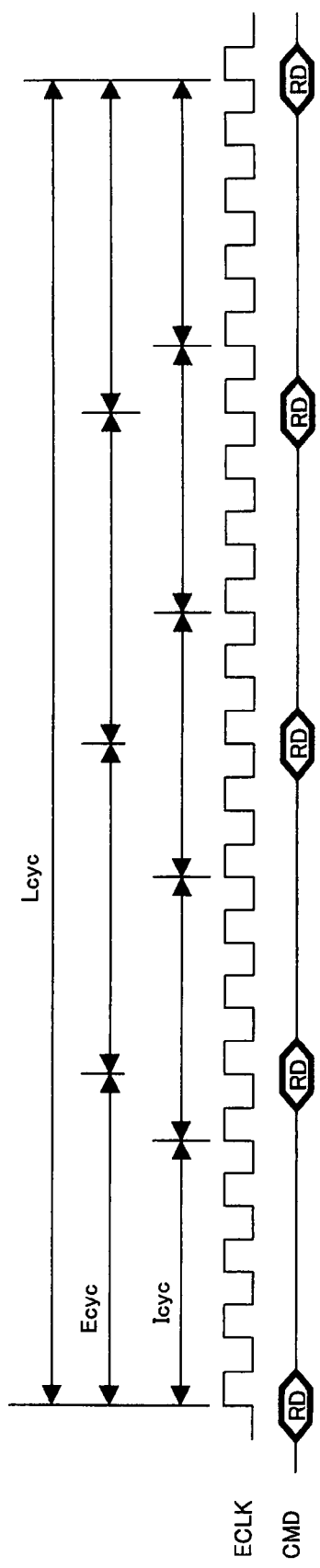
FIG. 45 is a drawing showing the relation between external operation cycles to which another clock generation circuit is applied, and internal operation cycles.
Figure 46:
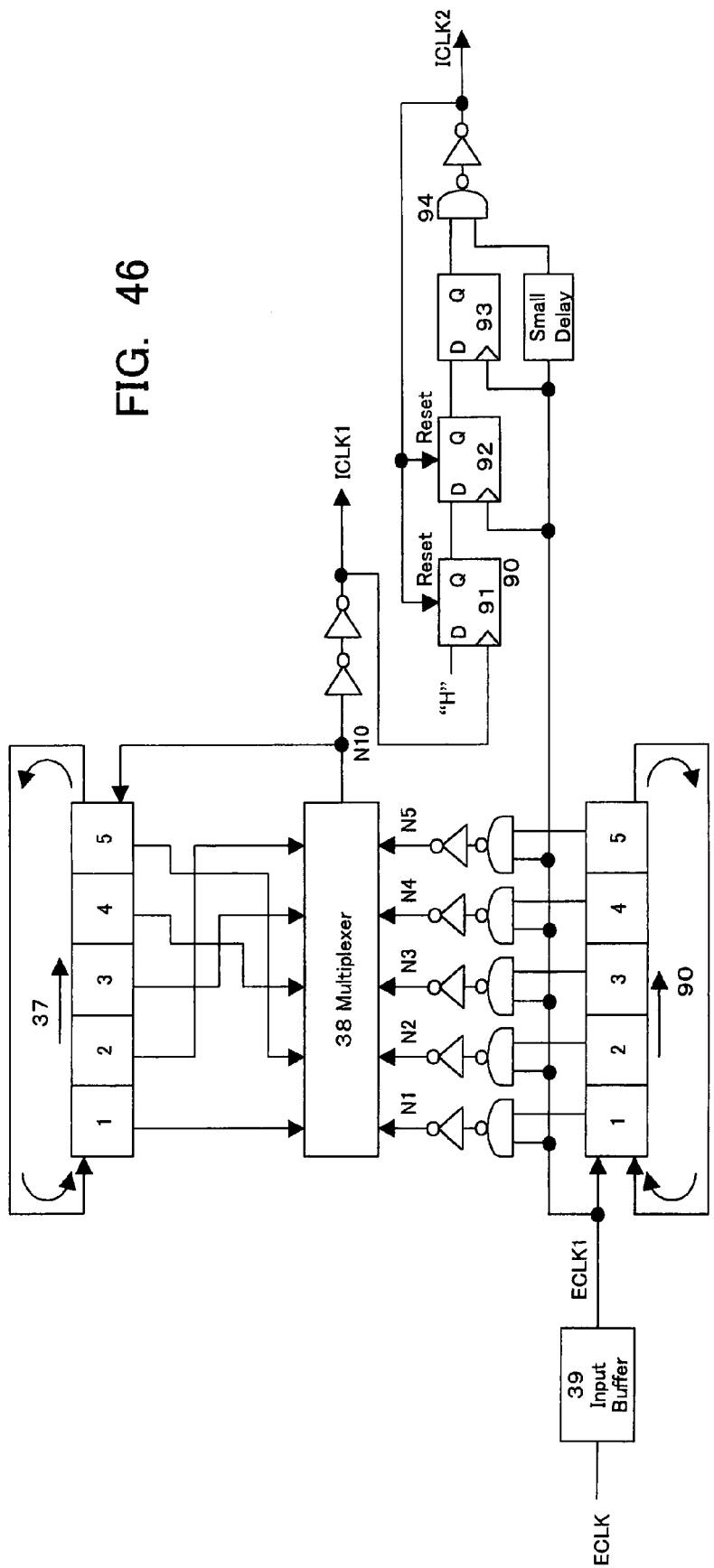
FIG. 46 is a drawing showing another clock generation circuit.
Figure 47:
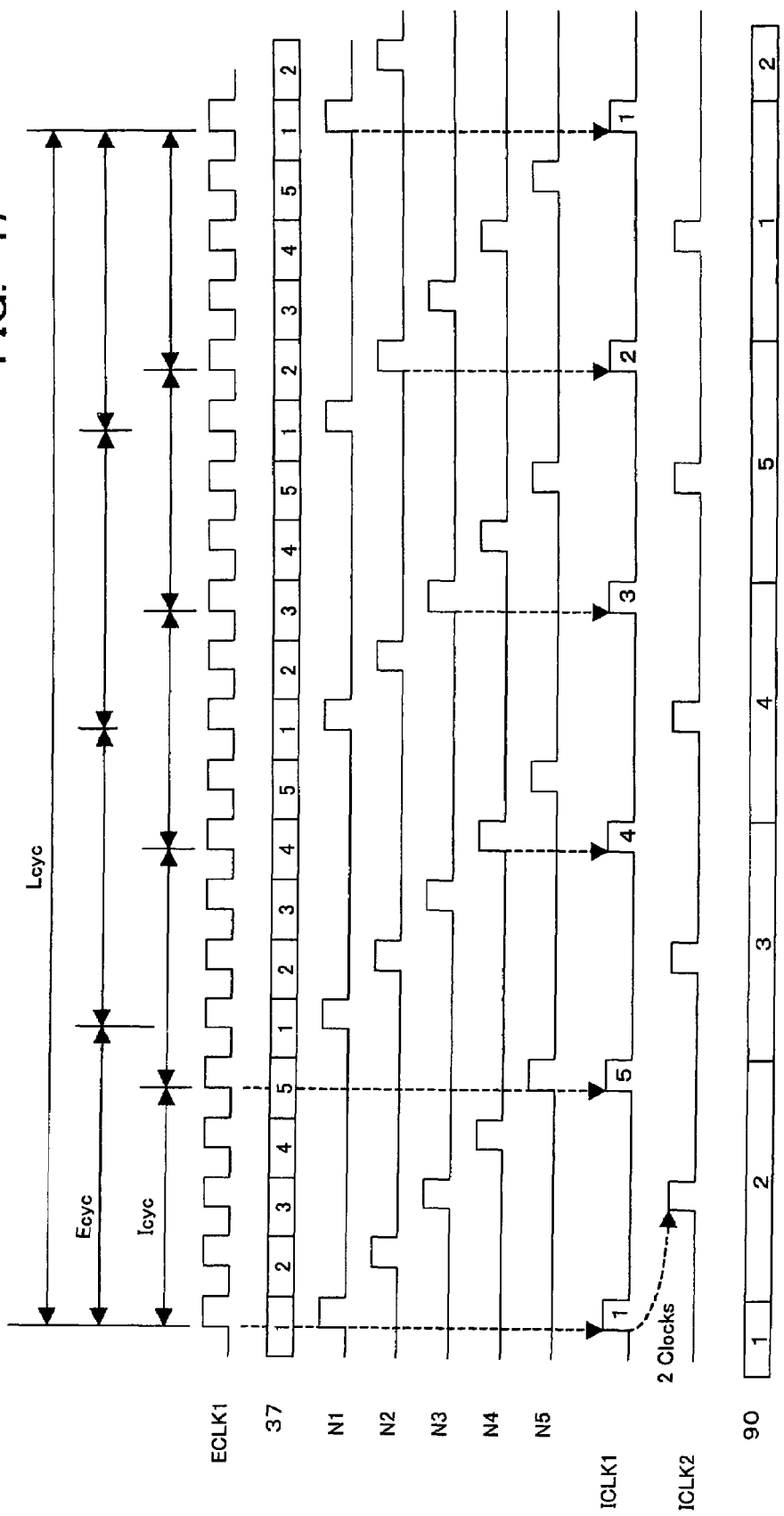
FIG. 47 is an operation timing chart for the clock generation circuit of FIG. 46.

FIGS. 45, 46 and 47 are diagrams showing another clock generation circuit. As shown in FIG. 45, this is applied to cases in which the cycles of the external clock ECLK are sufficiently short with respect to external operation cycles Ecyc and internal operation cycles Icyc, and external operation cycles Ecyc and internal operation cycles Icyc are integer multiples of the external clock ECLK cycles. In the example of FIG. 45, the external operation cycles Ecyc are five times the cycles of the external clock ECLK, and internal operation cycles Icyc are four times as long. Hence, an expanded cycle Lcyc has four external operation cycles Ecyc, and five internal operation cycles Icyc. In this case, an external command RD may be supplied in sync with any of the rising edges of the external clock ECLK, but at least four external clock cycles ECLK must be inserted between adjacent external commands.

In a case like the above, as shown in FIG. 46, the clock generation circuit does not require a DLL circuit comprising variable delay elements, a phase comparison circuit, and a delay control circuit. That is, internal clock signals can be generated based on the external clock ECLK.

Compared with the clock generation circuit shown in FIG. 13, the clock generation circuit of FIG. 46 has a shift register 37 and multiplexer 38 as well, but does not use a DLL circuit. Instead, signals N1 to N5 are generated by taking the logical AND of a clock ECLK1 generated from the external clock ECLK, and the output of the shift register 90. As shown in the operation timing chart of FIG. 47, the first shift register 90 performs shifting in sync with the external clock signal ECLK1. Hence, the clock signals N1 to N5, generated by taking the logical product of these shift signals and the external clock ECLK1, are similar to the outputs N1 to N9 of the DLL circuit of FIG. 13. By selecting these clock signals N1 to N5 using the output of the second shift register 37, an internal clock signal ICLK1 can be generated having cycles four times as long as the external clock ECLK1. Also, the second internal clock ICLK2 which controls the timing for output of read data from the memory core to the data bus DB2 is generated, through the flip flops 91, 92, 93 and NAND gate, with timing delayed by two external clock cycles.

When using the clock generation circuit of FIG. 46, an appropriate operation cycle among the five internal operation cycles should be utilized for refresh operations. Further, internal operation cycles should be used for appropriate refresh operations according to the circumstances of external commands input in sync with the external clock.

First Modification of the First Embodiment

Figure 48:
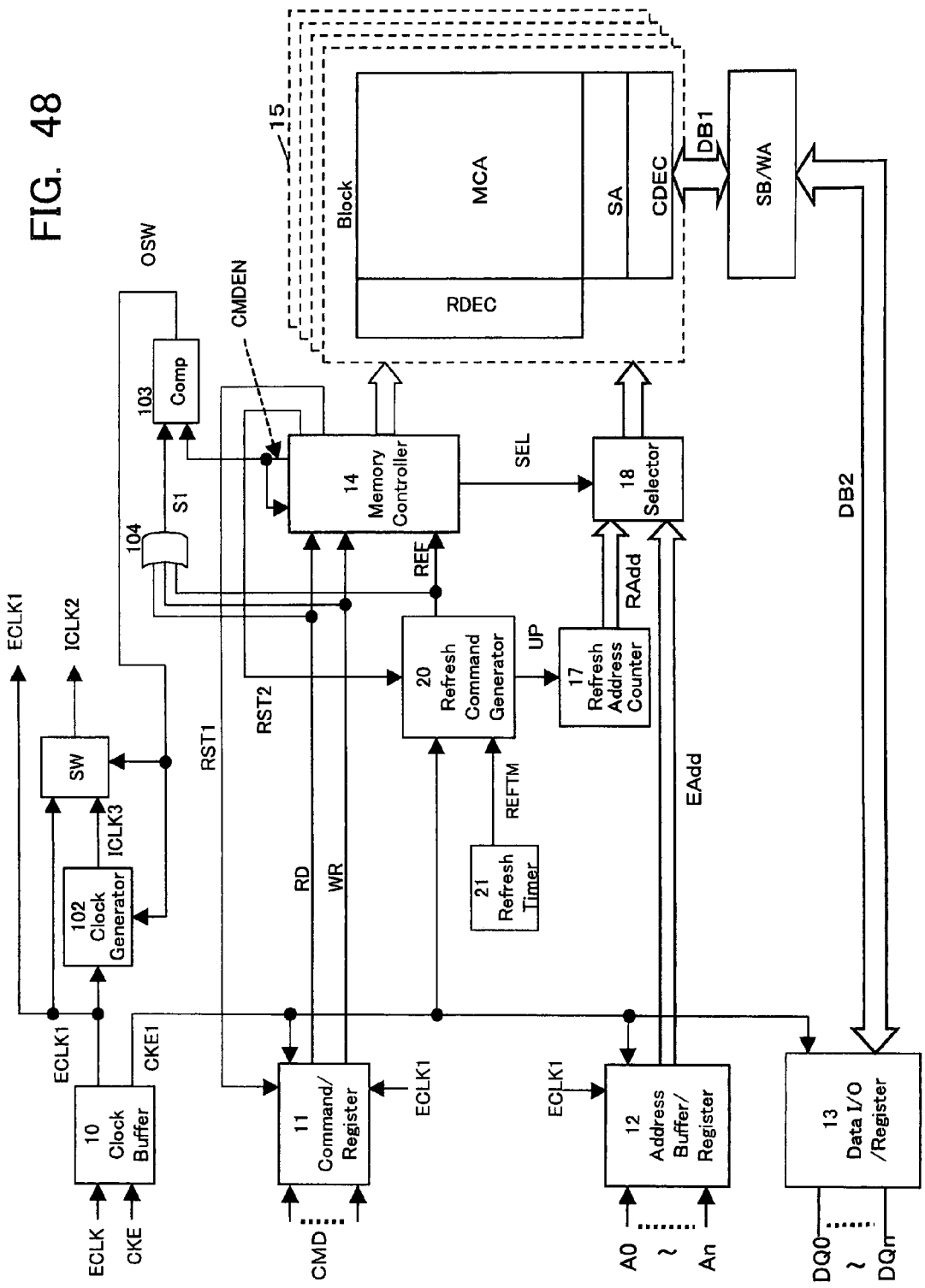
FIG. 48 is a drawing showing a memory circuit according a modification of the first embodiment.

FIG. 48 is a drawing showing a memory circuit according a modification of the first embodiment. In the first embodiment shown in FIGS. 2 to 10, the memory controller executes an operation corresponding to an internal command in sync with an external clock signal during a normal state, and after a refresh command being issued, the memory controller executes operations corresponding to the refresh command and the internal command asynchronous with the external clock. In the asynchronous operation, the memory cell array operation is executed according to the internal operation cycle shorter than the external command cycle, which is faster operation than the normal operation.

On the other hand, in the modification of FIG. 48, a clock generation circuit 102 for generating a faster clock signal ICLK3 than the external clock signal ECLK1 and a switch circuit SW are added. And these circuits 102 and SW generate, during a normal state, an internal clock signal ICLK2 synchronous with the external clock signal ECLK, and an internal operation is controlled in sync with the internal clock signal ICLK2. And after a refresh command being issued internally, these circuit 102 and SW generate an internal clock signal ICLK2 synchronous with a faster clock signal ICLK3 than the external clock signal ECLK, so that the internal operation is controlled in sync with the internal clock signal ICLK2. Then after the internal operation cycle catching up the cycle of the external clock signal, the circuits 102 and SW returns to the normal operation state so as to generate the internal clock signal ICLK2 in sync with the external clock signal ECLK.

In order to switch the internal clock signal ICLK2 for the internal operation timing, the memory circuit of FIG. 48 includes OR gate 104 for generating a logical sum of the read command RD, write command WR and refresh command REF and a comparator 103 for comparing a timing of H level of the output Si of the gate 104 and a timing of H level of command reception signal CMDEN. While the timing of the command reception signal CMDEN is faster, it is determined as a normal state and the operation switch signal OSW becomes L level so that the clock signal ECLK1 in sync with the external clock signal ECLK is output as the internal clock signal ICLK2. Further, while the timing of the generation of any command (output S1 of OR gate 104) is faster, it is determined as a faster operation mode and the operation switch signal OSW becomes H level so that the faster clock signal ICLK3 generated by the clock generation circuit 102 is output as the internal clock signal ICLK2.

Figure 49:
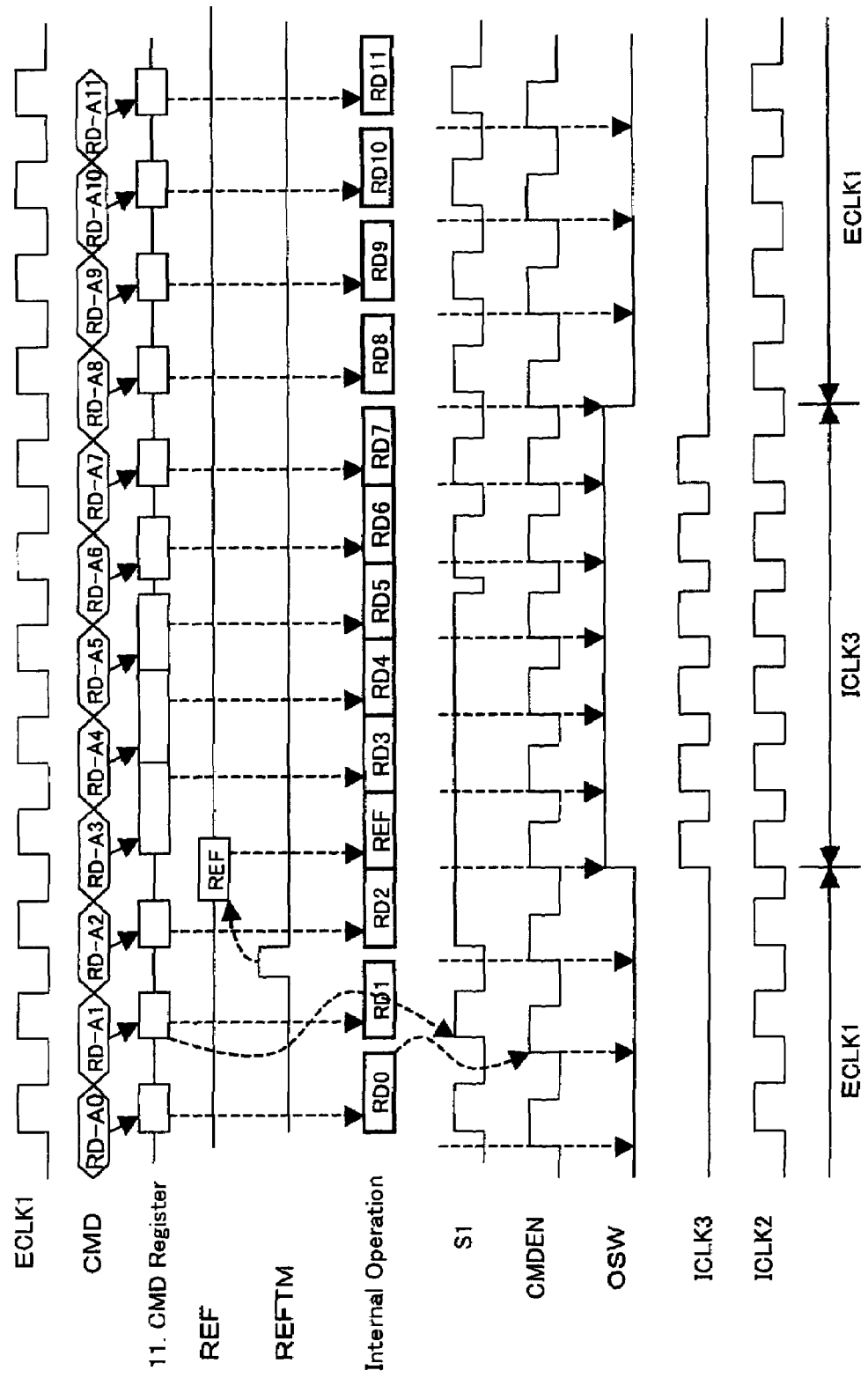
FIG. 49 is an operation timing chart of the modification of FIG. 48.

FIG. 49 is an operation timing chart of the modification of FIG. 48. In this example, a read command RD is supplied in sync with an external clock signal ECLK1. In response to this, the command register 11 holds and output the read command. And in response to the refresh command REF generated by the refresh timer 21 in a prescribed cycles, the refresh command generation circuit 20 generates the refresh command REF. On the other hand, the controller 14 generates a command reception signal CMDEN every time when an internal operation of the command is finished, so as to receive a next command.

The comparator 103 compares a rising edge of the command reception signal DMCEN and a rising edge of the read command RD, write command WR or refresh command REF (or starting timing of H level of these commands), makes the operation switching signal OSW L level as a normal mode when the command reception signal CMDEN is faster, and makes the operation switching signal OSW H level as a faster operation mode when the timing of the commands is faster. That is, the switching circuit SW selects the external clock ECLK1 or the faster clock ICLK3 depending on the switching signal OSW and output the internal clock signal ICLK2. The memory control circuit 14 controls the memory core 15 in sync with the internal clock signal ICLK2. However, the timing of the read data and the write data is controlled in sync with the external clock ECLK1.

In the example of FIG. 49, internal operations of read command RD A0 to RD A2 are normal operation state and the internal clock signal ICLK2 in sync with the external clock signal ECLK1 is generated. However, after the refresh command REF is issued, the internal operations become a faster operation state, the internal clock signal ICLK2 in sync with the faster clock signal ICLK3 is generated. In the mean time, the internal operation cycle catches up the external clock cycle at the read command RD A7 and the internal operation returns to the normal state after the read command RD A8.

Second Modification of the First Embodiment

Figure 50:
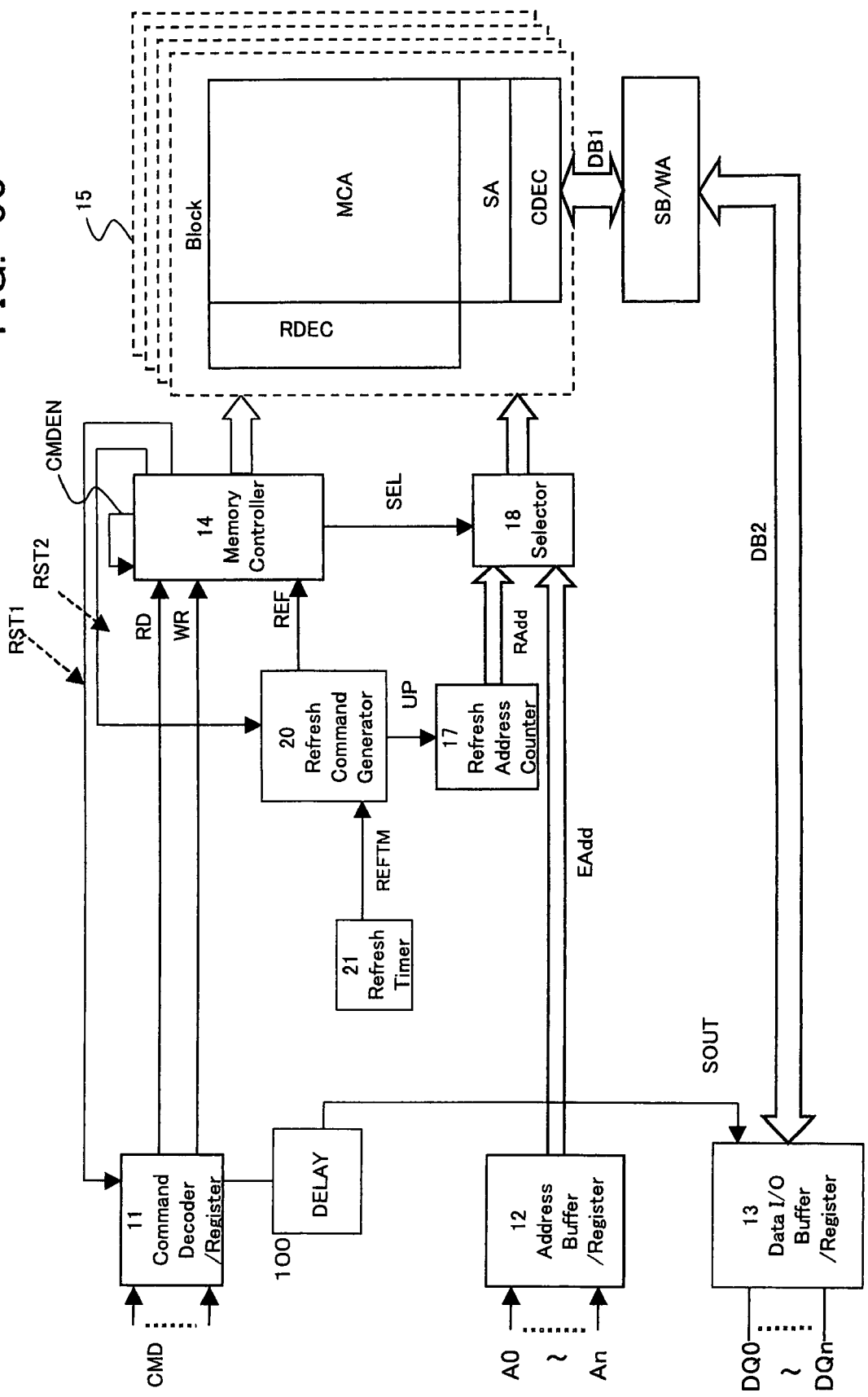
FIG. 50 is a drawing showing a memory circuit according to another modification of the first embodiment.

FIG. 50 is a drawing showing a memory circuit according to another modification of the first embodiment. This modified memory circuit is a random access memory for operating asynchronously without being supplied with an external clock signal. The operation of the first embodiment is applied to the asynchronous type DRAM.

Asynchronous type DRAM has a specification of the minimum external command interval upon which the external commands are permitted to be supplied. Therefore, a memory controller can not supply the external commands to the memory device upon shorter time interval than the minimum external command interval defined in the specification. And the memory circuit executes an internal memory operation upon receiving the external command and output read data. The specification also defines an access time between a read command input and a read data output. Therefore, the memory controller fetches the read data at a timing slightly delayed from 5 the access time after supplying the external command. Upon fetching the read data, the memory controller replies to the memory circuit a notice signal informing the read data fetch completion.

According to the first embodiment, the memory device operates in response to the external command in a normal state, and when issuing the internal refresh command, operates according to an internal operation cycle asynchronous with the external clock and shorter than the cycle of external clock. Therefore, the memory device 15 operates in a slow operation mode in the normal state, and operates in a fast operation mode when the internal refresh command is issued. This operation can be applicable to the asynchronous DRAM easily.

Comparing to the memory circuit of FIG. 2, the memory circuit of the modification of FIG. 50 does not include a clock buffer circuit, but includes a delay circuit 100 for generating an output timing signal SOUT. The data I/O buffer register 13 output read data in response to the output timing signal SOUT. This delay time of the delay circuit corresponds to the above mentioned access time. The structure except for this is the same as FIG. 2.

The memory control circuit 14, the same as FIG. 4, generates control signals corresponding to the supplied command and generates a command reception signal CMDEN upon finishing the memory array operation so as to receive the next command and generate the control signals corresponding to the next command. According to the modification, the memory array operation period corresponding to the internal operation cycle is designed to be shorter than the minimum external command interval. As a result, in a normal state, the internal operation cycle can be repeated in sync with the input timing of the external command. On the other hand, when the refresh command is issued internally, the internal operation cycles can be repeated in serial asynchronous with the input timing of the external command. That is, in the normal operation state, the memory circuit becomes a slower operation mode in sync with the external command timing, whereas, when the internal refresh command is issued, the memory circuit becomes a faster operation mode according to the internal operation cycle. When the internal operation cycle catches up the external command timing, the memory circuit returns to the slower operation mode.

Figure 51A:
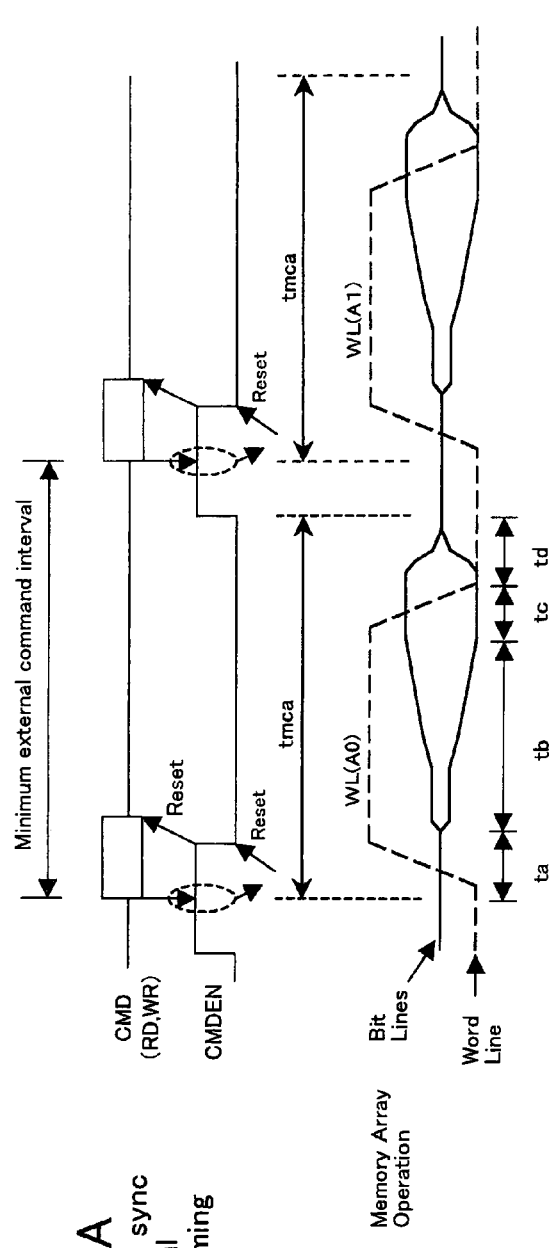
FIG. 51 is a timing chart showing an operation of the modification.

FIG. 51 is a timing chart showing an operation of the modification. FIG. 51A shows a normal operation state which is the slower operation mode in sync with the external command timing. As shown in the drawing, the memory cell array operation period tmca is designed to be shorter than the minimum external command interval tecmd. Therefore, when the memory cell array operation, which is the internal operation, starts in sync with the external command, the operation finishes before the next external command being supplied. Even though the command reception signal CMDEN raises to H level in response to the end of the memory cell array operation, the next external command (RD, WR) is not supplied yet at this time. Upon the next external command being supplied after prescribed time being elapsed, the next memory array operation starts in response to the supplied command. Even though asynchronous DRAM, since the internal operation cycle tmca is shorter than the minimum external command interval tecmd, the internal operation cycle can be repeated in sync with the external command timing in the normal operation state.

Figure 51B:
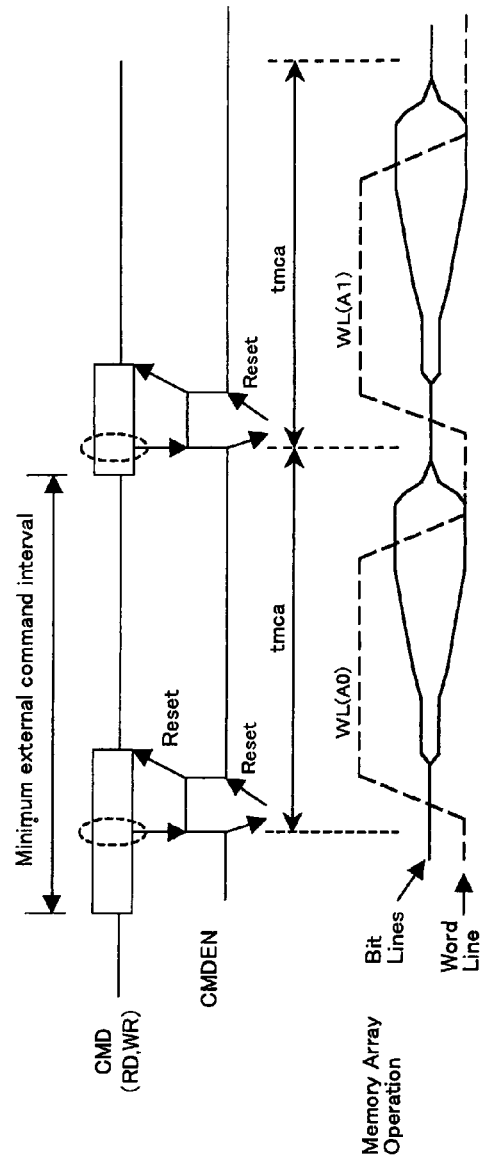

FIG. 51B shows the faster operation mode asynchronous with the external command timing when the internal refresh command REF is issued. Since the internal refresh operation is interrupted, the memory array operation can not finish until the next external command timing. Therefore, the next memory array operations are executed in response to the rising of the command reception signal CMDEN continuously. That is, the internal operation cycles are repeatedly executed without waiting the next external command timing.

Figure 52:
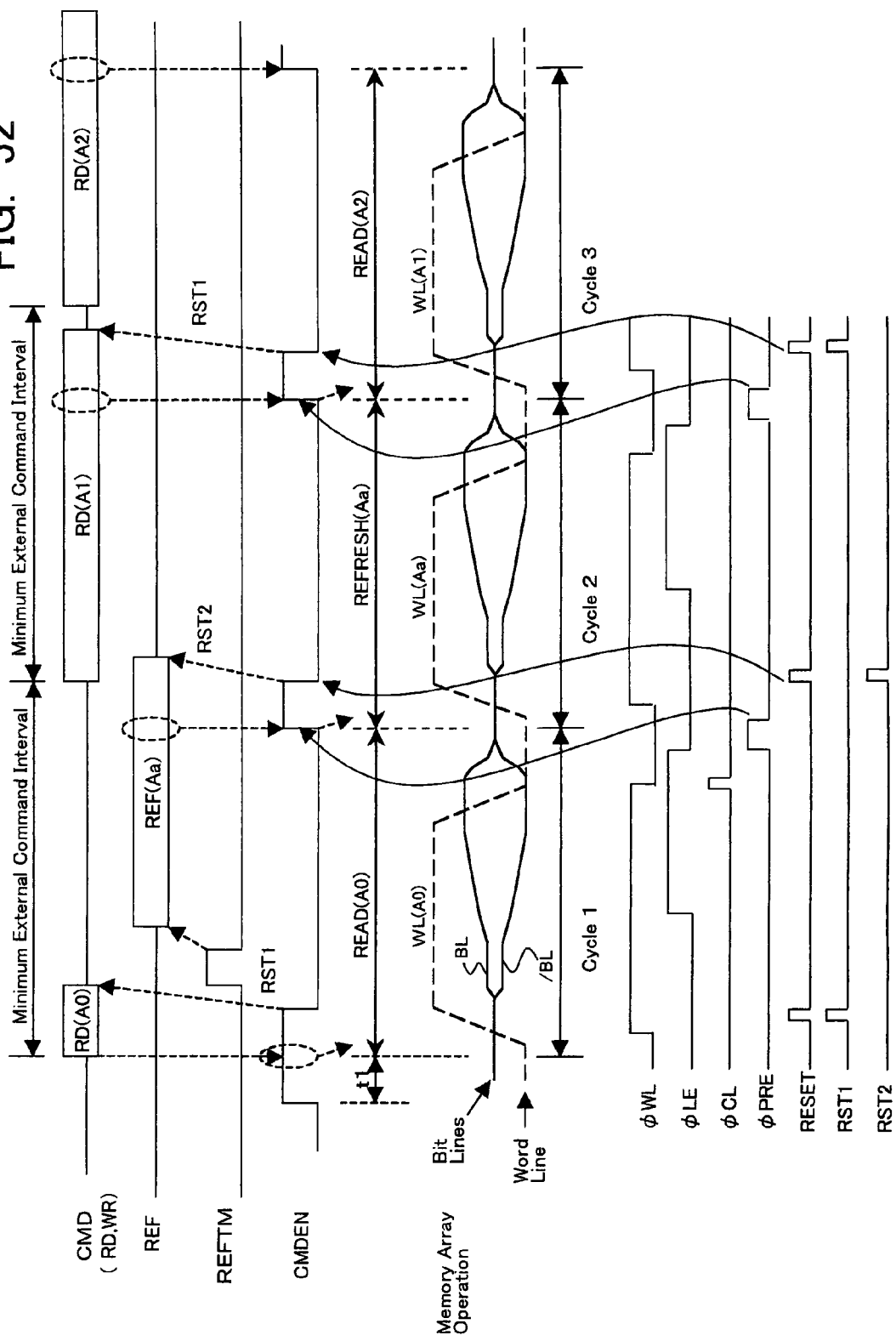
FIG. 52 is an operation timing chart in case where the normal operation state is transferred into the faster operation mode upon generation of the internal refresh command.

FIG. 52 is an operation timing chart in case where the normal operation state is transferred into the faster operation mode upon generation of the internal refresh command. FIG. 52 is the same as the one eliminating the clock signal CLK1 from the operation timing chart of FIG. 5. When the first read command RD(A0) is generated, the previous memory cell array operation is finished and the command reception signal CMDEN becomes H level already. Therefore, the internal memory cell array operation starts in response to the timing of the read command RD(A0).

This is the cycle No. 1. The memory cell array operation comprises, as described before, word line driving (control signal OWL), sense amplifier activation (OLE), column gate selection (OCL), and pre charge (OPRE). When the pre charge control signal is generated, the command reception signal CMDEN becomes H level.

According to FIG. 52, the refresh timer signal REFTM becomes H level during the first read operation so as to inform the timing of the internal refresh. In response to this, the internal refresh command REF(Aa) is generated. And when the memory cell array operation for the first read command is finished and the command reception signal CMDEN becomes H level, the refresh command REF(Aa) is already generated, therefore, the refresh operation for the refresh command can start immediately. This is the cycle No. 2. The refresh operation is a read operation without having column gate selection.

Further, since during the internal refresh operation, the next read command RD(A1) is supplied, the internal read operation starts continuously upon finishing the refresh operation. This is the cycle No. 3.

Figure 53:
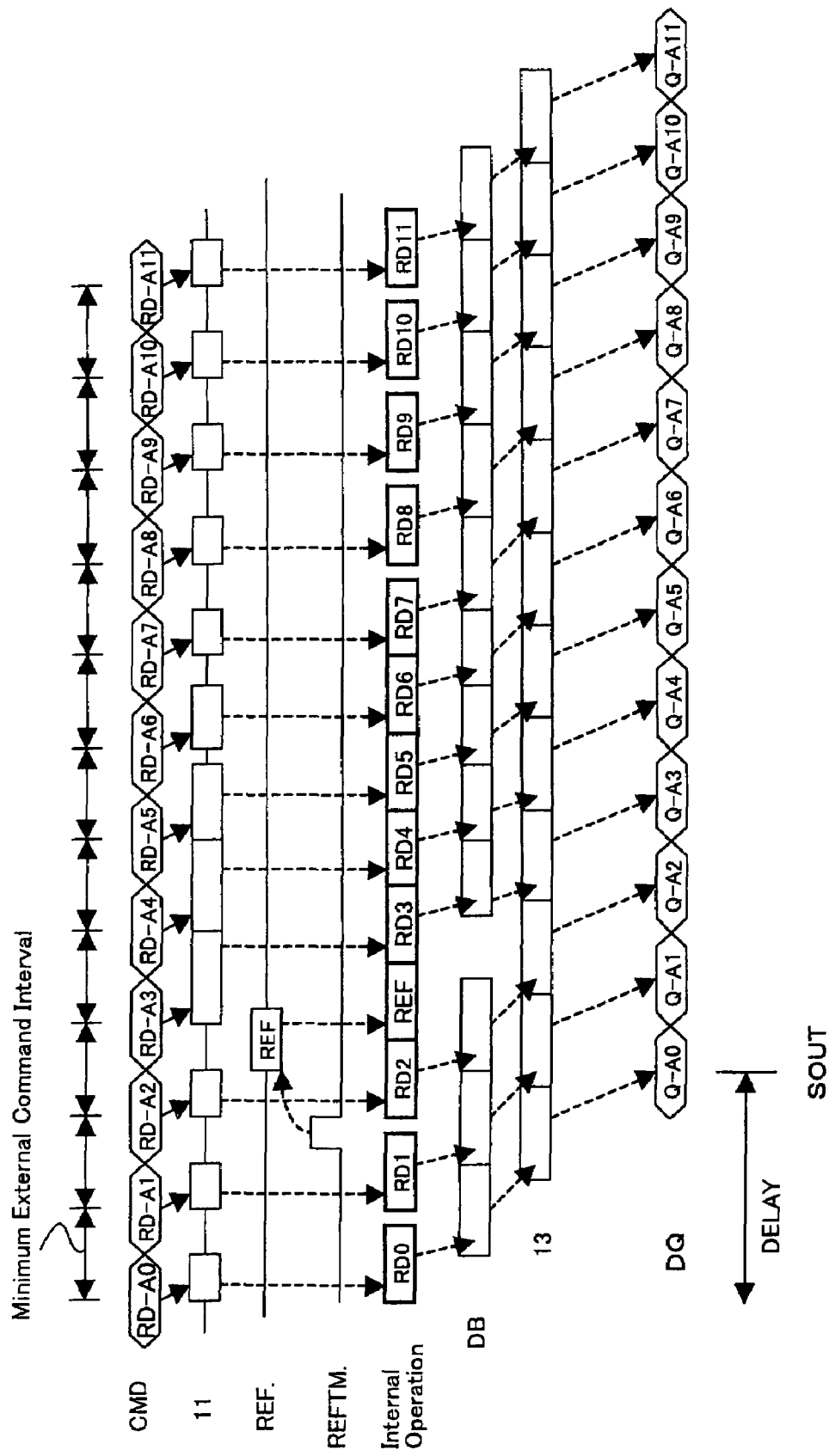
FIG. 53 is a timing chart of the slow operation mode and the fast operation mode according to the present modification.

FIG. 53 is a timing chart of the slow operation mode and the fast operation mode according to the present modification. This is the same as one eliminating the clock signal CLK1 from FIG. 6. That is, this is clock asynchronous DRAM, the external command CND is supplied with an interval equal to or longer than the minimum external command interval, and read data is output at DQ terminal after a prescribed delay time DELAY from the external command supply. In FIG. 53, the operation during the first three read commands RD A0 to RD A2 is the slower operation mode in which the internal operation is executed in sync with the external command. And the operation during the read command RD A4 to A7 after generation of the refresh command REF is the faster operation mode in which the internal operation cycles are repeated continuously. When the internal operation cycle catches up the external command timing, the operation returns to the slower operation mode in sync with the external command after the read command RD A8.

As described above, according to the first embodiment, either the case where the external commands are supplied in sync with the external clock, or the case where the external commands are supplied asynchronously, since the internal operation cycle is designed to be shorter than the external operation cycle or the minimum external command cycle, the internally generated refresh command can be interrupted among the normal commands (read or write).

Thus, by means of this invention, in a clock-synchronous type integrated circuit, prescribed internal operation cycles not corresponding to instructions from outside can be generated and executed autonomously, so that the control of an external controller can be made simple.

Also by means of this invention, in a memory circuit requiring refreshing, even in the normal operating state, refresh operation cycles can automatically be generated internally without applying refresh commands from an 15 external controller.

The scope of protection of this invention is not limited to the above described aspects, but extends to the inventions described in the Claims and to equivalent entities.

What is claimed is:

1. An integrated circuit device operating in synchronous with a clock signal, comprising:
   a first circuit which generates a first internal command internally according to a command externally received;
   a second circuit which generates a second internal command internally, in a prescribed cycle larger than the cycles of an external command cycle; and
   an internal circuit which includes a first internal operation cycle according to which an internal operation is executed in synchronous with an external operation cycle, and a second internal operation cycle according to which the internal operation is executed in a shorter cycle than the first internal operation cycle;
   wherein the internal circuit executes an operation corresponding to the first internal command according to the first internal operation cycle in a normal state, and executes an operation corresponding to the first and second internal commands according to the second operation cycle during a prescribed period after generation of the second internal command.

* * * * *